US007663798B2

(12) United States Patent
Tonar et al.

(10) Patent No.: US 7,663,798 B2
(45) Date of Patent: Feb. 16, 2010

(54) ELECTROCHROMIC REARVIEW MIRROR INCORPORATING A THIRD SURFACE REFLECTOR

(75) Inventors: William L. Tonar, Holland, MI (US); Jeffrey A. Forgette, Hudsonville, MI (US); John S. Anderson, Holland, MI (US); Jon H. Bechtel, Holland, MI (US); John W. Carter, Holland, MI (US); Joseph S. Stam, Holland, MI (US); David J. Cammenga, Zeeland, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

(21) Appl. No.: 12/189,853

(22) Filed: Aug. 12, 2008

(65) Prior Publication Data

US 2009/0040588 A1 Feb. 12, 2009

Related U.S. Application Data

(63) Continuation of application No. 11/789,221, filed on Apr. 24, 2007, now Pat. No. 7,417,781, which is a continuation of application No. 11/348,363, filed on Feb. 6, 2006, now Pat. No. 7,209,277, which is a continuation of application No. 10/893,594, filed on Jul. 16, 2004, now Pat. No. 7,009,751, which is a continuation of application No. 10/352,778, filed on Jan. 28, 2003, now Pat. No. 6,870,656, which is a continuation of application No. 09/994,218, filed on Nov. 26, 2001, now Pat. No. 6,512,624, which is a continuation of application No. 09/311,955, filed on May 14, 1999, now Pat. No. 6,356,376.

(51) Int. Cl.
*G02F 1/15* (2006.01)

(52) U.S. Cl. ....................................... 359/265; 359/267

(58) Field of Classification Search ................. 359/267, 359/265, 238, 240, 241, 269, 601, 604
See application file for complete search history.

(56) References Cited

U.S. PATENT DOCUMENTS 3,266,016 A 8/1966 Maruyama et al.

(Continued)

FOREIGN PATENT DOCUMENTS

CA 2028461 11/1994

OTHER PUBLICATIONS

John Roberts, Dichroic Mirrors with Semi-Active Covert Displays—New Tools for Vehicle Safety, Muth Advanced Technologies, international Body Engineering Conference (Warren, MI), p. 7, Sep. 21, 1993.

(Continued)

*Primary Examiner*—Timothy J Thompson
(74) *Attorney, Agent, or Firm*—Yakov S. Sidorin; Quarles & Brady LLP

(57) ABSTRACT

The inventive electrochromic mirror may be used in a vehicle rearview mirror assembly having a light source positioned behind the electrochromic mirror for selectively projecting light through the mirror and/or a light sensor positioned behind the electrochromic mirror for selectively receiving light through the mirror. The electrochromic mirror includes front and rear spaced elements each having front and rear surfaces and being sealably bonded together in a spaced-apart relationship to define a chamber, a layer of transparent conductive material disposed on the rear surface of the front element, an electrochromic material is contained within the chamber, and a second electrode overlies the front surface of the rear element in contact with the electrochromic material. The second electrode includes a layer of reflective material and a partially transmissive coating of and is disposed over substantially all of the front surface of the rear element. The second electrode further includes a region in front of the light source and/or light sensor that is at least partially transmissive.

15 Claims, 40 Drawing Sheets

U.S. PATENT DOCUMENTS

| | | | | |
|---|---|---|---|---|
| 3,280,701 | A | 10/1966 | Donnelly et al. | |
| 4,588,267 | A | 5/1986 | Pastore | |
| 4,630,904 | A | 12/1986 | Pastore | |
| 4,741,603 | A | 5/1988 | Miyagi et al. | |
| 4,768,865 | A * | 9/1988 | Greenberg et al. | 359/266 |
| 4,832,467 | A * | 5/1989 | Miyagi et al. | 359/273 |
| 4,882,565 | A | 11/1989 | Gallmeyer | |
| 4,886,960 | A | 12/1989 | Molyneux et al. | |
| 4,902,108 | A | 2/1990 | Byker | |
| 5,014,167 | A | 5/1991 | Roberts | |
| 5,066,112 | A | 11/1991 | Lynam et al. | |
| 5,069,535 | A | 12/1991 | Baucke et al. | |
| 5,076,673 | A | 12/1991 | Lynam et al. | |
| 5,115,346 | A | 5/1992 | Lynam | |
| 5,136,419 | A | 8/1992 | Shabrang | |
| 5,189,537 | A | 2/1993 | O'Farrell | |
| 5,207,492 | A | 5/1993 | Roberts | |
| 5,253,109 | A | 10/1993 | O'Farrell et al. | |
| 5,285,060 | A | 2/1994 | Larson et al. | |
| 5,313,335 | A | 5/1994 | Gray et al. | |
| 5,336,448 | A | 8/1994 | Byker | |
| 5,355,284 | A | 10/1994 | Roberts | |
| 5,361,190 | A | 11/1994 | Roberts et al. | |
| 5,416,313 | A | 5/1995 | Larson et al. | |
| D363,920 | S | 11/1995 | Roberts et al. | |
| 5,481,409 | A | 1/1996 | Roberts | |
| 5,504,478 | A | 4/1996 | Knapp | |
| 5,528,422 | A | 6/1996 | Roberts | |
| 5,587,699 | A | 12/1996 | Faloon et al. | |
| 5,619,374 | A | 4/1997 | Roberts | |
| 5,619,375 | A | 4/1997 | Roberts | |
| 5,660,457 | A | 8/1997 | Lyons | |
| 5,668,663 | A | 9/1997 | Varaprasad et al. | |
| 5,669,704 | A | 9/1997 | Pastrick | |
| 5,669,705 | A | 9/1997 | Pastrick et al. | |
| 5,682,267 | A | 10/1997 | Tonar et al. | |
| 5,724,187 | A * | 3/1998 | Varaprasad et al. | 359/608 |
| D394,833 | S | 6/1998 | Muth | |
| 5,760,962 | A | 6/1998 | Schofield et al. | |
| 5,780,160 | A * | 7/1998 | Allemand et al. | 428/426 |
| 5,788,357 | A | 8/1998 | Muth et al. | |
| 5,818,625 | A | 10/1998 | Forgette et al. | |
| 5,825,527 | A | 10/1998 | Forgette et al. | |
| 5,863,116 | A | 1/1999 | Pastrick et al. | |
| 5,889,608 | A | 3/1999 | Buffat et al. | |
| D409,540 | S | 5/1999 | Muth | |
| 5,940,120 | A | 8/1999 | Frankhouse et al. | |
| 5,959,367 | A | 9/1999 | O'Farrell et al. | |
| 6,005,724 | A | 12/1999 | Todd | |
| 6,007,222 | A | 12/1999 | Thau | |
| 6,045,243 | A | 4/2000 | Muth et al. | |
| D425,466 | S | 5/2000 | Todd et al. | |
| D426,506 | S | 6/2000 | Todd et al. | |
| D426,507 | S | 6/2000 | Todd et al. | |
| D427,128 | S | 6/2000 | Mathieu | |
| 6,076,948 | A | 6/2000 | Bukosky et al. | |
| D428,372 | S | 7/2000 | Todd et al. | |
| D428,373 | S | 7/2000 | Todd et al. | |
| 6,086,229 | A | 7/2000 | Pastrick | |
| 6,093,976 | A | 7/2000 | Kramer et al. | |
| D428,842 | S | 8/2000 | Todd et al. | |
| D429,202 | S | 8/2000 | Todd et al. | |
| D430,088 | S | 8/2000 | Todd et al. | |
| 6,097,023 | A | 8/2000 | Schofield et al. | |
| 6,106,121 | A | 8/2000 | Buckley et al. | |
| 6,111,684 | A | 8/2000 | Forgette et al. | |
| 6,142,656 | A | 11/2000 | Kurth | |
| 6,163,083 | A | 12/2000 | Kramer et al. | |
| 6,166,848 | A | 12/2000 | Cammenga et al. | |
| 6,172,613 | B1 | 1/2001 | DeLine et al. | |
| 6,175,164 | B1 | 1/2001 | O'Farrell et al. | |
| 6,176,602 | B1 | 1/2001 | Pastrick et al. | |
| 6,356,376 | B1 | 3/2002 | Tonar et al. | |
| 6,512,624 | B2 | 1/2003 | Tonar et al. | |
| 6,737,630 | B2 | 5/2004 | Turnbull | |
| 6,870,656 | B2 | 3/2005 | Tonar et al. | |
| 7,009,751 | B2 | 3/2006 | Tonar et al. | |
| 7,088,490 | B2 | 8/2006 | Nakaho et al. | |
| 7,209,277 | B2 | 4/2007 | Tonar et al. | |
| 7,417,781 | B2 | 4/2008 | Tonar et al. | |

FOREIGN PATENT DOCUMENTS

| | | |
|---|---|---|
| DE | 19631409 | 2/1998 |
| EP | 0450162 | 10/1991 |
| EP | 0728618 | 8/1996 |
| EP | 0769419 | 4/1997 |
| GB | 2326489 | 12/1998 |
| JP | 56/143416 | 11/1981 |
| JP | 07266928 | 10/1995 |
| WO | 95/30495 | 11/1995 |
| WO | 98/44385 | 10/1998 |

OTHER PUBLICATIONS

U.S. Appl. No. 10/863,638, filed Jun. 8, 2004, Rearview Mirror Element Having a Circuit Mounted to the Rear Surface of the Element, Bauer et al.

* cited by examiner

ELECTROCHROMIC REARVIEW MIRROR INCORPORATING A THIRD SURFACE REFLECTOR

CROSS-REFERENCE TO RELATED APPLICATIONS

This application is a continuation of U.S. patent application Ser. No. 11/789,221, filed on Apr. 24, 2007, which is a continuation of U.S. patent application Ser. No. 11/348,363, filed on Feb. 6, 2006, now U.S. Pat. No. 7,209,277, which is a continuation of U.S. patent application Ser. No. 10/893,594, filed on Jul. 16, 2004, now U.S. Pat. No. 7,009,751, which is a continuation of U.S. patent application Ser. No. 10/352,778, filed on Jan. 28, 2003, now U.S. Pat. No. 6,870,656, which is a continuation of U.S. patent application Ser. No. 09/994,218, filed on Nov. 26, 2001, now U.S. Pat. No. 6,512,624, which is a continuation of U.S. patent application Ser. No. 09/311,955, filed on May 14, 1999, now U.S. Pat. No. 6,356,376. The entire disclosure of each of the above applications is incorporated herein by reference.

BACKGROUND OF THE INVENTION

This invention relates to electrochromic rearview mirrors for motor vehicles and, more particularly, to improved electrochromic rearview mirrors incorporating a third surface reflector/electrode in contact with at least one solution-phase electrochromic material.

Heretofore, various rearview mirrors for motor vehicles have been proposed which change from the full reflectance mode (day) to the partial reflectance mode(s) (night) for glare-protection purposes from light emanating from the headlights of vehicles approaching from the rear. Among such devices are those wherein the transmittance is varied by thermochromic, photochromic, or electro-optic means (e.g., liquid crystal, dipolar suspension, electrophoretic, electrochromic, etc.) and where the variable transmittance characteristic affects electromagnetic radiation that is at least partly in the visible spectrum (wavelengths from about 3800 Å to about 7800 Å). Devices of reversibly variable transmittance to electromagnetic radiation have been proposed as the variable transmittance element in variable transmittance light-filters, variable reflectance mirrors, and display devices, which employ such light-filters or mirrors in conveying information. These variable transmittance light filters have included windows.

Devices of reversibly variable transmittance to electromagnetic radiation, wherein the transmittance is altered by electrochromic means, are described, for example, by Chang, "Electrochromic and Electrochemichromic Materials and Phenomena," in *Non-emissive Electrooptic Displays*, A. Kmetz and K. von Willisen, eds. Plenum Press, New York, N.Y. 1976, pp. 155-196 (1976) and in various parts of *Electrochromism*, P. M. S. Monk, R. J. Mortimer, D. R. Rosseinsky, VCH Publishers, Inc., New York, N.Y. (1995). Numerous electrochromic devices are known in the art. See, e.g., Manos, U.S. Pat. No. 3,451,741; Bredfeldt et al., U.S. Pat. No. 4,090,358; Clecaket al., U.S. Pat. No. 4,139,276; Kissa et al., U.S. Pat. No. 3,453,038; Rogers, U.S. Pat. Nos. 3,652,149, 3,774,988 and 3,873,185; and Jones et al., U.S. Pat. Nos. 3,282,157, 3,282,158, 3,282,160 and 3,283,656.

In addition to these devices, there are commercially available electrochromic devices and associated circuitry, such as those disclosed in U.S. Pat. No. 4,902,108, entitled "SINGLE-COMPARTMENT, SELF-ERASING, SOLUTION-PHASE ELECTROCHROMIC DEVICES SOLUTIONS FOR USE THEREIN, AND USES THEREOF," issued Feb. 20, 1990, to H. J. Byker; Canadian Patent No. 1,300,945, entitled "AUTOMATIC REARVIEW MIRROR SYSTEM FOR AUTOMOTIVE VEHICLES," issued May 19, 1992, to J. H. Bechtel et al.; U.S. Pat. No. 5,128,799, entitled "VARIABLE REFLECTANCE MOTOR VEHICLE MIRROR," issued Jul. 7, 1992, to H. J. Byker; U.S. Pat. No. 5,202,787, entitled "ELECTRO-OPTIC DEVICE," issued Apr. 13, 1993, to H. J. Byker et al.; U.S. Pat. No. 5,204,778, entitled "CONTROL SYSTEM FOR AUTOMATIC REARVIEW MIRRORS," issued Apr. 20, 1993, to J. H. Bechtel; U.S. Pat. No. 5,278,693, entitled "TINTED SOLUTION-PHASE ELECTROCHROMIC MIRRORS," issued Jan. 11, 1994, to D. A. Theiste et al.; U.S. Pat. No. 5,280,380, entitled "UV-STABILIZED COMPOSITIONS AND METHODS," issued Jan. 18, 1994, to H. J. Byker; U.S. Pat. No. 5,282,077, entitled "VARIABLE REFLECTANCE MIRROR," issued Jan. 25, 1994, to H. J. Byker; U.S. Pat. No. 5,294,376, entitled "BIPYRIDINIUM SALT SOLUTIONS," issued Mar. 15, 1994, to H. J. Byker; U.S. Pat. No. 5,336,448, entitled "ELECTROCHROMIC DEVICES WITH BIPYRIDINIUM SALT SOLUTIONS," issued Aug. 9, 1994, to H. J. Byker; U.S. Pat. No. 5,434,407, entitled "AUTOMATIC REARVIEW MIRROR INCORPORATING LIGHT PIPE," issued Jan. 18, 1995, to F. T. Bauer et al.; U.S. Pat. No. 5,448,397, entitled "OUTSIDE AUTOMATIC REARVIEW MIRROR FOR AUTOMOTIVE VEHICLES," issued Sep. 5, 1995, to W. L. Tonar; and U.S. Pat. No. 5,451,822, entitled "ELECTRONIC CONTROL SYSTEM," issued Sep. 19, 1995, to J. H. Bechtel et al. Each of these patents is commonly assigned with the present invention and the disclosures of each, including the references contained therein, are hereby incorporated herein in their entirety by reference. Such electrochromic devices may be utilized in a fully integrated inside/outside rearview mirror system or as separate inside or outside rearview mirror systems.

FIG. 1 shows a typical electrochromic mirror device 10, having front and rear planar elements 12 and 16, respectively. A transparent conductive coating 14 is placed on the rear face of the front element 12, and another transparent conductive coating 18 is placed on the front face of rear element 16. A reflector (20*a*, 20*b* and 20*c*), typically comprising a silver metal layer 20*a* covered by a protective copper metal layer 20*b*, and one or more layers of protective paint 20*c*, is disposed on the rear face of the rear element 16. For clarity of description of such a structure, the front surface of the front glass element is sometimes referred to as the first surface, and the inside surface of the front glass element is sometimes referred to as the second surface. The inside surface of the rear glass element is sometimes referred to as the third surface, and the back surface of the rear glass element is sometimes referred to as the fourth surface. The front and rear elements are held in a parallel and spaced-apart relationship by seal 22, thereby creating a chamber 26. The electrochromic medium 24 is contained in space 26. The electrochromic medium 24 is in direct contact with transparent electrode layers 14 and 18, through which passes electromagnetic radiation whose intensity is reversibly modulated in the device by a variable voltage or potential applied to electrode layers 14 and 18 through clip contacts and an electronic circuit (not shown).

The electrochromic medium 24 placed in space 26 may include surface-confined, electrode position-type or solution-phase-type electrochromic materials and combinations thereof. In an all solution-phase medium, the electrochemical properties of the solvent, optional inert electrolyte, anodic materials, cathodic materials, and any other components that might be present in the solution are preferably such that no significant electrochemical or other changes occur at a potential difference which oxidizes anodic material and reduces the cathodic material other than the electrochemical oxidation of the anodic material, electrochemical reduction of the cathodic material, and the self-erasing reaction between the oxidized form of the anodic material and the reduced form of the cathodic material.

In most cases, when there is no electrical potential difference between transparent conductors 14 and 18, the electrochromic medium 24 in space 26 is essentially colorless or nearly colorless, and incoming light ($I_o$) enters through front element 12, passes through transparent coating 14, electrochromic containing chamber 26, transparent coating 18, rear element 16, and reflects off layer 20*a* and travels back through the device and out front element 12. Typically, the magnitude of the reflected image ($I_R$) with no electrical potential difference is about 45 percent to about 85 percent of the incident light intensity ($I_o$). The exact value depends on many variables outlined below, such as, for example, the residual reflection ($I'_R$) from the front face of the front element, as well as secondary reflections from the interfaces between: the front element 12 and the front transparent electrode 14, the front transparent electrode 14 and the electrochromic medium 24, the electrochromic medium 24 and the second transparent electrode 18, and the second transparent electrode 18 and the rear element 16. These reflections are well known in the art and are due to the difference in refractive indices between one material and another as the light crosses the interface between the two. If the front element and the back element are not parallel, then the residual reflectance ($I'_R$) or other secondary reflections will not superimpose with the reflected image ($I_R$) from mirror surface 20*a*, and a double image will appear (where an observer would see what appears to be double (or triple) the number of objects actually present in the reflected image).

There are minimum requirements for the magnitude of the reflected image depending in whether the electrochromic mirrors are placed on the inside or the outside of the vehicle. For example, according to current requirements from most automobile manufacturers, inside mirrors preferably have a high end reflectivity of at least 70 percent, and outside mirrors must have a high end reflectivity of at least 35 percent.

Electrode layers 14 and 18 are connected to electronic circuitry which is effective to electrically energize the electrochromic medium, such that when a potential is applied across the transparent conductors 14 and 18, electrochromic medium in space 26 darkens, such that incident light ($I_o$) is attenuated as the light passes toward the reflector 20*a* and as it passes back through after being reflected. By adjusting the potential difference between the transparent electrodes, such a device can function as a “gray-scale” device, with continuously variable transmittance over a wide range. For solution-phase electrochromic systems, when the potential between the electrodes is removed or returned to zero, the device spontaneously returns to the same, zero-potential, equilibrium color and transmittance as the device had before the potential was applied. Other electrochromic materials are available for making electrochromic devices. For example, the electrochromic medium may include electrochromic materials that are solid metal oxides, redox active polymers, and hybrid combinations of solution-phase and solid metal oxides or redox active polymers; however, the above-described solution-phase design is typical of most of the electrochromic devices presently in use.

Even before a fourth surface reflector electrochromic mirror was commercially available, various groups researching electrochromic devices had discussed moving the reflector from the fourth surface to the third surface. Such a design has advantages in that it should, theoretically, be easier to manufacture because there are fewer layers to build into a device, i.e., the third surface transparent electrode is not necessary when there is a third surface reflector/electrode. Although this concept was described as early as 1966, no group had commercial success because of the exacting criteria demanded from a workable auto-dimming mirror incorporating a third surface reflector. U.S. Pat. No. 3,280,701, entitled “OPTICALLY VARIABLE ONE-WAY MIRROR,” issued Oct. 25, 1966, to J. F. Donnelly et al. has one of the earliest discussions of a third surface reflector for a system using a pH-induced color change to attenuate light.

U.S. Pat. No. 5,066,112, entitled “PERIMETER COATED, ELECTRO-OPTIC MIRROR,” issued Nov. 19, 1991, to N. R. Lynam et al., teaches an electro-optic mirror with a conductive coating applied to the perimeter of the front and rear glass elements for concealing the seal. Although a third surface reflector is discussed therein, the materials listed as being useful as a third surface reflector suffer from one or more of the following deficiencies: not having sufficient reflectivity for use as an inside mirror, or not being stable when in contact with a solution-phase electrochromic medium containing at least one solution-phase electrochromic material.

Others have broached the topic of a reflector/electrode disposed in the middle of an all solid state-type device. For example, U.S. Pat. Nos. 4,762,401, 4,973,141, and 5,069,535 to Baucke et al. teach an electrochromic mirror having the following structure: a glass element, a transparent (ITO) electrode, a tungsten oxide electrochromic layer, a solid ion conducting layer, a single layer hydrogen ion-permeable reflector, a solid ion conducting layer, a hydrogen ion storage layer, a catalytic layer, a rear metallic layer, and a back element (representing the conventional third and fourth surface). The reflector is not deposited on the third surface and is not directly in contact with electrochromic materials, certainly not at least one solution-phase electrochromic material and associated medium. Consequently, it is desirable to provide an improved high reflectivity electrochromic rearview mirror having a third surface reflector/electrode in contact with a solution-phase electrochromic medium containing at least one electrochromic material.

In the past, information, images or symbols from displays, such as vacuum fluorescent displays, have been displayed on electrochromic rearview mirrors for motor vehicles with reflective layers on the fourth surface of the mirror. The display is visible to the vehicle occupant by removing all of the reflective layer on a portion of the fourth surface and placing the display in that area. Although this design works adequately due to the transparent conductors on the second and third surface to impart current to the electrochromic medium, presently no design is commercially available which allows a display device to be incorporated into a mirror that has a reflective layer on the third surface. Removing all of the reflective layer on the third surface in the area aligned with the display area or the glare sensor area causes severe residual color problems when the electrochromic medium darkens and clears because, although colorization occurs at the transparent electrode on the second surface, there is no corresponding electrode on the third surface in that corresponding area to balance the charge. As a result, the color generated at the second surface (across from the display area or the glare sensor area) will not darken or clear at the same rate as other areas with balanced electrodes. This color variation is significant and is very aesthetically unappealing to the vehicle occupants.

Similar problems exist for outside rearview mirror assemblies that include signal lights, such as turn signal lights, behind the rear surface of the mirror. Examples of such signal mirrors are disclosed in U.S. Pat. Nos. 5,207,492, 5,361,190, and 5,788,357. By providing a turn signal light in an outside mirror assembly, a vehicle, or other vehicles traveling in the blind spot of the subject vehicle, will be more likely to notice when the driver has activated the vehicle's turn signal and thereby attempt to avoid an accident. Such mirror assemblies typically employ a dichroic mirror and a plurality of red LEDs mounted behind the mirror as the signal light source. The dichroic mirror includes a glass substrate and a dichroic reflective coating provided on the rear surface of the glass plate that transmits the red light generated by the LEDs as well as infrared radiation while reflecting all light and radiation having wavelengths less than that of red light. By utilizing a dichroic mirror, such mirror assemblies hide the LEDs when not in use to provide the general appearance of a typical rearview mirror, and allow the red light from such LEDs to pass through the dichroic mirror and be visible to drivers of vehicles behind and to the side of the vehicle in which such a mirror assembly is mounted. Examples of such signal mirrors are disclosed in U.S. Pat. Nos. 5,361,190 and 5,788,357.

In daylight, the intensity of the LEDs must be relatively high to enable those in other vehicles to readily notice the signal lights. Because the image reflected toward the driver is also relatively high in daylight, the brightness of the LEDs is not overly distracting. However, at night the same LED intensity could be very distracting, and hence, potentially hazardous. To avoid this problem, a day/night sensing circuit is mounted in the signal light subassembly behind the dichroic mirror to sense whether it is daytime or nighttime and toggle the intensity of the LEDs between two different intensity levels. The sensor employed in the day/night sensing circuit is most sensitive to red and infrared light so as to more easily distinguish between daylight conditions and the bright glare from the headlights of a vehicle approaching from the rear. Hence, the sensor may be mounted behind the dichroic coating on the dichroic mirror.

The dichroic mirrors used in the above-described outside mirror assemblies suffer from the same problems of many outside mirror assemblies in that their reflectance cannot be dynamically varied to reduce nighttime glare from the headlights of other vehicles.

Although outside mirror assemblies exist that include signal lights and other outside mirror assemblies exist that include electrochromic mirrors, signal lights have not been provided in mirror assemblies having an electrochromic mirror because the dichroic coating needed to hide the LEDs of the signal light typically cannot be applied to an electrochromic mirror, particularly those mirrors that employ a third surface reflector/electrode.

SUMMARY OF THE INVENTION

Accordingly, it is an aspect of the present invention to solve the above problems by providing an electrochromic rearview mirror assembly that includes a third surface reflector/electrode that provides a continuous layer of electrically conductive material across the entire visible surface of the rear element of the mirror, even those regions that lie in front of a light source, such as a signal light, information display, or illuminator, or a light sensor or receptor, that is positioned behind the electrochromic mirror. Yet another aspect of the present invention is to provide an electrochromic mirror having a third surface reflector/electrode that is at least partially transmissive at least in regions in front of a light source, such as a display, illuminator, or signal light. An additional aspect of the present invention is to provide a third surface reflector/electrode (i.e., second electrode) that is at least partially reflective in those regions in front of the light source so as to provide an ascetically pleasing appearance. Still another aspect of the present invention is to provide a coating for the third surface of an electrochromic mirror that functions as an electrode and as a reflector while allowing light having wavelengths corresponding to a display to be transmitted through the mirror. Still another aspect of the present invention is to provide an electrochromic mirror having a partially reflective, partially transmissive electrode that does not have too yellow a hue and has relative color neutrality.

To achieve these and other aspects and advantages, the electrochromic mirror according to the present invention comprises front and rear elements having front and rear surfaces and being sealably bonded together in a spaced-apart relationship to define a chamber; a transparent first electrode including a layer of conductive material carried on a surface of one of the elements; an electrochromic material contained in the chamber; and a partially transmissive, partially reflective second electrode disposed over substantially all of the front surface of the rear element. The electrochromic rearview mirror so constructed, has a reflectance of at least about 35% and a transmittance of at least about 5% in at least portions of the visible spectrum. The mirror preferably further exhibits relative color neutrality with a C* value of less than about 20. Further, the mirror preferably does not have a perceivable yellow hue and thus has a b* value less than about 15.

Another aspect of the present invention is to provide a rearview mirror assembly having a light emitting display assembly mounted behind the mirror within the mirror housing whereby spurious reflections and ghost images are substantially reduced or eliminated. To achieve this and other aspects and advantages, a rearview mirror assembly according to the present invention comprises a housing adapted to be mounted to the vehicle; front and rear elements mounted in the housing, the elements each having front and rear surfaces and being sealably bonded together in a spaced-apart relationship to define a chamber; an electrochromic material contained in the chamber; a transparent first electrode including a layer of conductive material carried on a surface of one of the elements; a second electrode disposed on the front surface of the rear element; and a light emitting display mounted in the housing. Either the second electrode is reflective or a separate reflector is provided on the rear surface of the rear element, the reflective electrode/reflector being at least partially transmissive in at least a location in front of the display. The display has a front surface and is preferably mounted behind the rear surface of the rear element, such that the front surface of the display is not parallel with the rear surface of the mirror. Alternatively, the display may have a non-specular front surface or the front surface could be laminated directly onto the back of the mirror. As yet another alternative, an anti-reflection coating may be applied to the reflective surface(s) of the display and the front surface of the mirror. Still another alternative to achieve the above aspects and advantages is to provide at least one masking component that minimizes light that is emitted from the display from reflecting off of the reflector back toward the display and then reflecting back off the front surface of the display toward the front surface of the front element then on to the viewer.

An additional aspect of the present invention is to provide a rearview mirror assembly including a light emitting display, whereby the display is mounted in front of the reflective layer of the mirror. To achieve these and other aspects of the present invention, a light emitting display may be used that is substantially transparent and mounted either to the front surface of the front element or mounted in the chamber defined between the front and rear elements. A preferred transparent light emitting display is an organic light emitting diode display.

Another aspect of the present invention is to provide an exterior rearview mirror assembly incorporating a light source for illuminating a portion of the exterior of the vehicle, such as the door handle and locking mechanism area of a vehicle door. To achieve these and other aspects and advantages, an exterior rearview mirror assembly of the present invention comprises a housing adapted to be mounted to the exterior of the vehicle; a first element mounted in the housing, the element having a front and rear surface; a reflector disposed on one of the surfaces of the first element; and a light source mounted in the housing behind the rear surface of the first element, the light source being positioned within the housing so as to emit light, when activated, through the first element and through a region of the reflector that is at least partially transmissive toward a side of a vehicle. Such a rearview mirror assembly thus conveniently illuminates areas on the outside of the vehicle such as the door handles and locking mechanisms.

Another aspect of the invention is to locate a light sensor, such as that used to sense ambient light in an electrochromic mirror assembly, behind a reflective portion of the mirror while providing for increased sensing area for light collection behind the electrochromic media and reflective portion of the mirror without the distractive appearance resulting from missing patches of reflective material in the mirror. To achieve these and other aspects and advantages, an electrochromic mirror of the present invention comprises a housing adapted to be mounted to the vehicle; front and rear elements mounted in said housing, the elements each having front and rear surfaces and being sealably bonded together in a spaced-apart relationship to define a chamber; a transparent first electrode including a layer of conductive material carried on a surface of one of the elements; a second electrode disposed on the front surface of the rear element, wherein either said second electrode is a reflective electrode or a separate reflector is disposed over substantially all of the rear surface of the rear element, the reflective electrode/reflector being partially transmissive and partially reflective over substantially all of one of the surfaces of the rear element; an electrochromic material contained in the chamber; and a light sensor mounted in the housing behind the rear element and behind the partially transmissive, partially reflective electrode/reflector.

In accordance with another embodiment of the present invention, a rearview mirror assembly for a vehicle comprises: a housing adapted to be mounted to the vehicle; front and rear elements mounted in the housing, the elements each having front and rear surfaces and being sealably bonded together in a spaced-apart relationship to define a chamber; a transparent first electrode including a layer of conductive material carried on a surface of one of the elements; a second electrode disposed on the front surface of the rear element; an electrochromic material contained in the chamber; and a graphic display positioned in the housing behind said rear element, wherein either the second electrode is a reflective electrode or a separate reflector is disposed over substantially all of the rear surface of the rear element, the reflective electrode/reflector being partially transmissive and partially reflective in at least a location in front of the graphic display.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 5b is an enlarged top view of the third surface reflector of FIG. 5a;

DETAILED DESCRIPTION OF THE PREFERRED EMBODIMENTS

Figure 2:
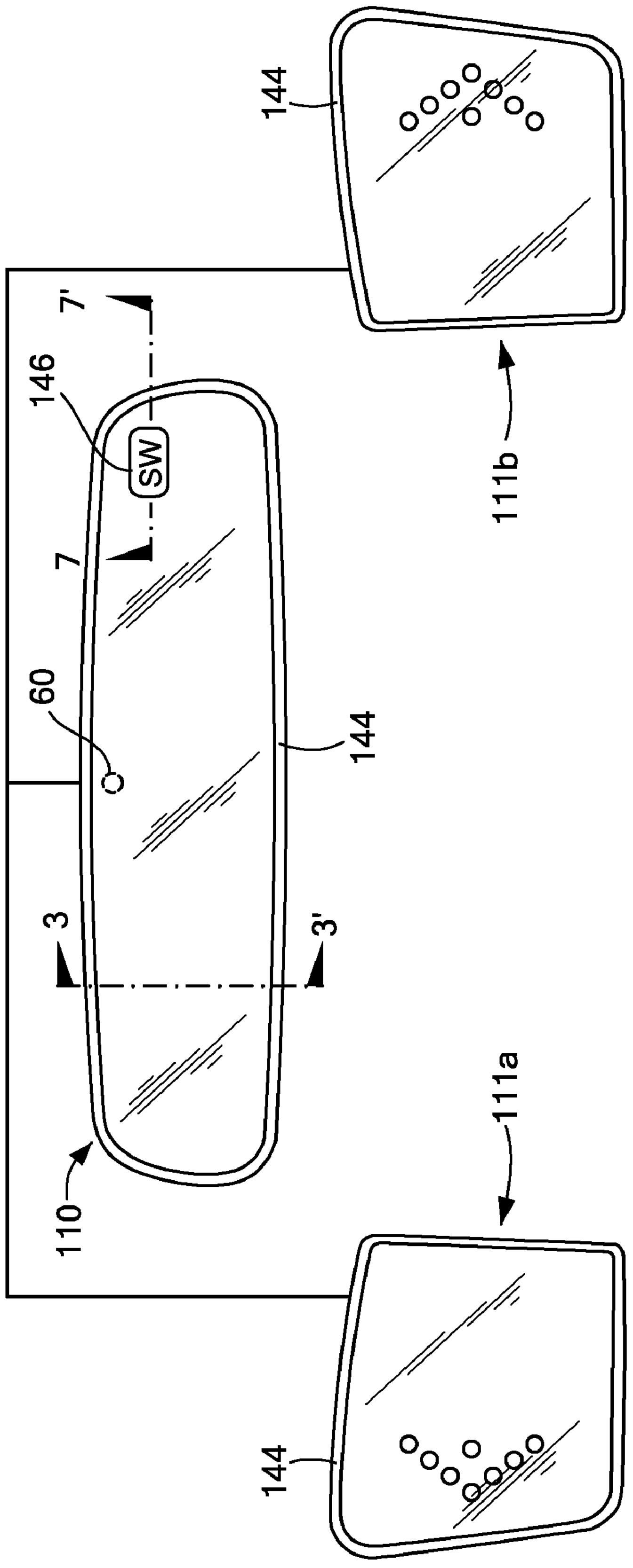
FIG. 2 is a front elevational view schematically illustrating an inside/outside electrochromic rearview mirror system for motor vehicles, where the inside and outside mirrors incorporate the mirror assembly of the present invention.

FIG. 2 shows a front elevational view schematically illustrating an inside mirror assembly 110 and two outside rearview mirror assemblies 111*a* and 111*b* for the driver-side and passenger-side, respectively, all of which are adapted to be installed on a motor vehicle in a conventional manner and where the mirrors face the rear of the vehicle and can be viewed by the driver of the vehicle to provide a rearward view. Inside mirror assembly 110 and outside rearview mirror assemblies 111*a* and 111*b* may incorporate light-sensing electronic circuitry of the type illustrated and described in the above-referenced Canadian Patent No. 1,300,945, U.S. Pat. No. 5,204,778, or U.S. Pat. No. 5,451,822, and other circuits capable of sensing glare and ambient light and supplying a drive voltage to the electrochromic element. Mirror assemblies 110, 111*a*, and 111*b* are essentially identical in that like numbers identify components of the inside and outside mirrors. These components may be slightly different in configuration, but function in substantially the same manner and obtain substantially the same results as similarly numbered components. For example, the shape of the front glass element of inside mirror 110 is generally longer and narrower than outside mirrors 111*a* and 111*b*. There are also some different performance standards placed on inside mirror 110 compared with outside mirrors 111*a* and 111*b*. For example, inside mirror 110 generally, when fully cleared, should have a reflectance value of about 70 percent to about 85 percent or higher, whereas the outside mirrors often have a reflectance of about 50 percent to about 65 percent. Also, in the United States (as supplied by the automobile manufacturers), the passenger-side mirror 111*b* typically has a spherically bent or convex shape, whereas the driver-side mirror 111*a* and inside mirror 110 presently must be flat. In Europe, the driver-side mirror 111*a* is commonly flat or aspheric, whereas the passenger-side mirror 111*b* has a convex shape. In Japan, both outside mirrors have a convex shape. The following description is generally applicable to all mirror assemblies of the present invention.

Figure 3:
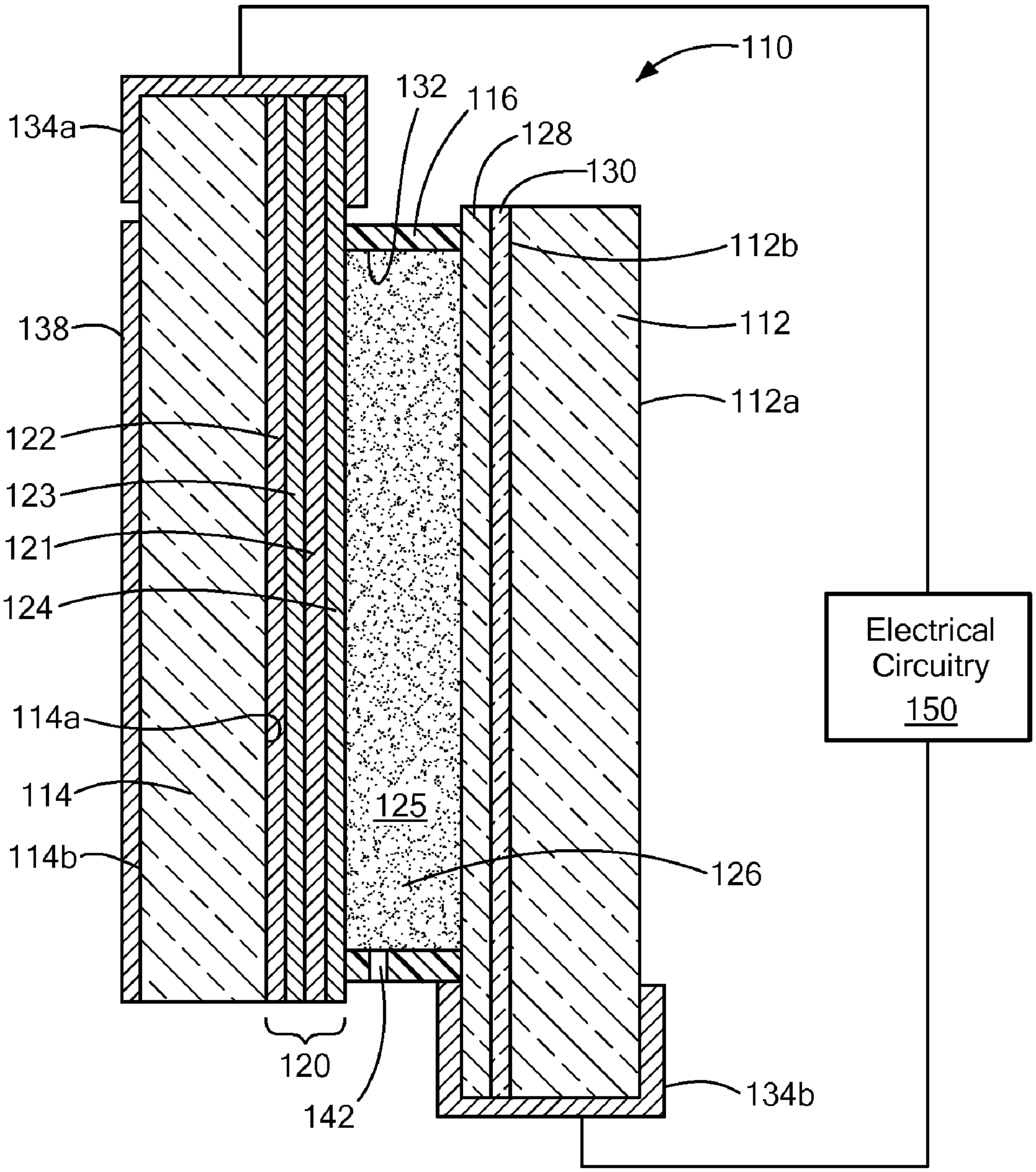
FIG. 3 is an enlarged cross-sectional view of the inside electrochromic rearview mirror incorporating a third surface reflector/electrode illustrated in FIG. 2, taken on the line 3-3' thereof.

FIG. 3 shows a cross-sectional view of mirror assembly 110 having a front transparent element 112 having a front surface 112*a* and a rear surface 112*b*, and a rear element 114 having a front surface 114*a* and a rear surface 114*b*. For clarity of description of such a structure, the following designations will be used hereinafter. The front surface 112*a* of the front glass element will be referred to as the first surface, and the back surface 112*b* of the front glass element as the second surface. The front surface 114*a* of the rear glass element will be referred to as the third surface, and the back surface 114*b* of the rear glass element as the fourth surface. A chamber 125 is defined by a layer of transparent conductor 128 (carried on second surface 112*b*), a reflector/electrode 120 (disposed on third surface 114*a*), and an inner circumferential wall 132 of sealing member 116. An electrochromic medium 126 is contained within chamber 125.

As broadly used and described herein, the reference to an electrode or layer as being "carried" on a surface of an element, refers to both electrodes or layers that are disposed directly on the surface of an element or disposed on another coating, layer or layers that are disposed directly on the surface of the element.

Front transparent element 112 may be any material which is transparent and has sufficient strength to be able to operate in the conditions, e.g., varying temperatures and pressures, commonly found in the automotive environment. Front element 112 may comprise any type of borosilicate glass, soda lime glass, float glass, or any other material, such as, for example, a polymer or plastic, that is transparent in the visible region of the electromagnetic spectrum. Front element 112 is preferably a sheet of glass. The rear element must meet the operational conditions outlined above, except that it does not need to be transparent in all applications, and therefore may comprise polymers, metals, glass, ceramics, and preferably is a sheet of glass.

The coatings of the third surface 114*a* are sealably bonded to the coatings on the second surface 112*b* in a spaced-apart and parallel relationship by a seal member 116 disposed near the outer perimeter of both second surface 112*b* and third surface 114*a*. Seal member 116 may be any material that is capable of adhesively bonding the coatings on the second surface 112*b* to the coatings on the third surface 114*a* to seal the perimeter such that electrochromic material 126 does not leak from chamber 125. Optionally, the layer of transparent conductive coating 128 and the layer of reflector/electrode 120 may be removed over a portion where the seal member is disposed (not the entire portion, otherwise the drive potential could not be applied to the two coatings). In such a case, seal member 116 must bond well to glass.

The performance requirements for a perimeter seal member 116 used in an electrochromic device are similar to those for a perimeter seal used in a liquid crystal device (LCD), which are well known in the art. The seal must have good adhesion to glass, metals and metal oxides; must have low permeabilities for oxygen, moisture vapor, and other detrimental vapors and gases; and must not interact with or poison the electrochromic or liquid crystal material it is meant to contain and protect. The perimeter seal can be applied by means commonly used in the LCD industry, such as by silk-screening or dispensing. Totally hermetic seals, such as those made with glass fit or solder glass, can be used, but the high temperatures involved in processing (usually near 450° C.) this type of seal can cause numerous problems, such as glass substrate warpage, changes in the properties of transparent conductive electrode, and oxidation or degradation of the reflector. Because of their lower processing temperatures, thermoplastic, thermosetting or UV curing organic sealing resins are preferred. Such organic resin sealing systems for LCDs are described in U.S. Pat. Nos. 4,297,401, 4,418,102, 4,695,490, 5,596,023, and 5,596,024. Because of their excellent adhesion to glass, low oxygen permeability and good solvent resistance, epoxy-based organic sealing resins are preferred. These epoxy resin seals may be UV curing, such as described in U.S. Pat. No. 4,297,401, or thermally curing, such as with mixtures of liquid epoxy resin with liquid polyamide resin or dicyandiamide, or they can be homopolymerized. The epoxy resin may contain fillers or thickeners to reduce flow and shrinkage such as fumed silica, silica, mica, clay, calcium carbonate, alumina, etc., and/or pigments to add color. Fillers pretreated with hydrophobic or silane surface treatments are preferred. Cured resin crosslink density can be controlled by use of mixtures of mono-functional, di-functional, and multi-functional epoxy resins and curing agents. Additives such as silanes or titanates can be used to improve the seal's hydrolytic stability, and spacers such as glass beads or rods can be used to control final seal thickness and substrate spacing. Suitable epoxy resins for use in a perimeter seal member 116 include, but are not limited to: "EPON RESIN" 813, 825, 826, 828, 830, 834, 862, 1001F, 1002F, 2012, DPS-155, 164, 1031, 1074, 58005, 58006, 58034, 58901, 871, 872, and DPL-862 available from Shell Chemical Co., Houston, Tex.; "ARALITE" GY 6010, GY 6020, CY 9579, GT 7071, XU 248, EPN 1139, EPN 1138, PY 307, ECN 1235, ECN 1273, ECN 1280, MT 0163, MY 720, MY 0500, MY 0510, and PT 810 available from Ciba Geigy, Hawthorne, N.Y.; and "D.E.R." 331, 317, 361, 383, 661, 662, 667, 732, 736, "D.E.N." 431, 438, 439 and 444 available from Dow Chemical Co., Midland, Mich. Suitable epoxy curing agents include V-15, V-25, and V-40 polyamides from Shell Chemical Co.; "AJICURE" PN-23, PN-34, and VDH available from Ajinomoto Co., Tokyo, Japan; "CUREZOL" AW, 2MZ, 2E4MZ, C11Z, C17Z, 2PZ, 2IZ, and 2P4MZ available from Shikoku Fine Chemicals, Tokyo, Japan; "ERISYS" DDA or DDA accelerated with U-405, 24EMI, U-410, and U-415 available from CVC Specialty Chemicals, Maple Shade, N.J.; and "AMICURE" PACM, 352, CG, CG-325, and CG-1200 available from Air Products, Allentown, Pa. Suitable fillers include fumed silica such as "CAB-O-SIL" L-90, LM-130, LM-5, PTG, M-5, MS-7, MS-55, TS-720, HS-5, and EH-5 available from Cabot Corporation, Tuscola, Ill.; "AEROSIL" R972, R974, R805, R812, R812 S, R202, US204, and US206 available from Degussa, Akron, Ohio. Suitable clay fillers include BUCA, CATALPO, ASP NC, SATINTONE 5, SATINTONE SP-33, TRANSLINK 37, TRANSLINK 77, TRANSLINK 445, and TRANSLINK 555 available from Engelhard Corporation, Edison, N.J. Suitable silica fillers are SILCRON G-130, G-300, G-100-T, and G-100 available from SCM Chemicals, Baltimore, Md. Suitable silane coupling agents to improve the seal's hydrolytic stability are Z-6020, Z-6030, Z-6032, Z-6040, Z-6075, and Z-6076 available from Dow Corning Corporation, Midland, Mich. Suitable precision glass microbead spacers are available in an assortment of sizes from Duke Scientific, Palo Alto, Calif.

The layer of a transparent electrically conductive material 128 is deposited on the second surface 112*b* to act as an electrode. Transparent conductive material 128 may be any material which bonds well to front element 112, is resistant to corrosion to any materials within the electrochromic device, resistant to corrosion by the atmosphere, has minimal diffuse or specular reflectance, high light transmission, near neutral coloration, and good electrical conductance. Transparent conductive material 128 may be fluorine-doped tin oxide, doped zinc oxide, zinc-doped indium oxide, indium tin oxide (ITO), ITO/metal/ITO (IMI) as disclosed in "Transparent Conductive Multilayer-Systems for FPD Applications," by J. Stollenwerk, B. Ocker, K. H. Kretschmer of LEYBOLD A G, Alzenau, Germany, the materials described in above-referenced U.S. Pat. No. 5,202,787, such as TEC 20 or TEC 15, available from Libbey Owens-Ford Co. of Toledo, Ohio, or other transparent conductors. Generally, the conductance of transparent conductive material 128 will depend on its thickness and composition. IMI generally has superior conductivity compared with the other materials. IMI is, however, known to undergo more rapid environmental degradation and suffer from interlayer delamination. The thickness of the various layers in the IMI structure may vary, but generally the thickness of the first ITO layer ranges from about 10 Å to about 200 Å, the metal ranges from about 10 Å to about 200 Å, and the second layer of ITO ranges from about 10 Å to about 200 Å. If desired, an optional layer or layers of a color suppression material 130 may be deposited between transparent conductive material 128 and the second surface 112*b* to suppress the reflection of any unwanted portions of the electromagnetic spectrum.

In accordance with the present invention, a combination reflector/electrode 120 is disposed on third surface 114*a*. Reflector/electrode 120 comprises at least one layer of a reflective material 121 which serves as a mirror reflectance layer and also forms an integral electrode in contact with and in a chemically and electrochemically stable relationship with any constituents in an electrochromic medium. As stated above, the conventional method of building electrochromic devices was to incorporate a transparent conductive material on the third surface as an electrode, and place a reflector on the fourth surface. By combining the "reflector" and "electrode" and placing both on the third surface, several unexpected advantages arise which not only make the device manufacture less complex, but also allow the device to operate with higher performance. The following will outline the exemplary advantages of the combined reflector/electrode of the present invention.

First, the combined reflector/electrode 120 on the third surface generally has higher conductance than a conventional transparent electrode and previously used reflector/electrodes, which will allow greater design flexibility. One can either change the composition of the transparent conductive electrode on the second surface to one that has lower conductance (being cheaper and easier to produce and manufacture) while maintaining coloration speeds similar to that obtainable with a fourth surface reflector device, while at the same time decreasing substantially the overall cost and time to produce the electrochromic device. If, however, performance of a particular design is of utmost importance, a moderate to high conductance transparent electrode can be used on the second surface, such as, for example, ITO, IMI, etc. The combination of a high conductance (i.e., less than 250Ω/Y, preferably less than 15Ω/Y) reflector/electrode on the third surface and a high conductance transparent electrode on the second surface will not only produce an electrochromic device with more even overall coloration, but will also allow for increased speed of coloration and clearing. Furthermore, in fourth surface reflector mirror assemblies there are two transparent electrodes with relatively low conductance, and in previously used third surface reflector mirrors there is a transparent electrode and a reflector/electrode with relatively low conductance and, as such, a long buss bar on the front and rear element to bring current in and out is necessary to ensure adequate coloring speed. The third surface reflector/electrode of the present invention has a higher conductance and therefore has a very even voltage or potential distribution across the conductive surface, even with a small or irregular contact area. Thus, the present invention provides greater design flexibility by allowing the electrical contact for the third surface electrode to be very small while still maintaining adequate coloring speed.

Figure 1:
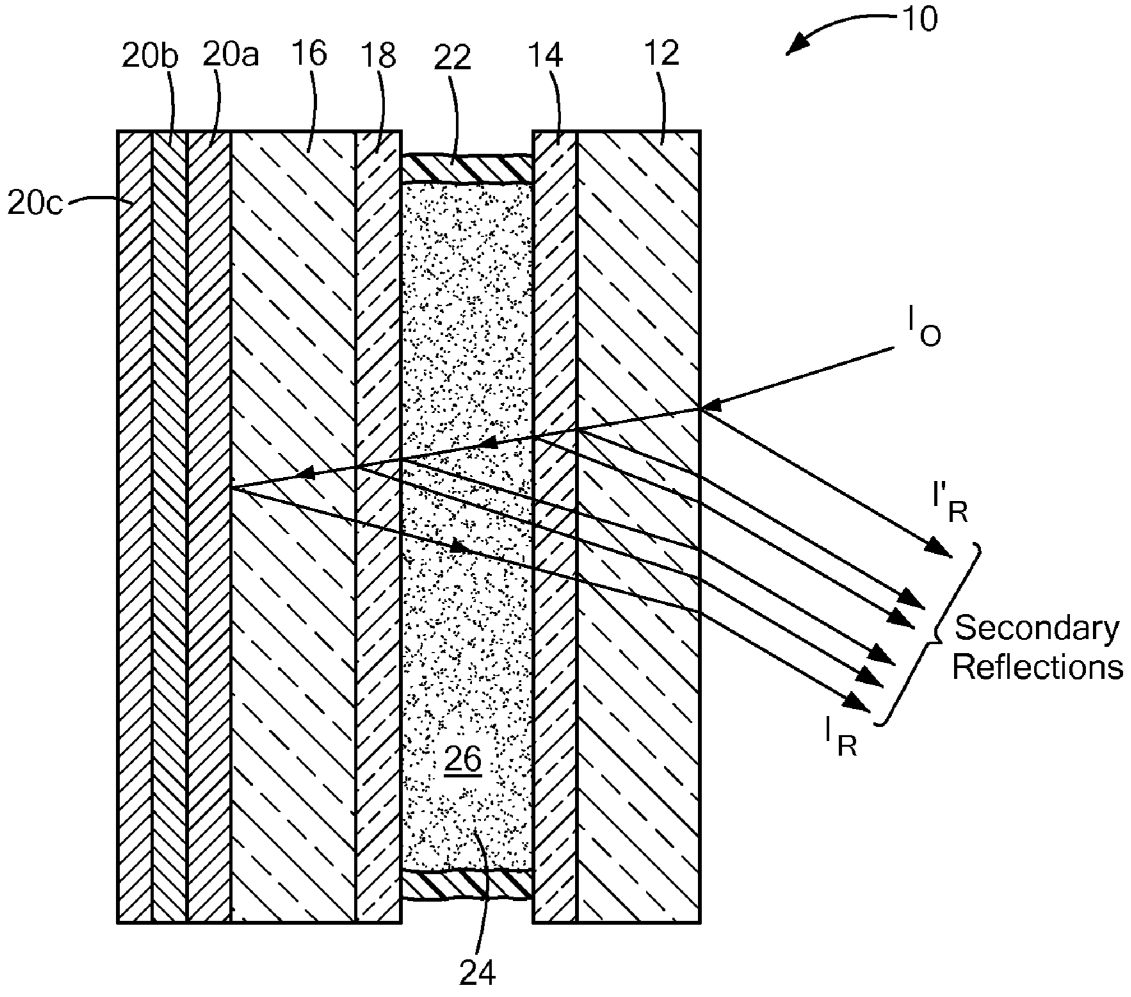
FIG. 1 is an enlarged cross-sectional view of a prior art electrochromic mirror assembly.

Second, a third surface reflector/electrode helps improve the image being viewed through the mirror. FIG. 1 shows how light travels through a conventional fourth surface reflector device. In the fourth surface reflector, the light travels through: the first glass element, the transparent conductive electrode on the second surface, the electrochromic media, the transparent conductive electrode on the third surface, and the second glass element, before being reflected by the fourth surface reflector. Both transparent conductive electrodes exhibit highly specular transmittance but also possess diffuse transmittance and reflective components, whereas the reflective layer utilized in any electrochromic mirror is chosen primarily for its specular reflectance. By diffuse reflectance or transmittance component, we mean a material which reflects or transmits a portion of any light impinging on it according to Lambert's law whereby the light rays are spread-about or scattered. By specular reflectance or transmittance component, we mean a material which reflects or transmits light impinging on it according to Snell's laws of reflection or refraction. In practical terms, diffuse reflectors and transmitters tend to slightly blur images, whereas specular reflectors show a crisp, clear image. Therefore, light traveling through a mirror having a device with a fourth surface reflector has two partial diffuse reflectors (on the second and third surface) which tend to blur the image, and a device with a third surface reflector/electrode of the present invention only has one diffuse reflector (on the second surface).

Additionally, because the transparent electrodes act as partial diffuse transmitters, and the farther away the diffuse transmitter is from the reflecting surface the more severe the blurring becomes, a mirror with a fourth surface reflector appears significantly more hazy than a mirror with a third surface reflector. For example, in the fourth surface reflector shown in FIG. 1, the diffuse transmitter on the second surface is separated from the reflector by the electrochromic material, the second conductive electrode, and the second glass element. The diffuse transmitter on the third surface is separated from the reflector by the second glass element. By incorporating a combined reflector/electrode on the third surface in accordance with the present invention, one of the diffuse transmitters is removed, and the distance between the reflector and the remaining diffuse transmitter is closer by the thickness of the rear glass element. Therefore, the third surface metal reflector/electrode of the present invention provides an electrochromic mirror with a superior viewing image.

Finally, a third surface metal reflector/electrode improves the ability to reduce double imaging in an electrochromic mirror. As stated above, there are several interfaces where reflections can occur. Some of these reflections can be significantly reduced with color suppression or anti-reflective coatings; however, the most significant "double imaging" reflections are caused by misalignment of the first surface and the surface containing the reflector, and the most reproducible way of minimizing the impact of this reflection is by ensuring both glass elements are parallel. Presently, convex glass is often used for the passenger side outside mirror and aspheric glass is sometimes used for the driver side outside mirror to increase the field of view and reduce potential blind spots. However, it is difficult to reproducibly bend successive elements of glass having identical radii of curvature. Therefore, when building an electrochromic mirror, the front glass element and the rear glass element may not be perfectly parallel (do not have identical radii of curvature), and therefore, the otherwise controlled double imaging problems become much more pronounced. By incorporating a combined reflector electrode on the third surface of the device in accordance with the present invention, light does not have to travel through the rear glass element before being reflected, and any double imaging that occurs from the elements being out of parallel will be significantly reduced.

It is desirable in the construction of outside rearview mirrors to incorporate thinner glass in order to decrease the overall weight of the mirror so that the mechanisms used to manipulate the orientation of the mirror are not overloaded. Decreasing the weight of the device also improves the dynamic stability of the mirror assembly when exposed to vibrations. Heretofore, no electrochromic mirrors incorporating a solution-phase electrochromic medium and two thin glass elements have been commercially available, because thin glass suffers from being flexible and prone to warpage or breakage, especially when exposed to extreme environments. This problem is substantially improved by using an improved electrochromic device incorporating two thin glass elements having an improved gel material. This improved device is disclosed in commonly assigned U.S. Pat. No. 5,940,201 entitled "AN ELECTROCHROMIC MIRROR WITH TWO THIN GLASS ELEMENTS AND A GELLED ELECTROCHROMIC MEDIUM," filed on or about Apr. 2, 1997. The entire disclosure, including the references contained therein, of this patent is incorporated herein by reference. The addition of the combined reflector/electrode onto the third surface of the device further helps remove any residual double imaging resulting from the two glass elements being out of parallel.

The most important factors for obtaining a reliable electrochromic mirror having a third surface reflector/electrode 120 are that the reflector/electrode have sufficient reflectance and that the mirror incorporating the reflector/electrode has adequate operational life. Regarding reflectance, the automobile manufacturers prefer a reflective mirror for the inside mirror having a reflectivity of at least 60 percent, whereas the reflectivity requirements for an outside mirror are less stringent and generally must be at least 35 percent.

To produce an electrochromic mirror with 70 percent reflectance, the reflector must have a reflectance higher than 70 percent because the electrochromic medium in front of the reflector reduces the reflectance from the reflector interface as compared to having the reflector in air due to the medium having a higher index of refraction as compared to air. Also, the glass, the transparent electrode, and the electrochromic medium even in its clear state are slightly light absorbing. Typically, if an overall reflectance of 65 percent is desired, the reflector must have a reflectance of about 75 percent.

Regarding operational life, the layer or layers that comprise the reflector/electrode 120 must have adequate bond strength to the peripheral seal, the outermost layer must have good shelf life between the time it is coated and the time the mirror is assembled, the layer or layers must be resistant to atmospheric and electrical contact corrosion, and must bond well to the glass surface or to other layers disposed beneath it, e.g., the base or intermediate layer (122 or 123, respectively). The overall sheet resistance for the reflector/electrode 120 may range from about 0.01Ω/Y to about 100Ω/Y and preferably ranges from about 0.2Ω/Y to about 25Ω/Y. As will be discussed in more detail below, improved electrical interconnections using a portion of the third surface reflector/electrode as a high conductance contact or buss bar for the second surface transparent conductive electrode may be utilized when the conductance of the third surface reflector/electrode is below about 2Ω/Y.

Referring to FIG. 3 for one embodiment of the present invention, a reflector/electrode that is made from a single layer of a reflective silver or silver alloy 121 is provided that is in contact with at least one solution-phase electrochromic material. The layer of silver or silver alloy covers the entire third surface 114*a* of second element 114. The reflective silver alloy means a homogeneous or non-homogeneous mixture of silver and one or more metals, or an unsaturated, saturated, or supersaturated solid solution of silver and one or more metals. The thickness of reflective layer 121 ranges from about 50 Å to about 2000 Å, and more preferably from about 200 Å to about 1000 Å. If reflective layer 121 is disposed directly to the glass surface, it is preferred that the glass surface be treated by plasma discharge to improve adhesion.

Table 1 shows the relevant properties for a number of different metals that have been proposed for third surface reflectors as compared with the materials suitable for the reflector/electrode 120 of the present invention. The only materials in Table 1 having reflectance properties suitable for use as a third surface reflector/electrode in contact with at least one solution-phase electrochromic material for an inside electrochromic mirror for a motor vehicle are aluminum, silver, and silver alloys. Aluminum performs very poorly when in contact with solution-phase material(s) in the electrochromic medium because aluminum reacts with or is corroded by these materials. The reacted or corroded aluminum is non-reflective and non-conductive and will typically dissolve off, flake off, or delaminate from the glass surface. Silver is more stable than aluminum but can fail when deposited over the entire third surface because it does not have long shelf life and is not resistant to electrical contact corrosion when exposed to the environmental extremes found in the motor vehicle environment. These environmental extremes include temperatures ranging from about −40° C. to about 85° C., and humidities ranging from about 0 percent to about 100 percent. Further, mirrors must survive at these temperatures and humidities for coloration cycle lives up to 100,000 cycles. The other prior art materials (silver/copper, chromium, stainless steel, rhodium, platinum, palladium, Inconel®, copper, or titanium) suffer from any one of a number of deficiencies such as: very poor color neutrality (silver/copper and copper); poor reflectance (chromium, stainless steel, rhodium, molybdenum, platinum, palladium, Inconel®, and titanium); poor cleanability (chromium); or poor electrical contact stability (chromium, stainless steel and molybdenum).

When silver is alloyed with certain materials to produce a third surface reflector/electrode, the deficiencies associated with silver metal and aluminum metal can be overcome. Suitable materials for the reflective layer are alloys of silver/palladium, silver/gold, silver/platinum, silver/rhodium, silver/titanium, etc. The amount of the solute material, i.e., palladium, gold, etc., can vary. As can be seen from Table 1, the silver alloys surprisingly retain the high reflectance and low sheet resistance properties of silver, while simultaneously improving their contact stability, shelf life, and also increasing their window of potential stability when used as electrodes in propylene carbonate containing 0.2 molar tetraethylammonium tetrafluoroborate. The presently preferred materials for reflective layer 121 are silver/gold, silver/platinum, and silver/palladium.

More typically, reflector/electrode 120 has, in addition to the layer of a reflective alloy 121, an optional base layer of a conductive metal or alloy 122 deposited directly on the third surface 114*a*. There may also be an optional intermediate layer of a conductive metal or alloy 123 disposed between the layer of reflective material 121 and the base coat 122. If reflector/electrode 120 includes more than one layer, there should not be galvanic corrosion between the two metals or alloys. If optional base layer 122 is deposited between the reflective layer 121 and the glass element 114, it should be environmentally rugged, e.g., bond well to the third (glass) surface 114*a* and to reflective layer 121, and maintain this bond when the seal 116 is bonded to the reflective layer. Base layer 122 may have a thickness from about 50 Å to about 2000 Å, and more preferably from about 100 Å to about 1000 Å. Suitable materials for the base layer 122 are chromium, stainless steel, titanium, and alloys of chromium/molybdenum/nickel, molybdenum, and nickel-based alloys (commonly referred to as Inconel®, available from Castle Metals, Chicago, Ill.). The main constituents of Inconel® are nickel which may range from 52 percent to 76 percent (Inconel® 617 and 600, respectfully), iron which may range from 1.5 percent to 18.5 percent (Inconel® 617 and Inconel® 718, respectfully), and chromium which may range from 15 percent to 23 percent (Inconel® 600 and Inconel® 601, respectfully). Inconel® 617 having 52 percent nickel, 1.5 percent iron, 22 percent chromium, and typical "other" constituents including 12.5 percent cobalt, 9.0 percent molybdenum, and 1.2 percent aluminum was used in the present examples.

In some instances it is desirable to provide an optional intermediate layer 123 between the reflective layer 121 and the base layer 122 in case the material of layer 121 does not adhere well to the material of layer 122 or there are any adverse interactions between the materials, e.g., galvanic corrosion. If used, intermediate layer 123 should exhibit environmental ruggedness, e.g., bond well to the base layer 122 and to the reflective layer 121, and maintain this bond when the seal member 116 is bonded to the reflective layer 121. The thickness of intermediate layer 123 ranges from about 10 Å to about 2000 Å, and more preferably from about 100 Å to about 1000 Å. Suitable materials for the optional intermediate layer 123 are molybdenum, rhodium, stainless steel, titanium, copper, nickel, gold, platinum, and alloys thereof. Reference is made to examples 1 and 2 to show how the insertion of a rhodium intermediate layer between a chromium base layer and a silver or silver alloy reflective layer increases the time to failure in copper-accelerated acetic acid-salt spray (CASS) by a factor of 10. Example 4 shows how the insertion of a molybdenum intermediate layer between a chromium base layer and a silver alloy having a molybdenum flash over-coat layer increases the time to failure in CASS by a factor of 12.

Finally, it is sometimes desirable to provide an optional flash over-coat 124 over reflective layer 121, such that it (and not the reflective layer 121) contacts the electrochromic medium. This flash over-coat layer 124 must have stable behavior as an electrode, it must have good shelf life, it must bond well to the reflective layer 121, and maintain this bond when the seal member 116 is bonded thereto. It must be sufficiently thin, such that it does not completely block the reflectivity of reflective layer 121. In accordance with another embodiment of the present invention, when a very thin flash over-coat 124 is placed over the highly reflecting layer, then the reflective layer 121 may be silver metal or a silver alloy because the flash layer protects the reflective layer while still allowing the highly reflecting layer 121 to contribute to the reflectivity of the mirror. In such cases, a thin (between about 25 Å and about 300 Å) layer of rhodium, platinum, or molybdenum is deposited over the reflective layer 121. When reflective layer 121 is silver, flash layer 122 may also be a silver alloy.

It is preferred but not essential that the third surface reflector/electrode 120 be maintained as the cathode in the circuitry because this eliminates the possibility of anodic dissolution or anodic corrosion that might occur if the reflector/electrode was used as the anode. Although as can be seen in Table 1, if certain silver alloys are used, the positive potential limit of stability extends out far enough, e.g., 1.2 V, that the silver alloy reflector/electrode could safely be used as the anode in contact with at least one solution-phase electrochromic material.

TABLE 1

| Metal | White Light Reflectance In Air | Reflectance In Device (%) | Contact Stability | Negative Potential Limit of Window of Potential Stability (V) | Positive Potential Limit Window of Potential Stability (V) |
|---|---|---|---|---|---|
| Al | >92 | N/A | very poor | N/A | N/A |
| Cr | 65 | N/A | poor | N/A | N/A |
| Stainless Steel | 60 | N/A | good | N/A | N/A |
| Rh | 75 | N/A | very good | N/A | N/A |
| Pt | 72 | N/A | very good | N/A | N/A |
| Inconel | 55 | N/A | N/A | N/A | N/A |
| Ag | 97 | 84 | fair | −2.29 | 0.86 |
| Ag2.7Pd | 93 | 81 | good | −2.26 | 0.87 |
| Ag10Pd | 80 | 68 | good | −2.05 | 0.97 |
| Ag6Pt | 92 | 80 | good | −1.66* | 0.91 |
| Ag6Au | 96 | 84 | good | −2.25 | 0.98 |
| Ag25Au | 94 | 82 | good | −2.3 | 1.2 |

*This number is suspect because the test was run in propylene carbonate containing some water.

The various layers of reflector/electrode 120 can be deposited by a variety of deposition procedures, such as RF and DC sputtering, e-beam evaporation, chemical vapor deposition, electrodeposition, etc., that will be known to those skilled in the art. The preferred alloys are preferably deposited by sputtering (RF or DC) a target of the desired alloy or by sputtering separate targets of the individual metals that make up the desired alloy, such that the metals mix during the deposition process and the desired alloy is produced when the mixed metals deposit and solidify on the substrate surface.

Figure 4:
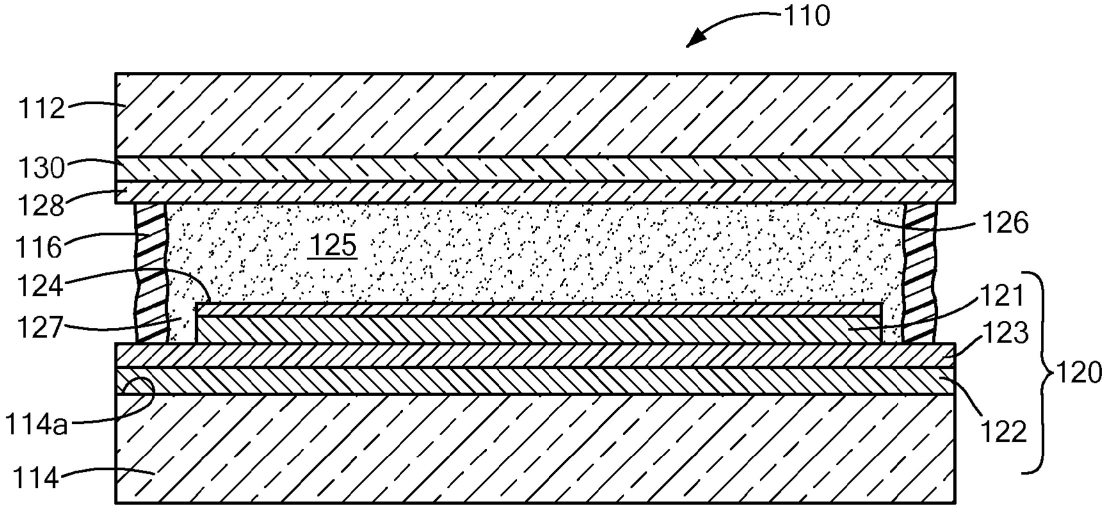
FIG. 4 is an enlarged cross-sectional view of an electrochromic mirror incorporating an alternate embodiment of a third surface reflector/electrode according to the present invention.

In another embodiment, the reflector/electrode 120 shown in FIG. 4 has at least two layers (121 and 122), where at least one layer of a base material 122 covers substantially the entire portion of the third surface 114*a* and at least one layer of a reflective material 121 covers the inner section of the third surface 114*a*, but does not cover the peripheral edge portion 125 where seal member 116 is disposed. Peripheral portion 125 may be created by masking that portion of layer 122 during deposition of the layer of reflective material 121, or the layer of reflective material may be deposited over the entire third surface and subsequently removed or partially removed in the peripheral portion. The masking of layer 122 may be accomplished by use of a physical mask or through other well-known techniques, such as photolithography and the like. Alternatively, layer 122 may be partially removed in the peripheral portion by a variety of techniques, such as, for example, by etching (laser, chemical, or otherwise), mechanical scraping, sandblasting, or otherwise. Laser etching is the presently preferred method because of its accuracy, speed, and control. Partial removal is preferably accomplished by laser etching in a pattern where enough metal is removed to allow the seal member 116 to bond directly to the third surface 114*a* while leaving enough metal in this area such that the conductance in this area is not significantly reduced.

In addition, an optional intermediate layer of a conductive material 123 may be placed over the entire area of third surface 114*a* and disposed between the reflective layer 121 and the base layer 122, or it may be placed only under the area covered by layer 121, i.e., not in peripheral edge portion 125. If this optional intermediate layer is utilized, it can cover the entire area of third surface 114*a* or it may be masked or removed from the peripheral edge portion as discussed above.

An optional flash over-coat layer 124 may be coated over the reflective layer 121. The reflective layer 121, the optional intermediate layer 123, and the base layer 122 preferably have properties similar to that described above, except that the layer of reflective material 121 need not bond well to the epoxy seal, since it is removed in the peripheral portion where the seal member 116 is placed. Because the interaction with the epoxy seal is removed, silver metal itself, in addition to the alloys of silver described above, will function as the reflective layer. Alternatively, an adhesion promoter can be added to the sealing material which enhances adhesion to silver or silver alloys and the reflective layer can be deposited over most of the third surface including substantial portions under the seal area. Such adhesion promoters are disclosed in U.S. Pat. No. 6,157,480, entitled "IMPROVED SEAL FOR ELECTROCHROMIC DEVICES," the disclosure of which is incorporated herein by reference.

Referring again to FIG. 3, chamber 125, defined by transparent conductor 128 (disposed on front element rear surface 112*b*), reflector/electrode 120 (disposed on rear element front surface 114*a*), and an inner circumferential wall 132 of sealing member 116, contains an electrochromic medium 126. Electrochromic medium 126 is capable of attenuating light traveling therethrough and has at least one solution-phase electrochromic material in intimate contact with reflector/electrode 120 and at least one additional electroactive material that may be solution-phase, surface-confined, or one that plates out onto a surface. However, the presently preferred media are solution-phase redox electrochromics, such as those disclosed in above-referenced U.S. Pat. Nos. 4,902,108, 5,128,799, 5,278,693, 5,280,380, 5,282,077, 5,294,376, and 5,336,448. U.S. Pat. No. 6,020,987, entitled "AN IMPROVED ELECTROCHROMIC MEDIUM CAPABLE OF PRODUCING A PRE-SELECTED COLOR," discloses electrochromic media that are perceived to be gray throughout their normal range of operation. The entire disclosure of this patent is hereby incorporated herein by reference. If a solution-phase electrochromic medium is utilized, it may be inserted into chamber 125 through a sealable fill port 142 through well-known techniques, such as vacuum backfilling and the like.

A resistive heater 138, disposed on the fourth glass surface 114*b*, may optionally be a layer of ITO, fluorine-doped tin oxide, or may be other heater layers or structures well known in the art. Electrically conductive spring clips 134*a* and 134*b* are placed on the coated glass sheets (112 and 114) to make electrical contact with the exposed areas of the transparent conductive coating 128 (clip 134*b*) and the third surface reflector/electrode 120 (clip 134*a*). Suitable electrical conductors (not shown) may be soldered or otherwise connected to the spring clips (134*a* and 134*b*) so that a desired voltage may be applied to the device from a suitable power source.

An electrical circuit 150, such as those taught in the above-referenced Canadian Patent No. 1,300945 and U.S. Pat. Nos. 5,204,778, 5,434,407, and 5,451,822, is connected to and allows control of the potential to be applied across reflector/electrode 120 and transparent electrode 128, such that electrochromic medium 126 will darken and thereby attenuate various amounts of light traveling therethrough and thus vary the reflectance of the mirror containing electrochromic medium 126.

Figure 5A:
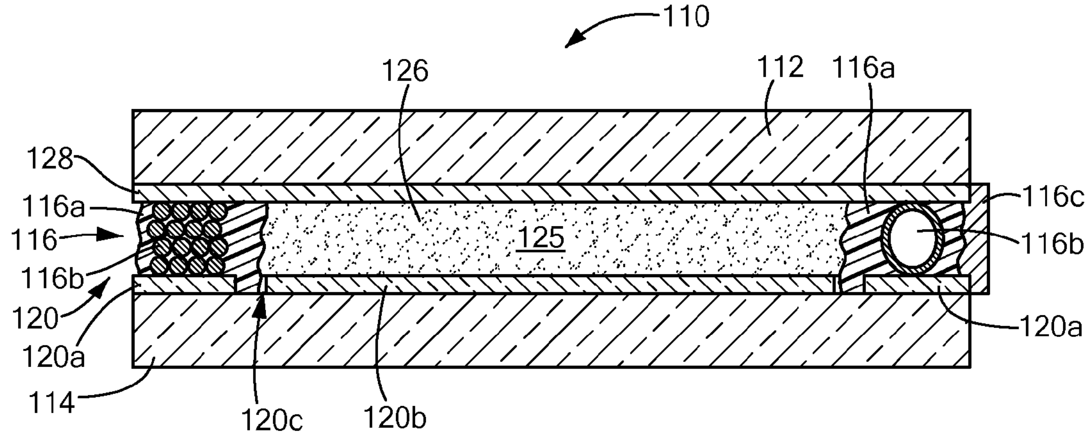
FIG. 5a is an enlarged cross-sectional view of an electrochromic mirror having an improved arrangement for applying a drive potential to the transparent conductor on the second surface of the mirror.
Figure 5B:
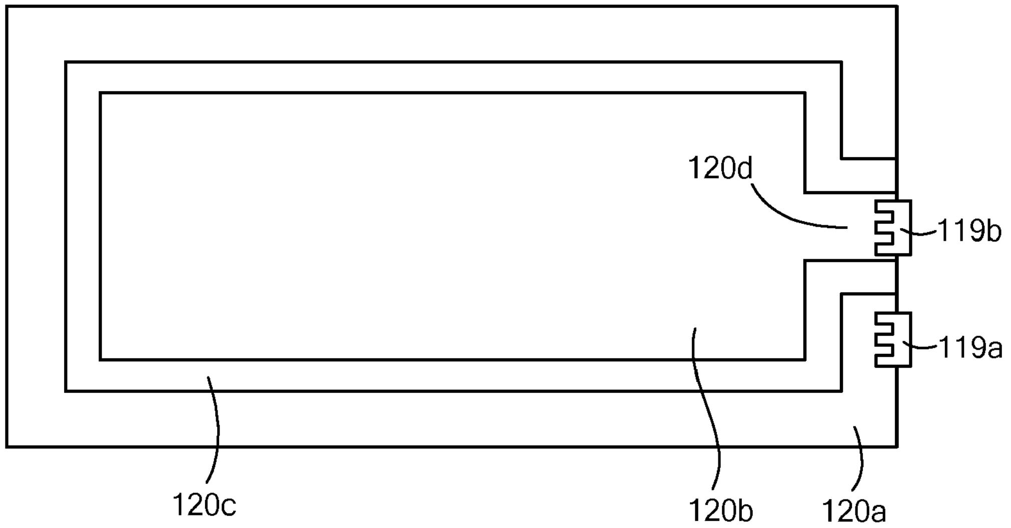

As stated above, the low resistance of reflector/electrode 120 allows greater design flexibility by allowing the electrical contact for the third surface reflector/electrode to be small while maintaining adequate coloring speed. This flexibility extends to improving the interconnection techniques to the layer of transparent conductive material 128 on the second surface 112*b*. Referring now to FIGS. 5*a* and 5*b*, an improved mechanism for applying a drive potential to the layer of transparent conductive material 128 is shown. Electrical connection between the power supply and the layer of transparent conductive material 128 is made by connecting the buss bars (or clips 119*a*) to the area of reflector/electrode 120*a*, such that the drive potential travels through the area of reflector/electrode 120*a* and conductive particles 116*b* in sealing member 116 before reaching the transparent conductor 128. The reflector/electrode must not be present in area 120*c*, so that there is no chance of current flow from reflector/electrode area 120*a* to 120*b*. This configuration is advantageous in that it allows connection to the transparent conductive material 128 nearly all the way around the circumference, and therefore improves the speed of dimming and clearing of the electrochromic media 126.

In such a configuration, sealing member 116 comprises a typical sealing material, e.g., epoxy 116*a*, with conductive particles 116*b* contained therein. The conductive particles may be small, such as, for example, gold, silver, copper, etc., coated plastic with a diameter ranging from about 5 microns to about 80 microns, in which case there must be a sufficient number of particles to ensure sufficient conductivity between the reflector/electrode area 120*a* and the transparent conductive material 128. Alternatively, the conductive particles may be large enough to act as spacers, such as, for example, gold, silver, copper, etc., coated glass or plastic beads. The reflector/electrode 120 is separated into two distinct reflector/electrode areas (120*a* and 120*b*, separated by an area 120*c* devoid of reflector/electrode). There are many methods of removing the reflector/electrode 120 from area 120*c*, such as, for example, chemical etching, laser ablating, physical removal by scraping, etc. Deposition in area 120*c* can also be avoided by use of a mask during deposition of reflector/electrode. Sealing member 116 with particles 116*b* contacts area 120*a* such that there is a conductive path between reflector/electrode area 120*a* and the layer of transparent conductive material 128. Thus, electrical connection to the reflector/electrode area 120*b* that imparts a potential to the electrochromic medium is connected through clips 119*b* to the electronic circuitry at reflector/electrode area 120*d* (FIG. 5*b*). No conductive particles 116*b* can be placed in this reflector/electrode area 120*b* because of the possibility of an electrical short between reflector/electrode area 120*b* and the layer of transparent conductive material 128. If such an electrical short occurred, the electrochromic device would not operate properly. Additionally, no conductive seal 116*b* should be present in area 120*b*.

A variety of methods can be used to ensure that no conductive particles 116*b* enter into this reflector/electrode area 120*b*, such as, for example, disposing a nonconductive material into the area 120*c* of reflector/electrode devoid of conductive material. A dual dispenser could be used to deposit the seal 116 with conductive particles 116*b* onto reflector/electrode area 120*a* and simultaneously deposit the nonconductive material into reflector/electrode area 120*c*. Another method would be to cure a nonconductive seal in area 120*c* and then dispose a conductive material 116*c* into the edge gap to electrically interconnect reflector/electrode area 120*a* with transparent conductive layer 128. A general method of ensuring that no conductive particles reach reflector/electrode area 120*b* is to make sure seal 116 has proper flow characteristics, such that the conductive portion 116*b* tends to stay behind as the sealant is squeezed out during assembly, and only the non-conductive portion of 116 flows into area 120*b*. In an alternative embodiment, spacer member 116 need not contain conductive particles and a conductive member or material 116*c* may be placed on or in the outer edge of member 116 to interconnect transparent conductive material 128 to reflector/electrode area 120*a*.

Figure 6:
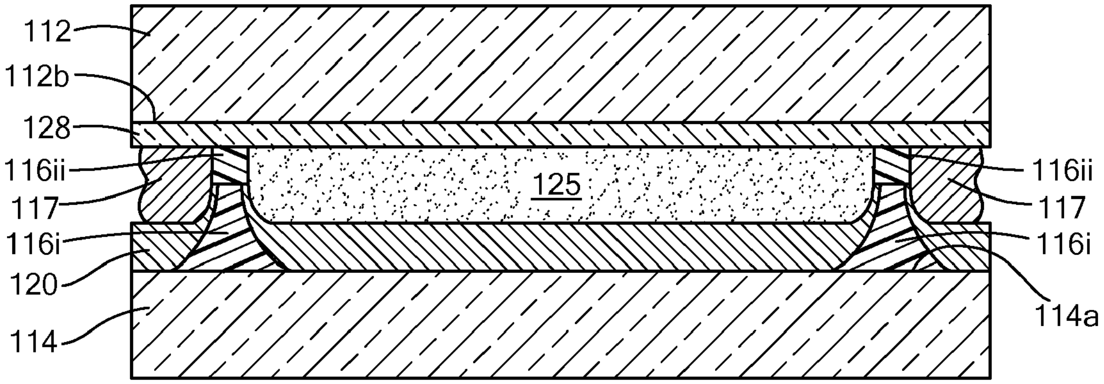
FIG. 6 is an enlarged cross-sectional view of an electrochromic mirror using a cured and machine-milled epoxy seal to hold the transparent elements in a spaced-apart relationship.

Yet another embodiment of an improved electrical interconnection technique is illustrated in FIG. 6, where a first portion of seal member 116 is applied directly onto the third surface 114*a* and cured prior to the application of reflector/electrode 120. After the reflector/electrode 120 is deposited onto the third surface 114*a* over the first portion of seal member 116, a portion of the cured seal member 116 is machined off to leave 116*i* as shown with a predetermined thickness (which will vary depending on the desired cell spacing between the second surface 112*b* and the third surface 114*a*). The cell spacing ranges from about 20 microns to about 1500 microns, and preferably ranges from about 90 microns to about 750 microns. By curing the first portion of seal member and machining it to a predetermined thickness (116*i*), the need for glass beads to ensure a constant cell spacing is eliminated. Glass beads are useful to provide cell spacing, however, they provide stress points where they contact reflector/electrode 120 and transparent conductor 128. By removing the glass beads, these stress points are also removed. During the machining, the reflector/electrode 120 that is coated on first portion of seal member 116 is removed to leave an area devoid of reflector/electrode 120. A second portion of seal member 116*ii* is then deposited onto the machined area of the first portion of seal member 116*i* or on the coatings on second surface 112*b* in the area corresponding to 116*i*, and seal member 116*ii* is cured after assembly in a conventional manner. Finally, an outer conductive seal member 117 may optionally be deposited on the outer peripheral portion of seal member 116 to make electrical contact between the outer edge of reflector/electrode 120 and the outer peripheral edge of the layer of transparent conductive material 128. This configuration is advantageous in that it allows connection to the transparent conductive material 128 nearly all the way around the circumference, and therefore improves the speed of dimming and clearing of the electrochromic media 126.

Referring again to FIG. 2, rearview mirrors embodying the present invention preferably include a bezel 144, which extends around the entire periphery of each individual assembly 110, 111*a*, and/or 111*b*. The bezel 144 conceals and protects the spring clips 134*a* and 134*b* of FIG. 3 (or 116*a* and 116*b* of FIG. 5*a*; 116*i*, 116*ii*, and 117 of FIG. 6), and the peripheral edge portions of the sealing member and both the front and rear glass elements (112 and 114, respectively). A wide variety of bezel designs are well known in the art, such as, for example, the bezel taught and claimed in above-referenced U.S. Pat. No. 5,448,397. There are also a wide variety of housings well known in the art for attaching the mirror assembly 110 to the inside front windshield of an automobile, or for attaching the mirror assemblies 111*a* and 111*b* to the outside of an automobile. A preferred mounting bracket is disclosed in above-referenced U.S. Pat. No. 5,337,948.

The electrical circuit preferably incorporates an ambient light sensor (not shown) and a glare light sensor 160, the glare light sensor being positioned either behind the mirror glass and looking through a section of the mirror with the reflective material completely or partially removed, or the glare light sensor can be positioned outside the reflective surfaces, e.g., in the bezel 144 or as described below, the sensor can be positioned behind a uniformly deposited transflective coating. Additionally, an area or areas of the electrode and reflector, such as 146, may be completely removed or partially removed as described below to permit a vacuum fluorescent display, such as a compass, clock, or other indicia, to show through to the driver of the vehicle or as also described below, this light emitting display assembly can be shown through a uniformly deposited transflective coating. The present invention is also applicable to a mirror which uses only one video chip light sensor to measure both glare and ambient light and which is further capable of determining the direction of glare. An automatic mirror on the inside of a vehicle, constructed according to this invention, can also control one or both outside mirrors as slaves in an automatic mirror system.

The following illustrative examples are not intended to limit the scope of the present invention but to illustrate its application and use:

EXAMPLE 1

Electrochromic mirror devices incorporating a high reflectivity third surface reflector/electrode were prepared by sequentially depositing approximately 700 Å of chromium and approximately 500 Å of silver on the surface of 2.3-mm thick sheets of flat soda lime float glass cut to an automotive mirror element shape. A second set of high reflectivity third surface reflector/electrodes were also prepared by sequentially depositing 700 Å of chromium and approximately 500 Å of a silver alloy containing 3 percent by weight palladium on the glass element shapes. The deposition was accomplished by passing the said glass element shapes past separate metal targets in a magnetron sputtering system with a base pressure of $3\times10^{-6}$ torr and an argon pressure of $3\times10^{-3}$ torr.

The chromium/silver and chromium/silver 3 percent palladium alloy coated glass automotive mirror shapes were used as the rear planar elements of an electrochromic mirror device. The front element was a sheet of TEC 15 transparent conductor coated glass from LOF cut similar in shape and size to the rear glass element. The front and rear elements were bonded together by an epoxy perimeter seal, with the conductive planar surfaces facing each other and parallel to each other with an offset. The spacing between the electrodes was about 137 microns. The devices were vacuum filled through a fill port left in the perimeter seal with an electrochromic solution made up of:

0.028 molar 5,10-dihydro-5-10-dimethylphenazine 0.034 molar 1,1'-di(3-phenyl(n-propane))-4,4'-bipyridinium di(tetrafluoroborate)

0.030 molar 2-(2'-hydroxy-5'-methylphenyl)-benzotriazole in a solution of 3 weight percent Elvacite™ 2051 polymethylmethacrylate resin dissolved in propylene carbonate.

The fill port was plugged with an UV cure adhesive, which was cured by exposure to UV light.

The devices were subjected to accelerated durability tests until the seal integrity of the device was breached or the lamination of the reflector/electrode layers or the transparent electrode layers were substantially degraded or dilapidated, at which time the device is said to fail. The first test performed was steam autoclave testing in which the devices were sealed in a water-containing vessel and subjected to 120° C. at a pressure of 15 pounds per square inch (psi). The second test performed was copper-accelerated acetic acid-salt spray (CASS) as described in ASTM B 368-85.

When the electrochromic devices were observed after one day in testing, all of the devices failed to withstand the CASS testing, and all of the devices failed to withstand the steam autoclave testing.

EXAMPLE 2

Other than as specifically mentioned, the devices in this example were constructed in accordance with the conditions and teachings in Example 1. Multilayer combination reflector/electrodes were prepared by sequentially depositing approximately 700 Å chromium, approximately 100 Å rhodium, and approximately 500 Å of silver on the surface of the glass element shapes. A second set of multilayer combination reflector/electrodes were also prepared by sequentially depositing approximately 700 Å of chromium, approximately 100 Å rhodium, and approximately 500 Å of a silver alloy containing 3 percent by weight palladium on the surface of said glass element shapes. The electrochromic devices were constructed and tested in accordance with Example 1.

The device incorporating the sequential multilayer combination reflector electrode of chromium, rhodium, and silver withstood steam autoclave testing two times longer and CASS testing 10 times longer than the device in Example 1 before failure occurred. The device incorporating the sequential multilayer combination reflector electrode of chromium, rhodium, and silver 3 percent palladium alloy withstood steam autoclave testing three times longer and CASS testing 10 times longer than devices in Example 1 before failure occurred.

EXAMPLE 3

Other than as specifically mentioned, the devices in this example were constructed in accordance with the conditions and teachings in Example 1. Multilayer combination reflector/electrodes were prepared by sequentially depositing approximately 700 Å chromium, approximately 500 Å molybdenum and approximately 500 Å of a silver alloy containing 3 percent by weight palladium on the surface of said glass element shapes. The electrochromic devices were constructed and tested in accordance with Example 1.

The device incorporating the sequential multilayer combination reflector electrode of chromium, molybdenum, and silver 3 percent palladium alloy withstood CASS testing 10 times longer than devices in Example 1 before failure occurred.

EXAMPLE 4

Other than as specifically mentioned, the devices in this example were constructed in accordance with the conditions and teachings in Example 1. Multilayer combination reflector/electrodes were prepared by sequentially depositing approximately 700 Å chromium, approximately 500 Å of a silver alloy containing 3 percent by weight palladium, and approximately 100 Å of molybdenum on the surface of said glass element shapes. A second set of multilayer combination reflector/electrodes were also prepared by sequentially depositing approximately 700 Å of chromium, approximately 500 Å molybdenum, approximately 500 Å of a silver alloy containing 3 percent by weight palladium, and approximately 100 Å of molybdenum on the surface of said glass element shapes. The electrochromic devices were constructed and tested in accordance with Example 1.

The device incorporating the sequential multilayer combination reflector electrode of chromium, molybdenum, silver 3 percent palladium, and molybdenum withstood steam autoclave testing 25 percent longer and CASS testing twelve times longer than the sequential multilayer combination reflector electrode device of chromium, silver 3 percent palladium, molybdenum before failure occurred. Also, the device incorporating the sequential multilayer combination reflector electrode of chromium, molybdenum, silver 3 percent palladium, molybdenum withstood CASS testing three times longer than the device constructed in Example 3. Finally, the sequential multilayer combination reflector electrode device of chromium, silver 3 percent palladium, molybdenum withstood two times longer in CASS testing and twenty times longer in steam autoclave testing than the sequential multilayer combination reflector electrode device of chromium, silver 3 percent palladium of Example 1.

EXAMPLE 5

Other than as specifically mentioned, the devices in this example were constructed in accordance with the conditions and teachings in Example 1. Multilayer combination reflector/electrodes were prepared by sequentially depositing approximately 700 Å chromium, approximately 100 Å rhodium and approximately 500 Å of silver on the surface of said glass element shapes. A second set of multilayer combination reflector/electrodes were also prepared by sequentially depositing approximately 700 Å of chromium, approximately 100 Å rhodium, and approximately 500 Å of a silver alloy containing 3 percent by weight palladium on the surface of said glass element shapes. A third set of multilayer combination reflector/electrodes was also prepared by sequentially depositing approximately 700 Å of chromium, approximately 100 Å rhodium, and approximately 500 Å of a silver alloy containing 6 percent by weight platinum on the surface of said glass element shapes. A fourth set of multilayer combination reflector/electrodes was also prepared by sequentially depositing approximately 700 Å of chromium, approximately 100 Å rhodium, and approximately 500 Å of a silver alloy containing 6 percent by weight gold on the surface of said glass element shapes. A fifth set of multilayer combination reflector/electrodes was also prepared by sequentially depositing approximately 700 Å of chromium, approximately 100 Å rhodium, and approximately 500 Å of a silver alloy containing 25 percent by weight gold on the surface of said glass element shapes. The electrochromic devices were constructed in accordance with Example 1.

Conductive clips were connected to the offset portions of the front and rear elements of the devices. A power source was connected to the clips and 1.2 volts was applied to the devices continuously for approximately 250 hours at approximately 20° C., with the connection arranged such that the reflector/electrode was the cathode. The device incorporating the sequential multilayer combination reflector electrode of chromium, rhodium, and silver exhibited a yellowing effect within the electrochromic medium. This yellowing phenomenon was not apparent in any of the silver alloy devices.

FIGS. 7A-7G illustrate various alternative constructions for an electrochromic rearview mirror of the present invention, particularly when a light source 170, such as an information display (i.e., compass/temperature display) or signal light, is positioned within the mirror assembly behind the electrochromic mirror. According to the first construction shown in FIG. 7A, the electrochromic rearview mirror was constructed similar to those described above, with the exception that second electrode 120 includes a window 146 in the layer 121 of reflective material in a region of second electrode 120 that is in front of light source 170. Electrode 120 further includes a coating 172 of electrically conductive material that is applied over substantially all of the front surface 114*a* of rear element 114. Coating 172 is preferably at least partially transmissive so as to enable light emitted from light source 170 to be transmitted through the electrochromic mirror via window 146. By providing electrically conductive coating 172 throughout the entire area of window 146, the electrochromic media 125 in the region of window 146 will respond to the voltage applied to the clips as though window 146 was not even present. Coating 172 may be a single layer of a transparent conductive material. Such a single layer may be made of the same materials as that of first electrode 128 (i.e., indium tin oxide, etc.).

Transparent electrodes made of ITO or other transparent conductors have been optimized at thicknesses to maximize the transmission of visible light (typically centered around 550 nm). These transmission optimized thicknesses are either very thin layers (<300 Å) or layers optimized at what is commonly called ½ wave, full wave, 1½ wave, etc. thickness. For ITO, the ½ wave thickness is about 1400 Å and the full wave thickness is around 2800 Å. Surprisingly, these thicknesses are not optimum for transflective (i.e., partially transmissive, partially reflective) electrodes with a single underlayer of a transparent conductor under a metal reflector such as silver or silver alloys. The optimum thicknesses to achieve relative color neutrality of reflected light are centered around ¼ wave, ¾ wave, ¼ wave, etc. optical thicknesses for light of 500 nm wavelength. In other words the optimal optical thickness for such a layer when underlying a metal reflector such as silver or silver alloy is $m\lambda/4$, where $\lambda$ is the wavelength of light at which the layer is optimized (e.g., 500 nm) and m is an odd integer. These optimum thicknesses are ¼ wave different from the transmission optima for the same wavelength. Such a single layer may have a thickness of between 100 Å and 3500 Å and more preferably between 200 Å and 250 Å, and a sheet resistivity of between about 3Ω/Y and 300Ω/Y and preferably less than about 100Ω/Y.

Figure 7A:
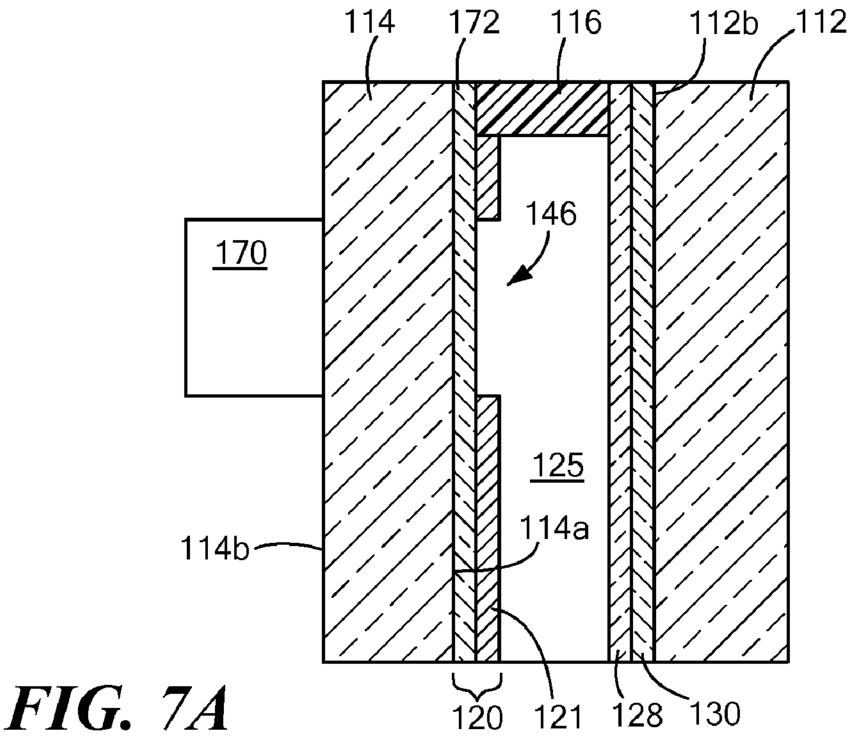
FIGS. 7A-7G are partial cross-sectional views of alternative constructions of the electrochromic mirror according to the present invention as taken along line 7-7' shown in FIG. 2.

Layer 121 may be made of any of the reflective materials described above and is preferably made of silver or a silver alloy. The thickness of reflective layer 121 in the arrangement shown in FIG. 7A is preferably between 30 Å and 800 Å. The thickness of layer 121 will depend on the desired reflectance and transmittance properties. For an inside rearview mirror, layer 121 preferably has a reflectance of at least 60 percent and a transmittance through window 146 of 10 to 50 percent. For an outside mirror, the reflectance is preferably above 35 percent and the transmittance is preferably approximately 10 to 50 percent and more preferably at least 20 percent for those regions that are in front of one of the lights of a signal light (as described in more detail below).

Window 146 in layer 121 may be formed by masking window area 146 during the application of the reflective material. At this same time, the peripheral region of the third surface may also be masked so as to prevent materials such as silver or silver alloy (when used as the reflective material) from being deposited in areas to which seal 116 must adhere, so as to create a stronger bond between seal 116 and coating 172. Additionally, an area in front of sensor 160 (FIG. 2) may also be masked. Alternatively, an adhesion promoting material can be added to the seal to enhance adhesion between the seal and the silver/silver alloy layer as described in the above-referenced U.S. Pat. No. 6,157,480.

Figure 7B:
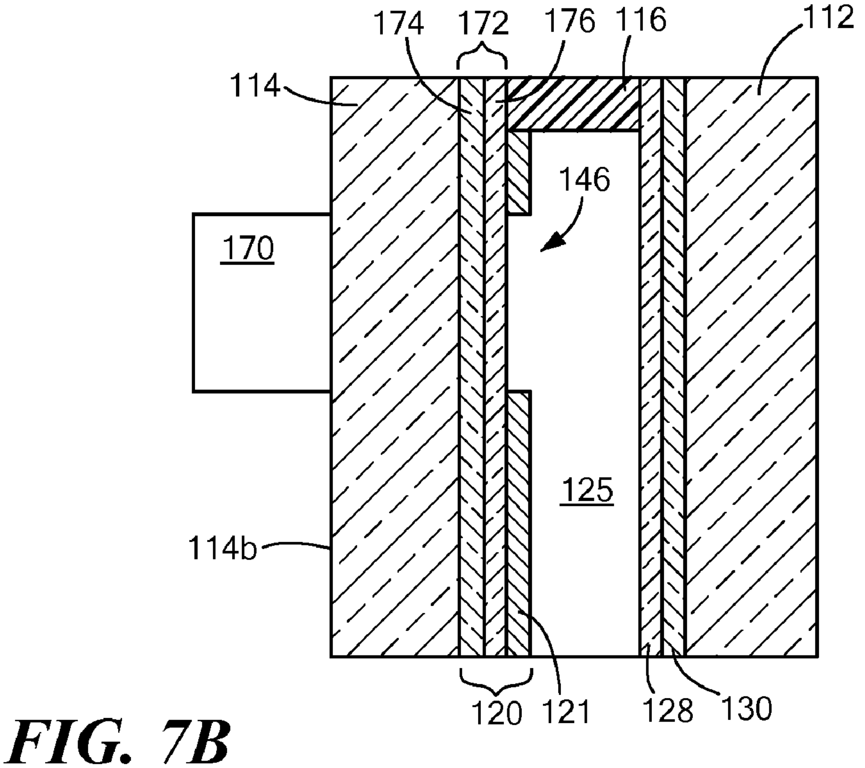

An alternative construction to that shown in FIG. 7A is shown in FIG. 7B, where electrically conductive coating 172 is formed of a plurality of layers 174 and 176. For example, coating 172 may include a first base layer 174 applied directly to front surface 114*a* of rear element 114, and an intermediate second layer 176 disposed on first layer 174. First layer 174 and second layer 176 are preferably made of materials that have relatively low sheet resistivity and that are at least partially transmissive. The materials forming layers 174 and 176 may also be partially reflective. If the light emitting display behind the partially transmissive window area 146 must be viewed often in bright ambient conditions or direct sunlight, it may be desirable to keep the reflectivity of the window area to a minimum by using metals with low reflectivity or other dark, black or transparent coatings that are electrically conductive.

The material forming layer 174 should exhibit adequate bonding characteristics to glass or other materials of which rear element 114 may be formed, while the material forming layer 176 should exhibit adequate properties so as to bond to the material of layer 174 and provide a good bond between the applied layer 121 and seal 116. Thus, the material used for layer 174 is preferably a material selected from the group consisting essentially of: chromium, chromium-molybdenum-nickel alloys, nickel-iron-chromium alloys, silicon, tantalum, stainless steel, and titanium. In the most preferred embodiment, layer 174 is made of chromium. The material used to form second layer 176 is preferably a material selected from the group consisting essentially of, but not limited to: molybdenum, rhodium, nickel, tungsten, tantalum, stainless steel, gold, titanium, and alloys thereof. In the most preferred embodiment, second layer 176 is formed of nickel, rhodium, or molybdenum. If first layer 174 is formed of chromium, layer 174 preferably has a thickness of between 5 Å and 50 Å. If the layer of chromium is much thicker, it will not exhibit sufficient transmittance to allow light from a light source 170, such as a display or signal light, to be transmitted through window 146. The thickness of layer 176 is selected based upon the material used so as to allow between 10 to 50 percent light transmittance through both of layers 174 and 176. Thus, for a second layer 176 formed of either rhodium, nickel, or molybdenum, layer 176 is preferably between 50 Å and 150 Å. While the thicknesses of layers 174 and 176 are preferably selected to be thin enough to provide adequate transmittance, they must also be thick enough to provide for adequate electrical conductivity so as to sufficiently clear or darken electrochromic media 125 in the region of window 146. The coating 172 should thus have a sheet resistivity of less than 100Ω/Y and preferably less than 50Ω/Y to 60Ω/Y.

The arrangement shown in FIG. 7B provides several advantages over the construction shown and described with respect to FIG. 7A. Specifically, the metals used in forming coating 172 contribute to the total reflectance of reflector electrode 120. Accordingly, the layer of the reflective material 121 need not be made as thick. If, for example, silver or a silver alloy is used to form layer 121, the layer of thickness is between 50 Å and 150 Å, thereby eliminating some of the material costs in providing the reflective layer. Further, the use of reflective metals in forming coating 172 provides for a degree of reflectance within window 146, thereby providing a much more ascetically pleasing appearance than if window 146 were devoid of any reflective material whatsoever. Ideally, coating 172 provides between 30 and 40 percent reflectivity in window 146. If the reflectance in window 146 is too high, bright light will tend to wash out the display in the sense that it eliminates the contrast between the light of the display and light reflecting outward from coating 172.

Another benefit of utilizing metals to form conductive coating 172 is that such metals are much easier and less expensive to process than metal oxides, such as indium tin oxide. Such metal oxides require application in oxygen-rich chambers at very high temperatures, whereas metal layers may be deposited without special oxygen chambers and at much lower temperatures. Thus, the process for applying multiple metal layers consumes much less energy and is much less expensive than the processes for forming metal oxide layers.

Figure 7C:
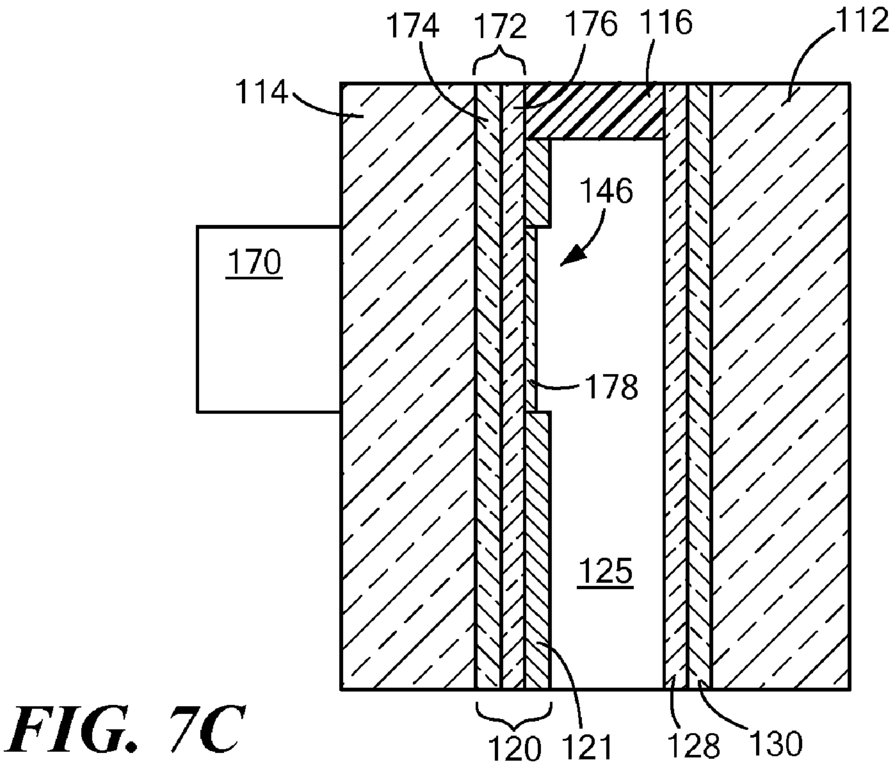

A third alternate arrangement for the electrochromic mirror of the present invention is shown in FIG. 7C. The construction shown in FIG. 7C is essentially the same as that shown in FIG. 7B except that a thin silver or silver alloy layer 178 is formed on conductive coating 172 within window 146. By providing only a thin layer 178 of reflective material in window 146, adequate transmittance may still be provided through window 146 while increasing the reflectivity and electrical conductivity in that area. Layer 178 may have a thickness of between 40 Å and 150 Å, whereas the layer of reflective material 121 in the other areas may have a thickness in the order of between 200 Å and 1000 Å. The thin layer 178 of reflective material may be formed by initially masking the area of window 178 while applying a portion of reflective layer 121 and then removing the mask during deposition of the remainder of layer 121. Conversely, a thin layer of reflective material may first be deposited and then a mask may be applied over window 146 while the remainder of reflective layer 121 is deposited. As will be apparent to those skilled in the art, thin layer 178 may also be formed without masking by depositing reflective layer 121 to its full thickness and subsequently removing a portion of layer 121 in the region of window 146.

Figure 7D:
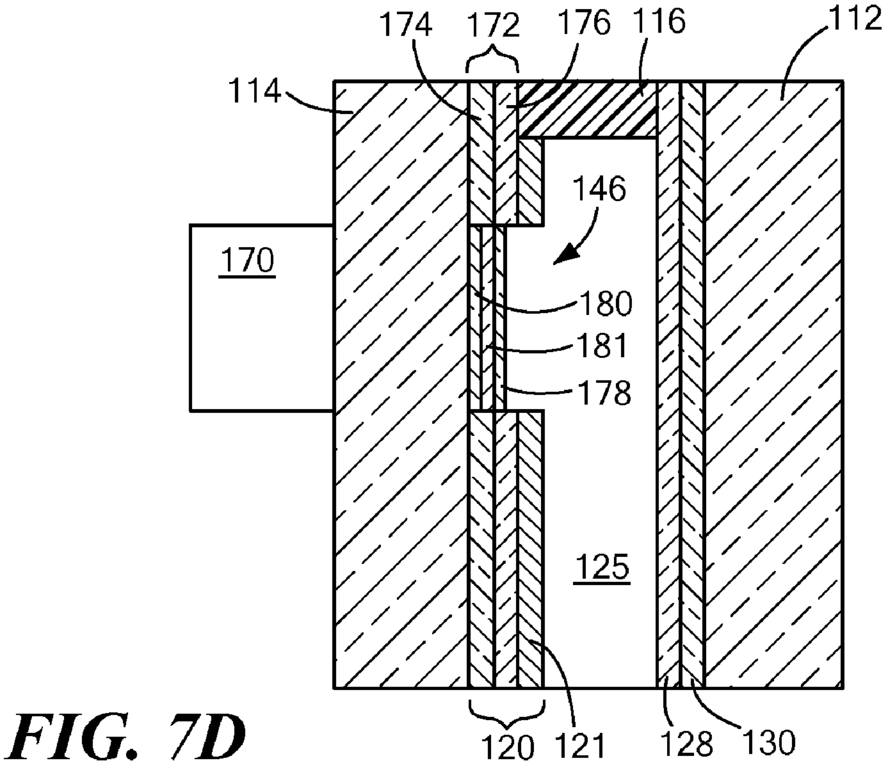

A modification of the configuration shown in FIG. 7C is illustrated in FIG. 7D. As will be apparent from a comparison of the drawings, the construction of FIG. 7D only differs from that shown in FIG. 7C in that layers 174 and 176 constituting conductive coating 172 are made thinner (designated as thin layers 180 and 181) in the region of reflector/electrode 120 that is in front of light source 170. As such, thin layer 180 may have a thickness of between 5 Å and 50 Å, whereas layer 174 may have thicknesses anywhere between 100 Å and 1000 Å. Similarly, thin layer 181 may be made of the same material as layer 176 but would have a thickness of between 50 Å and 150 Å, while layer 176 may have thicknesses on the order of 100 Å to 1000 Å. Thus, with the construction shown in FIG. 7D, the electrical conductivity, reflectivity, and transmittance within region 146 may be optimized within that region while enabling the reflectance and electrical conductivity in the other regions to be optimized without concern as to the transmittance in those areas.

Figure 7E:
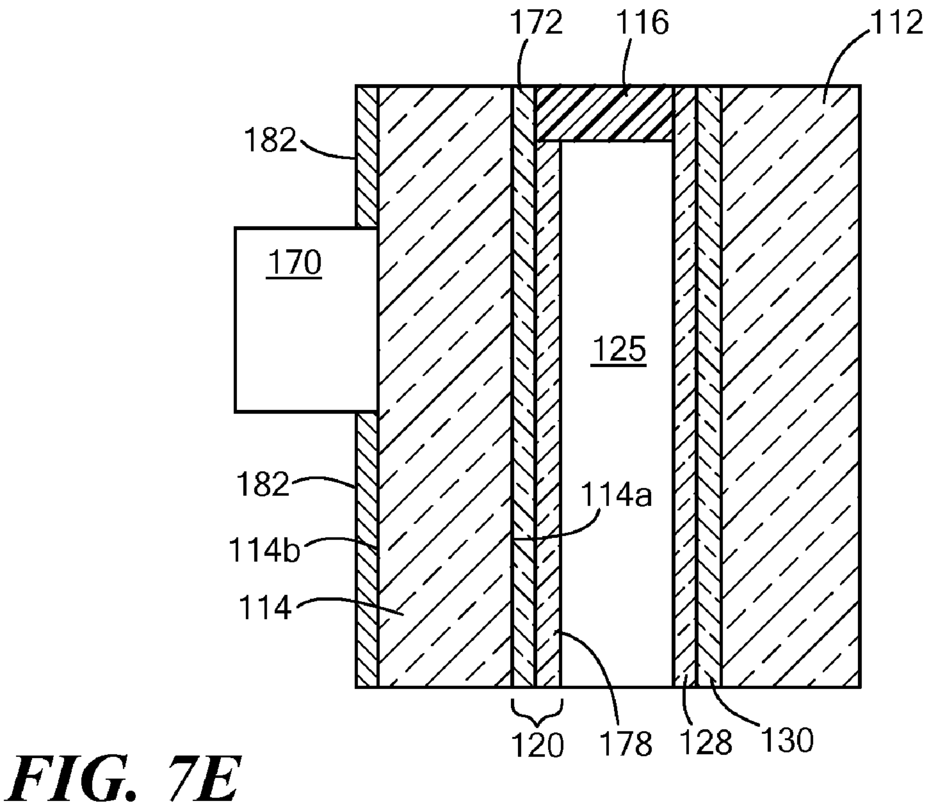

FIG. 7E shows yet another alternative construction for second electrode 120. In the construction shown in FIG. 7E, second electrode 120 includes an electrically conductive coating 172 and a reflective coating 178 formed over the entire third surface 114*a* of the mirror. By making reflective coating 178 uniformly partially transmissive, a light source, such as a display or signal light, may be mounted in any location behind the mirror and is not limited to positioning behind any particular window formed in second electrode 120. Again, for a rearview mirror, second electrode 120 preferably has a reflectance of at least 35 percent for an outside mirror and at least 60 percent for an inside mirror and a transmittance of preferably at least 10 percent. Conductive coating 172 is preferably a single layer of ITO or other transparent conductive materials, but may also consist of one or more layers of the partially reflective/partially transmissive electrically conductive materials discussed above.

Reflective coating 178 may be constructed using a single, relatively thin, layer of a reflective electrically conductive material such as silver, silver alloy, or the other reflective materials discussed above. If the reflective material is silver or a silver alloy, the thickness of such a thin layer should be limited to about 500 Å or less, and a transparent conductive material, such as ITO or the like, should be utilized as electrically conductive layer 172, such that second electrode 120 may have sufficient transmittance to allow a display or signal light to be viewed from behind the mirror. On the other hand, the thickness of the single layer of reflective material should be about 10 Å or more depending upon the material used to ensure sufficient reflectivity.

To illustrate the features and advantages of an electrochromic mirror constructed in accordance with the embodiment shown in FIG. 7E, ten examples are provided below. In these examples, references are made to the spectral properties of models of electrochromic mirrors constructed in accordance with the parameters specified in each example. In discussing colors, it is useful to refer to the Commission Internationale de I'Eclairage's (CIE) 1976 CIELAB Chromaticity Diagram (commonly referred to as the L*a*b* chart). The technology of color is relatively complex, but a fairly comprehensive discussion is given by F. W. Billmeyer and M. Saltzman in *Principles of Color Technology,* 2nd Edition, J. Wiley and Sons Inc. (1981), and the present disclosure, as it relates to color technology and terminology, generally follows that discussion. On the L*a*b* chart, L* defines lightness, a* denotes the red/green value, and b* denotes the yellow/blue value. Each of the electrochromic media has an absorption spectra at each particular voltage that may be converted to a three number designation, their L*a*b* values. To calculate a set of color coordinates, such as L*a*b* values, from the spectral transmission or reflectance, two additional items are required. One is the spectral power distribution of the source or illuminant. The present disclosure uses CIE Standard Illuminant A to simulate light from automobile headlamps and uses CIE Standard Illuminant $D_{65}$ to simulate daylight. The second item needed is the spectral response of the observer. The present disclosure uses the 2 degree CIE standard observer. The illuminant/observer combination generally used for mirrors is then represented as A/2 degree and the combination generally used for windows is represented as $D_{65}/2$ degree. Many of the examples below refer to a value Y from the 1931 CIE Standard since it corresponds more closely to the spectral reflectance than L*. The value C*, which is also described below, is equal to the square root of $(a^*)^2+(b^*)^2$, and hence, provides a measure for quantifying color neutrality.

It should be noted that the optical constants of materials vary somewhat with deposition method and conditions employed. These differences can have a substantial effect on the actual optical values and optimum thicknesses used to attain a value for a given coating stock.

According to a first example, an electrochromic mirror was modeled having a back plate 114 (FIG. 7E) of glass, a layer 172 of ITO of approximately 2000 Å, a layer 178 of an alloy of silver containing 6 percent gold (hereinafter referred to as 6Au94Ag) of approximately 350 Å, an electrochromic fluid/gel layer 125 having a thickness of approximately 140 microns, a layer 128 of approximately 1400 Å of ITO, and a glass plate 112 of 2.1 mm. Using D65 illuminant at 20 degree angle of incidence, the model outputs were Y=70.7, a*=+1, and b*=+9.5. This model also indicated a spectrally dependent transmittance that was 15 percent over the blue-green region decreasing in the red color region of the spectrum to approximately 17 percent in the blue-green region of the spectrum. Elements were constructed using the values and the model as target parameters for thickness, and the actual color, and reflection values corresponded closely to those models with transmission values of approximately 15 percent in the blue and green region. In this example, 1400 Å ITO (½ wave) would produce a far more yellow element (b* of approximately 18).

Typically, thin silver or silver alloy layers are higher in blue-green transmission and lower in blue-green light reflection which imparts a yellow hue to the reflected image. The 2000 Å ITO underlayer of approximately ¾ wave in thickness supplements the reflection of blue-green light which results in a more neutral hue in reflection. Other odd quarter wave multiples (i.e., ¼, 5/4, 7/4, etc.) are also effective in reducing reflected color hue. It should be noted that other transparent coatings, such as (F)SnO or (AL)ZnO, or a combination of dielectric, semi-conductive, or conductive coatings, can be used to supplement blue-green reflection and produce a more neutral reflected hue in the same manner.

According to a second example of the embodiment illustrated in FIG. 7E, an electrochromic mirror was modeled having a back plate 114 of glass, layer 172 including a sublayer of titanium dioxide of approximately 441 Å and a sublayer of ITO of 200 Å, a layer 178 of 6Au94Ag of approximately 337 Å, an electrochromic fluid/gel 125 having a thickness of approximately 140 microns, a layer 128 of approximately 1400 Å of ITO, and a glass plate 112 of 2.1 mm. In air, the model of the conductive thin film 120 on glass 114 for this example, using D65 illuminant at 20 degree angle of incidence, exhibited values of approximately Y=82.3, a*=0.3, and b*=4.11. This model also indicated a relatively broad and uniform transmittance of 10-15 percent across most of the visible spectrum, making it an advantageous design for an interior rearview mirror with a multi-colored display or a white light display or illuminator. When this back plate system 114, 120 is incorporated into an electrochromic mirror, the predicted overall reflectance decreases and the transmittance increases.

According to a third example of an electrochromic mirror constructed as shown in FIG. 7E, an electrochromic mirror was modeled having a back plate 114 of glass, a layer 172 including a sublayer of titanium dioxide of approximately 407 Å and a sublayer of ITO of 200 Å, a layer 178 of 6Au94Ag of approximately 237 Å, an electrochromic fluid/gel layer 125 having a thickness of approximately 140 microns, a layer 128 of approximately 1400 Å of ITO, and a glass plate 112 of 2.1 mm. In air, the model of the conductive thin film 120 on glass 114, for this example, using D65 illuminant at 20 degree angle of incidence, exhibited values of approximately Y=68.9, a*=0.03, and b*=1.9. This model also indicated a relatively broad and uniform transmittance of approximately 25 to 28 percent across most of the visible spectrum, making it an advantageous design for an exterior rearview mirror with a multi-color display or a white light display or illuminator. When this back plate system 114, 120 is incorporated into an electrochromic mirror, the predicted overall reflectance decreases and the transmittance increases.

According to a fourth example of the embodiment shown in FIG. 7E, an electrochromic mirror was modeled having a back plate 114 of glass, a layer 172 including a sublayer of titanium dioxide of approximately 450 Å and a sublayer of ITO of 1600 Å, a layer 178 of 6Au94Ag of approximately 340 Å, an electrochromic fluid/gel layer 125 having a thickness of approximately 140 microns, a layer 128 of approximately 1400 Å of ITO, and a glass plate 112 of 2.1 mm. In air, the model of the conductive thin film 120 on glass 114, for this example, using D65 illuminant at 20 degree angle of incidence, exhibited values of approximately Y=80.3, a*=−3.45, and b*=5.27. This model also indicated a relative transmittance peak at about 600 nm of approximately 17 percent. When this back plate system 114, 120 is incorporated into an electrochromic mirror, the predicted overall reflectance decreases and the transmittance increases. As one compares this stack to the second example, it illustrates, in part, a principle of repeating optima in the primarily transmissive layer or layers (e.g., layer 172) of these designs as one increases their thickness or thicknesses. The optima will be determined by several factors which will include good color neutrality, reflection, and transmission.

According to a fifth example of the embodiment shown in FIG. 7E, an electrochromic mirror was modeled having a back plate 114 of glass; a layer 172 including a sublayer of titanium dioxide of approximately 450 Å, a sublayer of ITO of 800 Å, a sublayer of silica of 50 Å, and an additional sublayer of ITO of 800 Å; a layer 178 of 6Au94Ag of approximately 340 Å; an electrochromic fluid/gel layer 125 having a thickness of approximately 140 microns, a layer 128 of approximately 1400 Å of ITO; and a glass plate 112 of 2.1 mm. In air, the model of the conductive thin film 120 on glass 114, for this example, using D65 illuminant at 20 degree angle of incidence, exhibited values of approximately Y=80.63, a*=−4.31, and b*=6.44. This model also indicated a relative transmittance peak at about 600 nm of approximately 17 percent. When this back plate system is incorporated into an electrochromic mirror, the predicted overall reflectance decreases and the transmittance increases. This stack also demonstrates, in part, a principle of a flash layer incorporation in these designs. In this particular case, the 50 Å silica layer does not contribute substantially to the design when compared to the fourth example, nor does it detract from it greatly. The insertion of such layers would not, in the opinion of the inventors, circumvent any claims that might depend on the number of layers or the relative refractive indices of layer sets. Flash layers have been shown to impart substantial advantages when used over layer 178 and are discussed above. It is also believed that such flash layers could have adhesion promotion or corrosion resistance advantages when positioned between layers 172 and 178 as well as between glass 114 and layer(s) 120, especially when comprised of metal/alloys mentioned above as having such functions in thicker layers.

According to a sixth example of the embodiment shown in FIG. 7E, an electrochromic mirror was modeled having a back plate 114 of glass, a layer 172 including a sublayer of titanium dioxide of approximately 450 Å and a sublayer of ITO of 1600 Å, a layer 178 of silver of 290 Å and a flash layer of 6Au94Ag of approximately 50 Å, an electrochromic fluid/gel layer 125 having a thickness of approximately 140 microns, a layer 128 of approximately 1400 Å of ITO, and a glass plate 112 of 2.1 mm. In air, on glass 114, the model of the conductive thin film 120 for this example, using D65 illuminant at 20 degree angle of incidence, exhibited values of approximately Y=81.3, a*=−3.26, and b*=4.16. This model also indicated a relative transmittance peak at about 600 nm of about 17 percent. When this back plate system 114, 120 is incorporated into an electrochromic mirror, the predicted overall reflectance decreases and the transmittance increases. As one compares this stack to the fourth example, it illustrates, in part, the principle of using a flash layer of a silver alloy over silver. The potential advantages of such a system for layer 178, as opposed to a single alloy layer per the fourth example, include, but are not limited to, reduced cost, increased reflectivity at the same transmission or increased transmissivity at the same reflectance, decreased sheet resistance, and the possibility of using a higher percentage of alloyed material in the flash overcoat layer to maintain enhanced electrode surface properties the silver alloy exhibits over pure silver. Similar potential advantages apply to the cases of different percentage alloys or a graded percentage alloy in layer 178.

According to a seventh example of the embodiment shown in FIG. 7E, an electrochromic mirror was modeled having a back plate 114 of glass, a layer 172 of silicon of approximately 180 Å, a layer 178 of 6Au94Ag of approximately 410 Å, an electrochromic fluid/gel layer 125 having a thickness of approximately 140 microns, a layer 128 of approximately 1400 Å of ITO, a glass plate 112 of 2.1 mm. In air, on glass 114, the model of the conductive thin film 120 for this example, using D65 illuminant at 20 degree angle of incidence, exhibited values of Y=80.4, a*=0.9, and b*=−3.39. In contrast, a thin layer of 6Au94Ag on glass with similar reflectivity exhibits a yellow hue in reflection. The model also indicated a spectrally dependent transmittance that reached a peak of about 18 percent at 580 nm. When this back plate system 114, 120 is incorporated into an electrochromic mirror, the predicted overall reflectance and the transmittance increases. In this case, the values would be appropriate for an automotive interior transflective mirror. This system would be especially useful if the silicon were deposited as a semiconductive material, thereby allowing for masking of the silver alloy layer so that the silver alloy would be deposited primarily in the viewing area while still maintaining conductivity to the area to be darkened.

According to an eighth example of the embodiment shown in FIG. 7E, an electrochromic rearview mirror was modeled having a back plate 114 of glass, a layer 172 including a sublayer of silicon of approximately 111 Å and a sublayer of ITO of approximately 200 Å, a layer 178 of 6Au94Ag of approximately 340 Å, an electrochromic fluid/gel layer 125 having a thickness of approximately 140 microns, a layer 128 of approximately 1400 Å of ITO, and a glass plate 112 of 2.1 mm. In air, on glass 114, the model of the conductive thin film 120 for this example using D65 illuminant at 20 degree angle of incidence exhibited values of approximately Y=80.7, a*=0.1, and b*=−1.7. The model also indicated a spectrally dependent transmittance that reached a peak at about 18 percent at 600 nm. When this back plate system 114, 120 is incorporated into an electrochromic mirror, the predicted overall reflectance decreases and the transmittance increases. In this case, the values would be appropriate for an automotive transflective mirror. Also in this case, masking of the silver alloy layer could take place in the seal area, and the conductivity of the back electrode of the system would be maintained by the ITO layer whether or not the silicon were semi-conductive. This example is advantageous in that it utilizes thin layers, which are easier to form during high volume manufacturing.

According to a ninth example of the embodiment shown in FIG. 7E, an electrochromic mirror was modeled having a back plate 114 of glass, a layer 172 including a sublayer of silicon of approximately 77 Å and a sublayer of ITO of approximately 200 Å, a layer 178 of 6Au94Ag of approximately 181 Å, an electrochromic fluid/gel layer 125 having a thickness of approximately 140 microns, a layer 128 of approximately 1400 Å of ITO, and a glass plate 112 of 2.1 mm. In air, on glass, the model of the conductive thin film 120 for this example, using D65 illuminant at 20 degree angle of incidence, exhibited values of approximately Y=64.98, a*=1.73, and b*=−2.69. The model also indicated a spectrally dependent transmittance that reached a peak of about 35 percent at 650 nm. When this back plate system is incorporated into an electrochromic mirror, the predicted overall reflectance decreases and the transmittance increases. In this case, the values would be appropriate for an automotive exterior transflective mirror.

According to a tenth example of the embodiment shown in FIG. 7E, an electrochromic mirror was modeled having a back plate 114 of glass, a layer 172 of fluorine-doped tin oxide of approximately 1957 Å (¾ wave optima thickness), a layer 178 of 6Au94Ag of approximately 350 Å, an electrochromic fluid/gel layer 125 having a thickness of approximately 140 microns, a layer 128 of approximately 1400 Å of ITO, and a glass plate 112 of 2.1 mm. In air, on glass 114, the model of the conductive thin film 120, for this example, using D65 illuminant at 20 degree angle of incidence, exhibited outputs of approximately Y=80.38, a*=1.04, and b*=5.6. The model also indicated a spectrally dependent transmittance that overall diminished as wavelength increased in the visible range. Transmittance at 630 nm was predicted as approximately 10 percent. When this back plate system is incorporated into an electrochromic mirror, the predicted overall reflectance decreases and the transmittance increases. In this case, the values would be appropriate for an automotive interior transflective mirror.

In a mirror construction, such as that shown in FIG. 7E, the mirror preferably exhibits a reflectivity of at least 35 percent, more preferably at least 50 percent, and more preferably at least 65 percent for an outside mirror and, for an inside mirror, the mirror preferably exhibits a reflectance of at least 70 percent and more preferably at least 80 percent. To obtain such reflectance levels, the reflective second electrode 120 should have a slightly higher reflectance. The mirror preferably exhibits a transmittance of at least about 5 percent, more preferably at least about 10 percent, and most preferably at least about 15 percent. To obtain these transmittance levels, the second electrode 120 may have a slightly lower transmittance.

Because electrochromic mirrors having a b* value of greater than +15 have an objectionable yellowish hue, it is preferable that the mirror exhibits a b* value less than about 15, and more preferably less than about 10. Thus, second electrode 120 preferably exhibits similar properties.

To obtain an electrochromic mirror having relative color neutrality, the C* value of the mirror should be less than 20. Preferably, the C* value is less than 15, and more preferably is less than about 10. Second electrode 120 preferably exhibits similar C* values.

The inventors have recognized that, when a thin layer of silver or silver alloy is used in a rearview mirror such as those described above, the thin layer may impart a light yellow hue (b* greater than +15) to objects viewed in the reflection particularly when the thin layer of silver or silver alloy is made thin enough to impart sufficient transmittance of 5 percent or more. This causes the mirror to no longer appear color neutral (C* greater than 20). Conversely, transmission through the film is higher for blue light than for red light. The ten preceding examples compensate for this liability by selection of the appropriate thicknesses of various underlayer films. Another approach to minimizing the yellow hue of the reflected images is to reflect the transmitted blue light back through the mirror. Typically, in the prior art signal or display mirrors a coating of black paint is applied to the fourth surface of the mirror in all areas except for where a display is mounted (if one is employed). Such a black coating was designed to absorb any light that is transmitted through the mirror and its reflective layer(s). To minimize the yellow hue of the reflected image appearing when a thin silver/silver alloy material is used, the black coating may be replaced with a coating 182 that reflects the blue light back through the mirror rather than absorbing such blue light. Preferably, blue paint is used in place of the black paint since the blue backing reflects blue light. Alternatively, coating 182 may be white, gray, or a reflective coating such as chrome, since they too would reflect blue light back through the reflective layer(s) and the remainder of the mirror.

To demonstrate the effectiveness of blue coating 182 on the fourth surface 114*b* of a mirror, an electrochromic mirror was constructed with a thin layer of silver 178 over a 100Ω/Y ITO layer 172 as the third surface reflector/electrode 120. The white light reflectivity of the mirror was about 52 percent, and the white light transmission was about 30 percent. The mirror had a noticeably yellow hue in reflection and a blue hue in transmission. The mirror was placed on a black background and the color was measured using a SP-68 Spectrophotometer from X-Rite, Inc. of Grandville, Mich. The measured b* value was +18.72. The same mirror was then placed on a blue background and the color was again measured. With the blue background, the measured b* value fell to +7.55. The mirror thus exhibited noticeably less yellow hue in reflection on the blue background as compared to a black background.

Figure 7F:
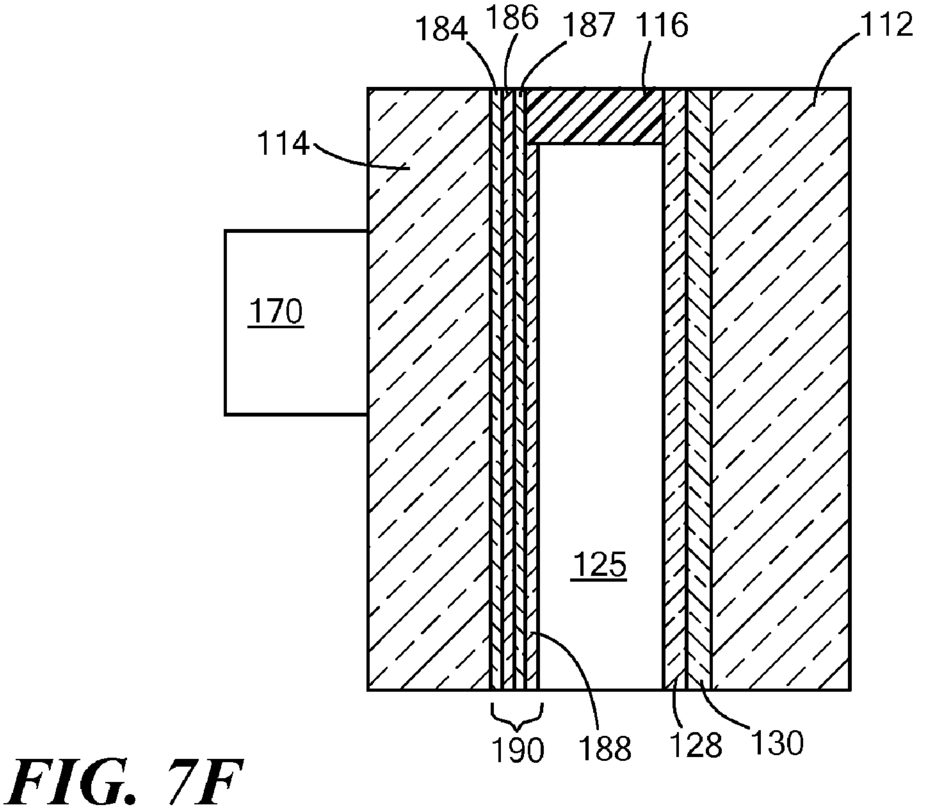

Yet another variation of reflector/electrode 120 is illustrated in FIG. 7F. As illustrated, reflector/electrode 120 is constructed across substantially the entire front surface 114*a* of rear element 114 with an electrically conductive multilayer interferential thin-film coating 190. Conductive thin-film coating 190 is preferably tailored to maximize transmittance to light having wavelengths within a narrow band corresponding to the wavelength of light emitted from light source 170. Thus, if light source 170 were a signal light including red, red-orange, or amber AlGaAs or AlInGaP LEDs, the light emitted from such LEDs would have wavelengths in the range of 585 nm to 660 nm, and conductive thin-film coating 190 would be tailored to maximize spectral transmittance at those wavelengths. By increasing the transmittance preferentially within this relatively narrow band of wavelengths, the average luminous reflectance to white light remains relatively high. As will be apparent from the four examples provided below of electrodes constructed using such conductive thin-film coatings, the conductive thin-film coating as so constructed includes a first layer 184 of a first material having a relatively high refractive index, a second layer 186 of a second material formed on first layer 184 where the second material has a relatively low refractive index, and a third layer 187 formed on second layer 186 and made of a material that has a relatively high refractive index. Conductive thin-film coating 190 may also include a thin fourth layer 188 of an electrically conductive material formed on third layer 187. If third layer 187 is not electrically conductive, fourth layer 188 of an electrically conductive material must be disposed on third layer 187. If the first, second, and third layers provide sufficient reflectivity, such a fourth layer 188 may be made of a transparent conductive material. If not, fourth layer 188 may be made of a reflective material.

Conductive thin-film coating 190 preferably exhibits: a luminous reflectance of 35 to 95 percent, a reflected C* value of 20 or less, a signal light/display luminous transmittance of 10 percent or more, and a sheet resistance of less than 100Ω/Y. More preferably, C* is less than 15 and most preferably less than 10, and the value of a* is negative. As a measure of comparison, luminous reflection and reflected C* for this coating may be measured using one or more of the CIE illuminants A, B, C, or D55, D65, an equal-energy white source or other broad-band source meeting the SAE definition of white. Luminous reflectance and reflected C* for this coating may be measured at one or more angles of incidence between 10° and 45° from the surface normal. The signal light/display luminous transmittance for this coating may be measured using one or more signal or display sources such as amber, orange, red-orange, red, or deep red LEDs, vacuum fluorescent displays (VFDs), or other lamps or displays, and at one or more angles of incidence between 20° and 55° from the surface normal. As will be apparent to those skilled in the art, "Luminous Reflectance" and "Signal light/display Luminous Transmittance" imply use of either or both of the 1931 CIE 2 degree observer $V_\lambda$ or $V_\lambda'$ as the eye-weighting functions.

By configuring conductive thin-film coating 190 to have a reflectance, transmittance, electrical conductivity, and a reflected C* value within the above parameters, an electrode may thus be constructed that has medium to high reflectance, substantially neutral reflectance for faithful rendering, medium to high in-band signal light/display transmittance for efficiency and brightness, and low sheet resistance for good electrochromic functionality.

In the specific examples of such a conductive thin-film coating, the first and third materials forming first and third layers 184 and 187, respectively, may be the same or a different material selected from the group consisting essentially of indium tin oxide, fluorine-doped tin oxide, titanium dioxide, tin dioxide, tantalum pentoxide, zinc oxide, zirconium oxide, iron oxide, silicon, or any other material having a relatively high refractive index. Second layer 186 may be made of silicon dioxide, niobium oxide, magnesium fluoride, aluminum oxide, or any other material having a low refractive index. First layer 184 may have a thickness of between about 200 Å to 800 Å, second layer 186 may have a thickness of between about 400 Å to 1200 Å, third layer 187 may have a thickness between about 600 Å to 1400 Å, and layer 188 may have a thickness of about 150 Å to 300 Å. Other optimal thicknesses outside these ranges may also be obtainable per the above description. Inserting additional layer sets of low and high index materials can raise reflectance further. Preferably, the electrically conductive material forming fourth layer 188 is made of a reflective material such as silver or silver alloy, or of a transparent conductive material such as ITO.

According to a first example of conductive thin-film coating 190, an electrochromic mirror was modeled having a front element 112 having a thickness of 2.2 mm, a first electrode 128 made of ITO and having a thickness of approximately 1400 Å, an electrochromic fluid/gel having a thickness of approximately 137 to 190 microns, and a conductive thin-film coating 190 provided on a rear glass substrate 114. Conductive thin-film coating 190 in this first example included a first layer 184 made of ITO and having a thickness of approximately 750 Å, a second layer 186 made of $SiO_2$ and having a thickness of approximately 940 Å, a third layer 187 made of ITO and having a thickness of approximately 845 Å, and a fourth layer 188 made of silver and having a thickness of 275 Å. In air, the conductive thin-film coating 190 modeled in this first example exhibited a luminous reflectance of approximately 80.2 percent for white light and a spectral transmittance of approximately 22.5 percent on average for light having wavelengths between 620 nm and 650 nm. Such characteristics make the conductive thin-film coating 190 according to this first example suitable for use either in an inside or outside rearview mirror. When this conductive thin-film coating is applied to the front surface of rear glass element and incorporated into an electrochromic mirror, the overall reflectance decreases and the transmittance increases.

According to a second example, another electrochromic mirror was modeled having the same features as discussed above with the exception that conductive thin-film coating 190 included a first layer 184 made of ITO and having a thickness of approximately 525 Å, a second layer of $SiO_2$ having a thickness of approximately 890 Å, a third layer 187 made of ITO and having a thickness of approximately 944 Å, and a fourth layer 188 made of silver and having a thickness of approximately 168 Å. In air, the conductive thin-film coating as constructed in the second example has a luminous reflectance of approximately 63 percent for white light incident thereupon at a 20° angle of incidence, and a spectral transmittance of approximately 41 percent on average for light having wavelengths in the 620 nm to 650 nm wavelength range at 20° angle of incidence. Such a conductive thin-film coating 190 is particularly suitable for an outside rearview mirror. When this conductive thin-film coating is applied to the front surface of rear glass element and incorporated into an electrochromic mirror, the overall reflectance decreases and the transmittance increases.

A conductive thin-film coating according to a third example was modeled that was made of the same materials as described for the first two conductive thin-film coatings except that first layer 184 had a thickness of approximately 525 Å, second layer 186 had a thickness of approximately 890 Å, third layer 187 had a thickness of approximately 945 Å, and fourth layer 188 had a thickness of approximately 170 Å. In air, the conductive thin-film coating thus modeled had a luminous reflectance of 63 percent at 20° angle of incidence for illumination with white light, and an average spectral transmittance of approximately 41 percent for light having wavelengths between the 620 nm and 650 nm wavelength range at 20° angle of incidence. When this conductive thin-film coating is applied to the front surface of rear glass element and incorporated into an electrochromic mirror, the overall reflectance decreases and the transmittance increases.

According to a fourth example, a non-conductive three layer interference coating available from Libbey Owens Ford (LOF) of Toledo, Ohio, is used in combination with a conductive fourth layer 188 of ITO or the like. The thin film stack available from LOF has a first layer 184 of Si, a second layer 186 of $SiO_2$, and a third layer 187 of $SnO_2$. This coating has a reflectance of approximately 80 percent and a transmittance of approximately 4 percent for white light, and transmittance of 7 to 10 percent for light having wavelengths in the 650 to 700 nm range. The transmittance in the 650 to 700 nm range makes this thin film stack particularly suitable for a signal mirror that utilizes a red light source. While the $SnO_2$, $SiO_2$ and Si used in the LOF thin film stack are not highly reflective materials by themselves (particularly when applied as a thin layer), the alternating layers of such materials having high and low refractive indices produce the requisite high level of reflectivity. The poor electrical conductivity of this thin film stack requires that it be implemented with an electrically conductive layer that has good electrical conductivity, such as a layer of ITO or the like. The LOF thin film stack overcoated with an ITO layer having a half-wave thickness exhibited a sheet resistance of 12Ω/Y. When the ITO/LOF thin-film stack was used as a second electrode for an electrochromic mirror, the mirror had a reflectance of 65 percent. Several different displays were placed behind the assembled mirror and were all easily observed.

Figure 7G:
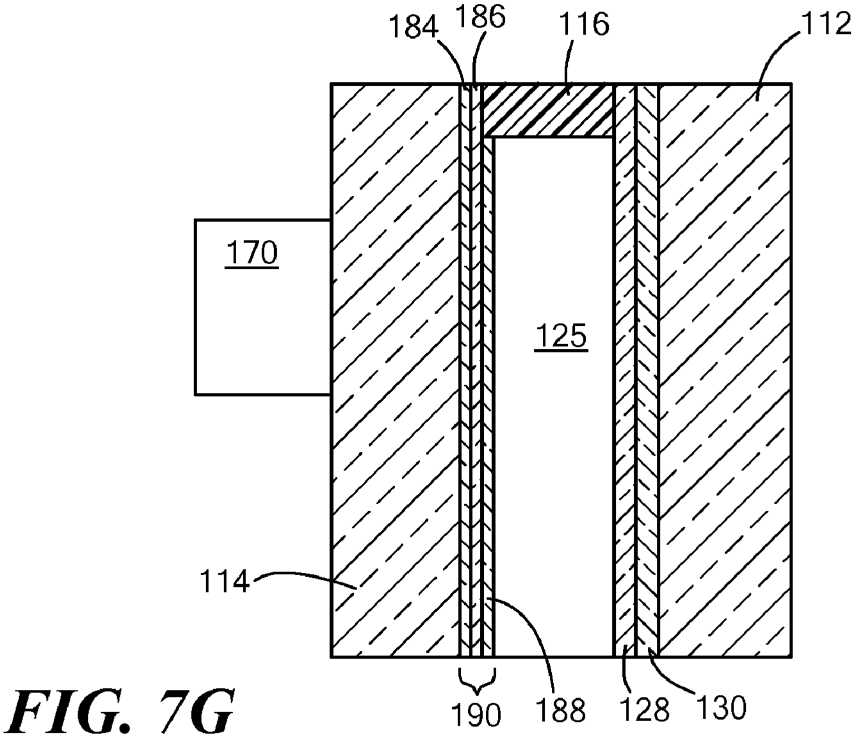

FIG. 7G shows yet another alternate construction that is very similar to that shown in FIG. 7F, with the exception that only three layers are utilized for the electrically conductive multi-layer thin-film coating 190. According to the construction shown in FIG. 7G, thin-film coating 190 includes a first layer 184 made of a material having a high refractive index such as the materials noted above in connection with FIG. 7F, a second layer made of a material having a low refractive index such as those materials also discussed above for layer 186 in FIG. 7F, and a third layer 188 of electrically conductive material. Layer 188 need not be made of a material having a high refractive index, but rather may be made of any electrically conductive material suitable for use in an electrochromic mirror. For example, layer 188 may be a highly reflective metal, such as silver or a silver alloy, or may be a metal oxide, such as ITO. To illustrate the feasibility of such a coating, two examples are described below.

In a first example, an electrochromic mirror was modeled having a first layer 184 of ITO deposited on a front surface of rear glass substrate 114 at a thickness of 590 Å, a second layer 186 of silicon dioxide applied at a thickness of 324 Å over first layer 184, and a third layer 188 of silver having a thickness of 160 Å applied over second layer 186. The electrochromic mirror was then illuminated with a CIE illuminant D65 white light source at an angle of incidence of 20°. When illuminated with such white light, the mirror exhibited a luminance reflectance of 52 percent and a* and b* values of approximately 1.0 and 5.0, respectively. When illuminated with a red LED source at 35° angle of incidence, the mirror exhibited a luminous transmittance of 40 percent.

According to a second example of the structure shown in FIG. 7G, an electrochromic mirror was modeled having a first layer 184 of silicon deposited at a thickness of 184 Å on the front surface of glass substrate 114, a second layer 186 deposited on first layer 184 and formed of silicon dioxide at a thickness of 1147 Å, and a third layer 188 of ITO of a thickness of 1076 Å applied over second layer 186. The electrochromic mirror having such a coating was illuminated with a CIE illuminant D65 white light source at 20° angle of incidence. When modeled as illuminated with such white light, the modeled mirror exhibited a luminous reflectance of 54 percent and a* and b* values of −2.5 and 3.0, respectively. When modeled as illuminated with a red LED source at 35° angle of incidence, the modeled mirror exhibited a luminous transmittance of approximately 40 percent.

Considering that the above two three-layer examples exhibited luminous reflectance in excess of 50 percent and transmittance of approximately 40 percent, a mirror constructed as shown in FIG. 7G meets the specific objectives noted above with respect to FIG. 7F, and is therefore suitable for use in an outside electrochromic rearview mirror incorporating a signal light.

As will be apparent to those skilled in the art, the electrically conductive multi-layer thin-film coating described above may be implemented as a third surface reflector for an electrochromic mirror regardless of whether the electrochromic medium is a solution-phase, gel-phase, or hybrid (solid state/solution or solid state/gel).

Although the above alternative constructions shown and described with respect to FIGS. 7A-7G do not include a flash-over protective layer such as layer 124 shown in FIG. 3, those skilled in the art will understand that such a flash-over layer may be applied over any of the various reflector/electrode 120 constructions shown in FIGS. 7A-7G.

Figure 8:
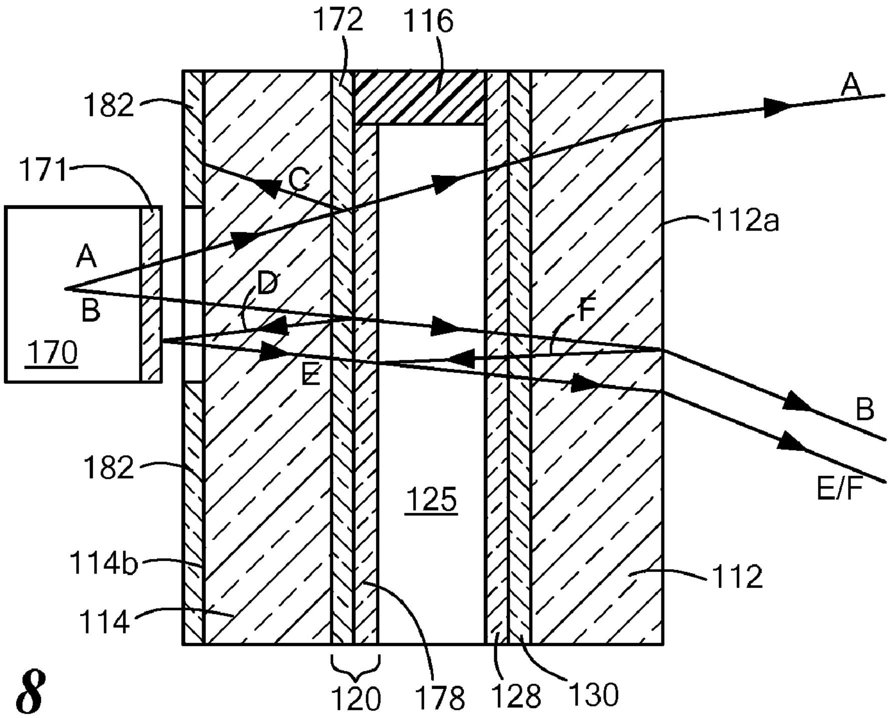
FIG. 8 is a partial cross-sectional view of the electrochromic mirror according to the present invention as taken along line 7-7' shown in FIG. 2.

FIG. 8 shows a cross section of one embodiment of the present invention as similarly illustrated in FIG. 7E above. Specifically, by mounting a light emitting display assembly, indicator, enunciator, or other graphics 170 behind a reflective layer such as layer 178, spurious reflections occur at various interfaces within the electrochromic mirror that result in one or more ghost images being readily viewable by the vehicle occupants. The perceived separation between these images increases as the reflective surfaces move further apart. In general, the thinner the glass used in the mirror construction, the less objectionable the images become. However, eliminating or reducing the intensity of the spurious reflections enhances the overall clarity of the display. As shown in FIG. 8, a point of illumination from display 170 emits light through element 114 as illustrated by light rays A and B, which are only two of an infinite number of light rays that could be traced from any one point source. Light rays A and B are then transmitted through transparent conductive layer 172 with little or no reflections at the interface between electrode 172 and element 114 due to the closeness of the indices of refraction of these two components. The light then reaches the interface between transparent layer 172 and reflective layer 178, where between 10 and 20 percent of the light is transmitted through reflective layer 178 into electrochromic medium 125. A large percentage of the light intensity striking reflective layer 178 is thus reflected back as illustrated by light rays C and D. While reflected light that is incident upon a paint layer 182 on rear surface 114*b* of element 114 (ray C) may be absorbed substantially in its entirety, light that is reflected back at display 170 (ray D) is not absorbed by the layer of absorbent paint 182. Because many light emitting displays, such as a vacuum fluorescent display with a glass top plate, an LCD, or any other display assembly mounted such that there is an air gap between surface 114*b* and the front surface of display 170, typically include at least one specular surface 171, light reflected back at the specular surface(s) 171 of display 170 (ray D) is reflected off surface 171 back through element 114, reflective electrode 120, electrochromic medium 125, layers 128 and 130, and element 112. This spurious reflection off of the specular surface 171 of display 170 thus creates a ghost image that is viewable by the vehicle occupants. Additional spurious reflections occur at the outer surface 112*a* of element 112 due to the differences in refractive indices of element 112 and the air surrounding the electrochromic mirror. Thus, light represented by ray F is reflected back into the mirror from surface 112*a* and is subsequently reflected off of reflective layer 178 back though medium 125, layers 128 and 130, and element 112. It is therefore desirable to implement various measures that eliminate or reduce the intensity of these spurious reflections and thereby eliminate the annoying ghost images that are visible to the vehicle occupants. FIGS. 9A-9D, which are described below, illustrate various modifications that may be made to reduce these spurious reflections. It should be noted that these spurious reflections are always lower in brightness than the nonreflected image. One approach to improving the clarity of the display without eliminating spurious reflections is to control the display brightness such that the intensity of the secondary images are below the visual perception threshold. This brightness level will vary with ambient light levels. The ambient light levels can be accurately determined by photosensors in the mirror. This feedback can be used to adjust the display brightness so the secondary images are not bright enough to be objectionable.

Figure 9A:
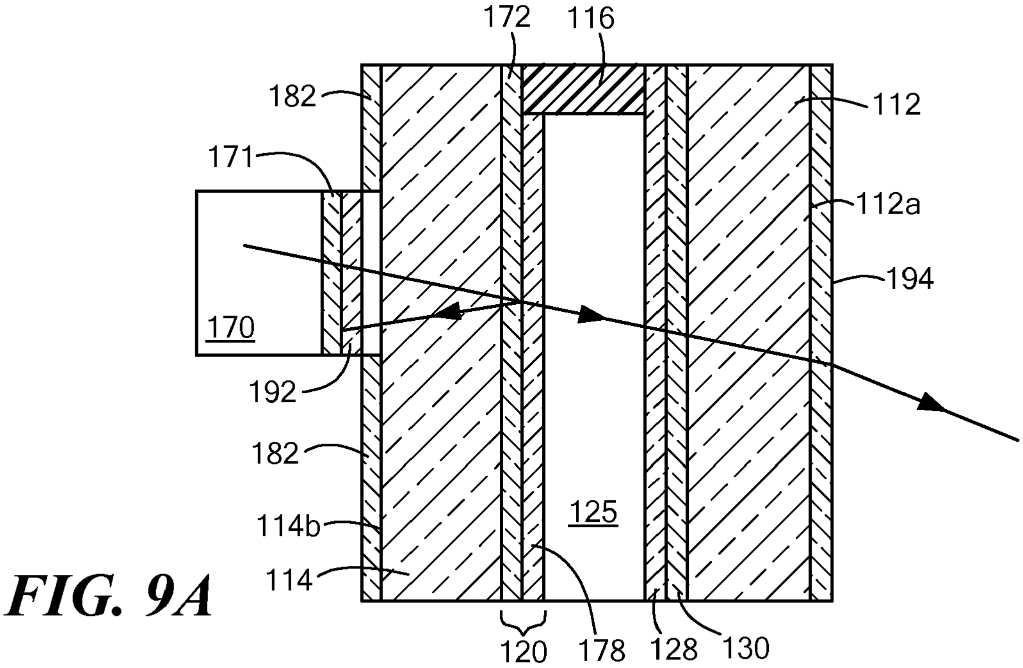
FIGS. 9A-9E are partial cross-sectional views of additional alternative constructions of the electrochromic mirror according to the present invention as taken along lines 7-7' shown in FIG. 2.

In the embodiment shown in FIG. 9A, means 192 and 194 are provided for reducing or preventing reflections from specular surface 171 and front surface 112*a* of element 112, respectively. Anti-reflective means 192 may include an anti-reflective film applied to the rear surface 114*b* of element 114 or to any and all specularly reflecting surfaces of display assembly 170. Anti-reflective means 192 may also include a light absorbing mask applied to rear surface 114*b* or specular surface 171 of display assembly 170. Such a masking layer 192 may be made to cover substantially the entirety of specular surface 171, with the exception of those regions lying directly over a light emitting segment of display 170. The masking may be made with any light absorbing material, such as black paint, black tape, black foam backing, or the like. It should be noted that vacuum florescent displays are available with an internal black mask in all areas around the individual light emitting elements. If anti-reflective means 192 is formed as an anti-reflective layer, substantially any known anti-reflective film may be employed for this purpose. The anti-reflective film need only be constructed to prevent reflections at the particular wavelength of the light emitted from display 170.

By providing anti-reflective means 192 as described above, any light that is reflected back from reflective layer 178 toward specular surface 171 of display 170 is either absorbed or transmitted into display 170, such that it cannot be reflected from surface 171 through the device towards the eyes of the vehicle occupants. It should be noted that anti-reflective means 192 may also include any other structure capable of reducing or preventing the reflection of light from specular surface 171. Further, anti-reflective means 192 may include a combination of an anti-reflective film and a masking layer and layer 192 may be incorporated on any specularly reflective surface that could reflect light reflected off reflector 178, for example, either the back surface of glass element 114, the front surface of display 170, or any internal surface in display 170.

To reduce the spurious reflections from the air interface with surface 112*a* of element 112, an anti-reflective film 194 may be provided on surface 112*a*. Anti-reflective film 194 may be formed of any conventional structure. A circular polarizer inserted between the transflective coating and the display is also useful in reducing spurious reflections.

Figure 9B:
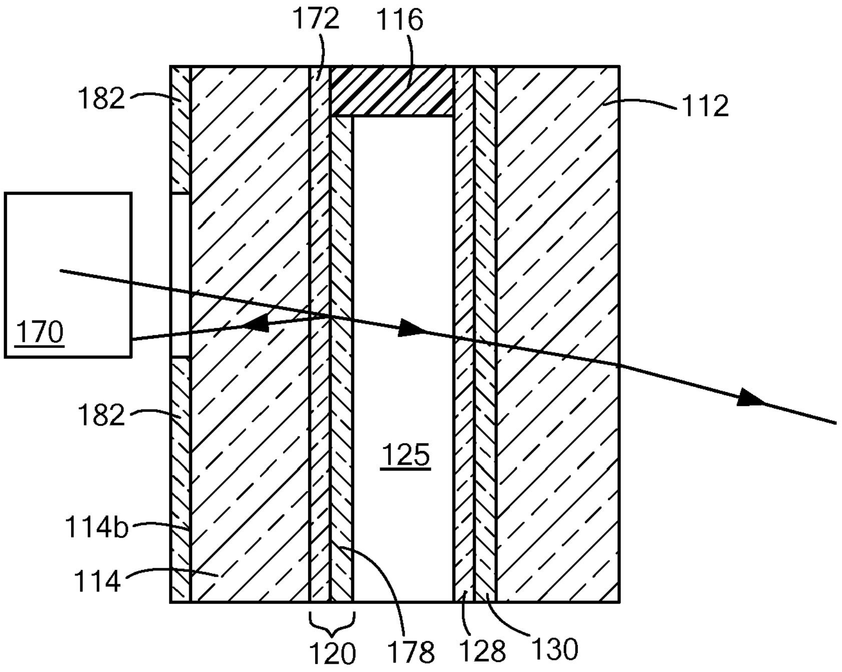

FIG. 9B shows an alternative solution to the problems relating to the reflection of light from display 170 off of reflective layer 178 and the specular surface of the display. Specifically, display 170 is preferably selected from those displays that do not include any form of specular surface. Examples of such displays are available from Hewlett Packard and are referenced as the HDSP Series. Such displays generally have a front surface that is substantially light absorbing, such that little if any light would be reflected off the forward-facing surface of the display.

Another example of a display construction that would not have a specularly reflecting surface (such as between glass and air) would be a back lit liquid crystal display (LCD) that is laminated directly onto the back mirror surface 114*b* to eliminate the air gap or air interface between the display and the mirror. Eliminating the air gap is an effective means of minimizing the first surface reflection of all display devices. If the type of LCD used was normally opaque or dark such as with a twisted nematic LCD with parallel polarizers or a phase change or guest host LCD with a black dye, the reflected light would be absorbed by the display and not re-reflected back toward the viewer. Another approach would be to use a back lit transmissive twisted nematic LCD with crossed polarizers. The entire display area would then be illuminated and contrasted with black digits. Alternatively, a positive or negative contrast electrochromic display could be used in place of the LCD, or an organic LED could be laminated or fixed to the back surface 114_b_.

Figure 9C:
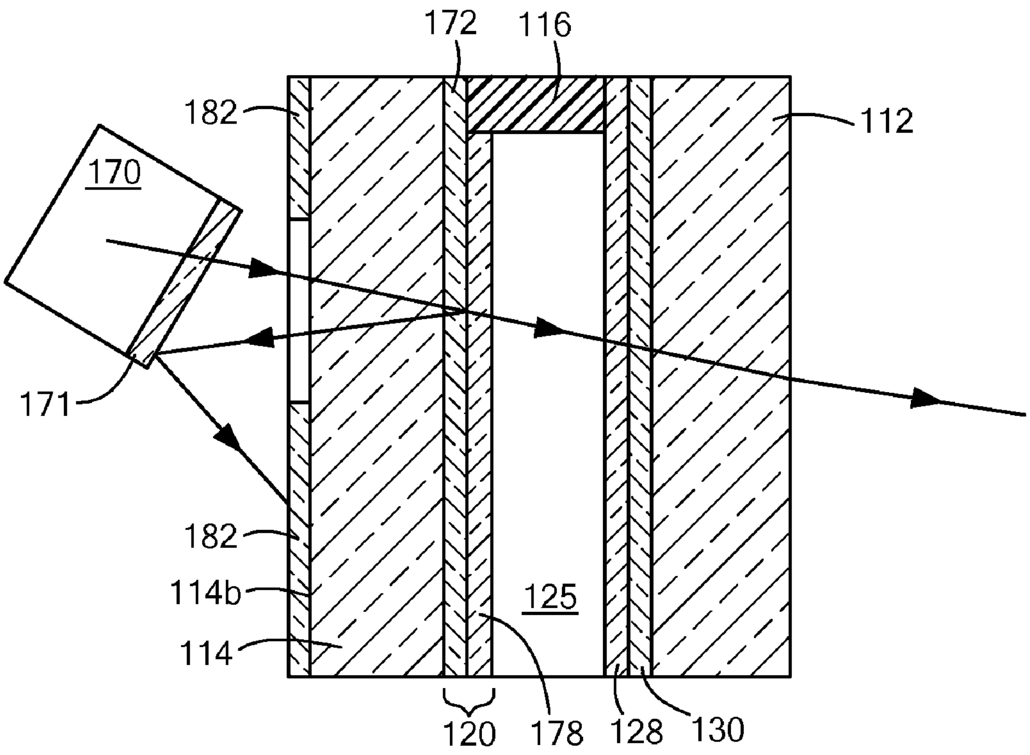

An alternative solution is shown in FIG. 9C, whereby display 170 is mounted in back of rear surface 114_b_ of rear element 114, such that specular surface 171 is inclined at an angle to rear surface 114_b_. As apparent from the ray tracings in FIG. 9C, any light emitted from display 170 that reflects off of reflective layer 178 back toward specular surface 171 of display 170 is reflected off of specular surface 171 at an angle which could direct the light beam away from the viewer towards, for instance, the roof of the vehicle or, if the angle of the display is great enough, the beam could be directed toward an absorbing surface such as a black mask applied to the back of the mirror on surface 114_b_. It should be noted that, rather than angling the display, the reflected beam could be deflected by some other means such as by laminating a transparent wedge shape on the front of the display, the goal being to redirect the reflected light out of the viewing cone of the display or to an absorbing media or surface.

Figure 9D:
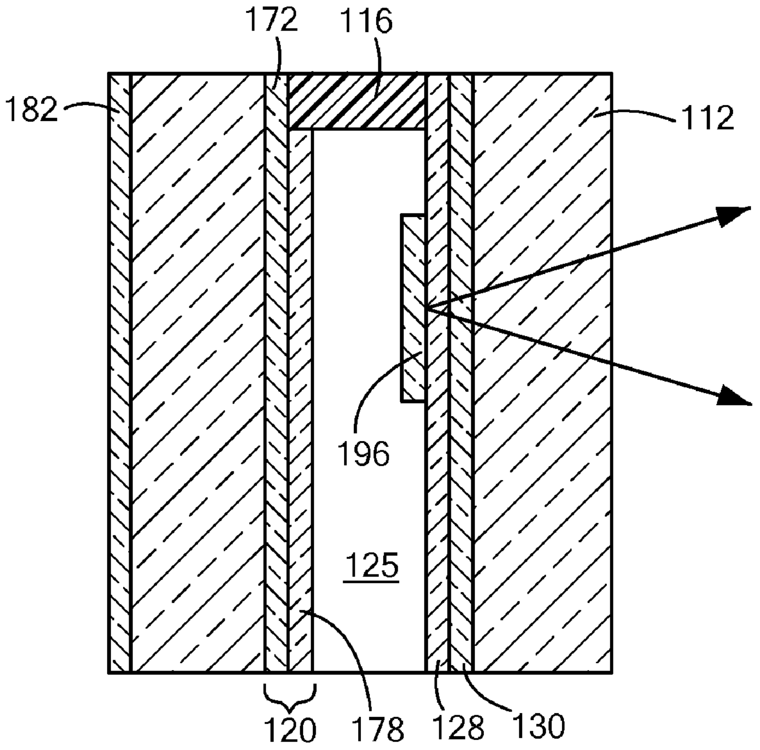
Figure 9E:
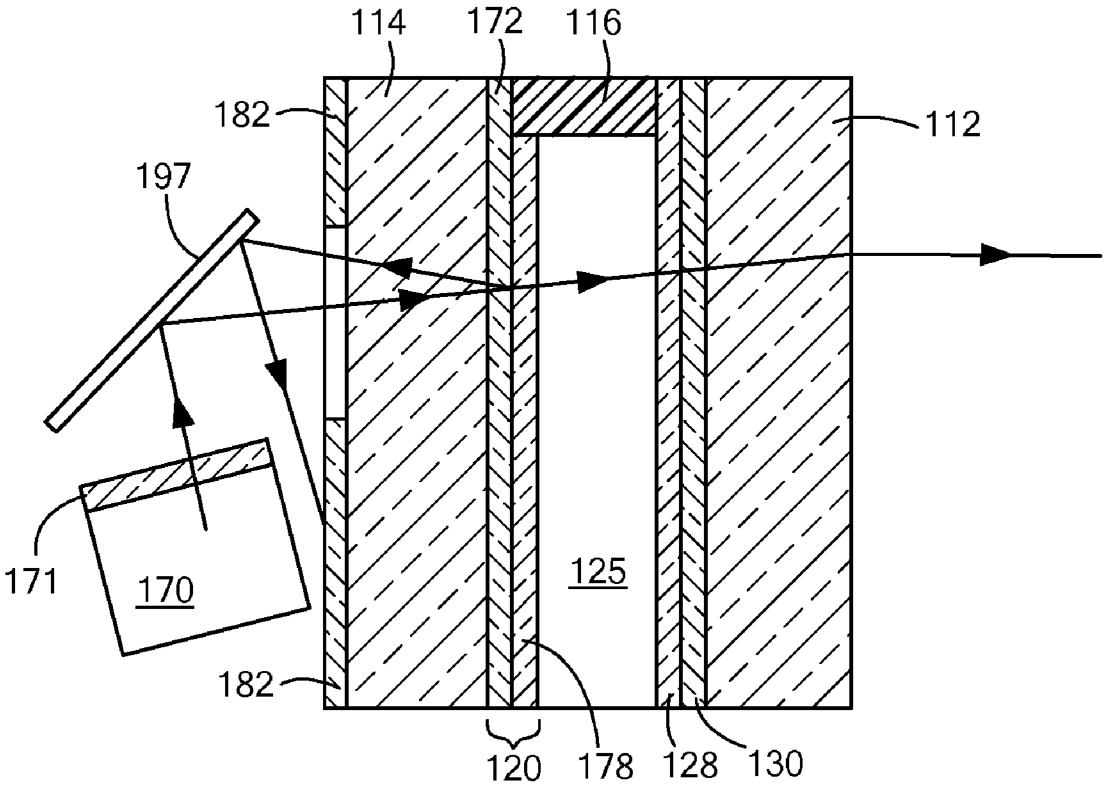

As shown in FIG. 9E, another useful technique to reduce spurious reflections is to reflect the display image off of a mirror surface 197 (preferably a first surface mirror) at about a 45° angle and then through the transflective layer 120. The image reflected off the transflective layer 120 can then be redirected away from the specular surfaces on the display by slightly angling the relationship of the display to the transflective layer.

FIG. 9D shows yet another approach for overcoming the problems noted above. Specifically, the embodiment shown in FIG. 9D overcomes the problem by actually mounting the display in front of reflective layer 178. To enable the display to be mounted in front of the reflected layer, a substantially transparent display, such as an organic light emitting diode (OLED) 196 is utilized. OLEDs are available from Universal Display Corporation. Such OLEDs can be constructed such that they are thin transparent displays that could be mounted inside the chamber in which the electrochromic medium is maintained. Because OLED 196 can be transparent, it would not interfere with the image viewed by the driver of the vehicle. Additionally, by providing OLED 196 inside the chamber between the substrates, display 196 is protected from any adverse environmental effects. Thus, such an arrangement is particularly desirable when mounting a display device in an exterior automotive rearview mirror. OLED 196 could be mounted on layer 178, layer 128, between layers 128 and 130, between layer 130 and element 112, between layers 172 and 178, between layer 172 and element 114, to rear surface 114_b_ of element 114, or to surface 112_a_ of element 112. Preferably, OLED display 196 is mounted in front of reflective layer 178 in the chamber between elements 112 and 114.

To take advantage of the fact that the reflective layer in an electrochromic mirror may be partially transmissive over its entire surface area, a light collector may be employed behind the reflective layer to collect the light impinging on the mirror over a much larger area than previously possible and to amplify the light as it is directed onto a photosensor. As will be described in more detail below, the use of such a light collector more than compensates for the lack of the provision of an opening in the reflective layer and actually can increase the sensitivity of the glare sensor in an electrochromic mirror.

Figure 10:
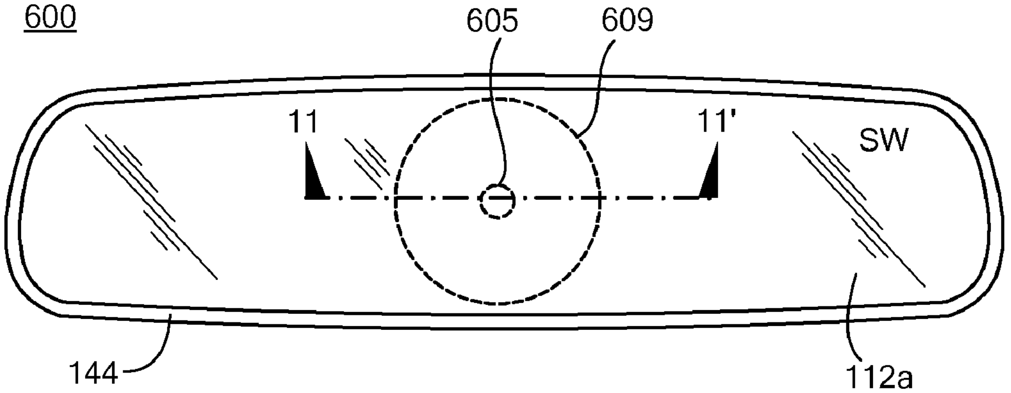
FIG. 10 is a front elevational view schematically illustrating an inside electrochromic rearview mirror incorporating the mirror assembly of the present invention.
Figure 11:
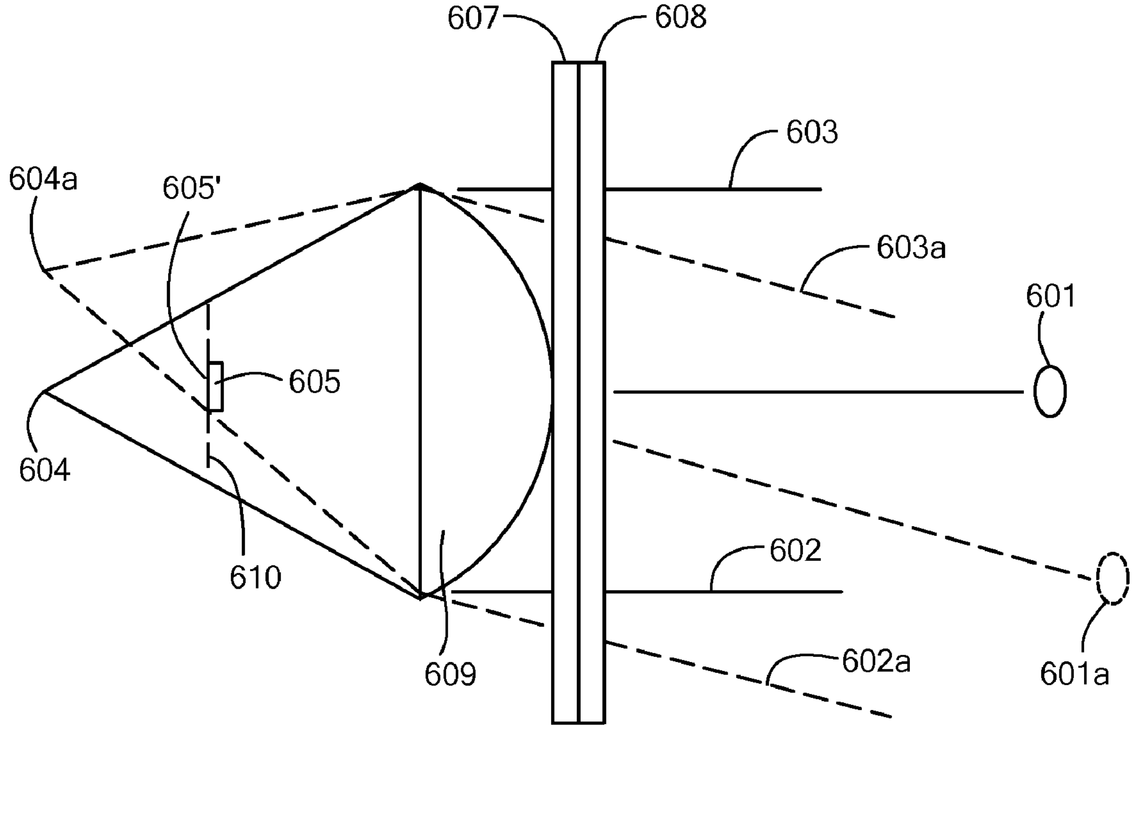
FIG. 11 is a partial cross-sectional view of the electrochromic mirror shown in FIG. 10 taken along line 11-11'.

FIG. 10 is a front view of an inside rearview mirror constructed in accordance with the present invention. FIG. 11 is a cross-sectional view taken along plane 11-11' of FIG. 10. According to this construction, the light collector may be constructed as a plano-convex lens 609 mounted behind a partially transmissive reflecting surface 607 and a variable attenuating layer 608. As shown in FIG. 11, lens 609 projects light from source 601 onto focal point 604 and light from source 601_a_ onto focal point 604_a_. A small area sensor, for example, the single pixel sensor of U.S. patent application Ser. No. 09/237,107, filed on Jan. 25, 1999, which is incorporated herein by reference, is provided to sense glare from the rear viewed through lens 609, partially transmissive layer 607, and optionally through variable attenuating layer 608. This construction takes advantage of the fact that the active sensing area of sensor 605 is small, for example, 100 microns on a side, and that a relatively large light collector, lens 609 in this example, can be substantially hidden behind the partially transmissive mirror and configured so that relatively high optical gain may be provided for the sensor while still providing a characterized and relatively large field of view over which glare is sensed. In the example shown in FIG. 11, light source 601_a_ is approximately 20 degrees off of the central axis and is close to the edge of the amplified field of view. Note that unamplified light, part of which may not pass through the lens, may be used to maintain some sensitivity to glare over a larger field of view.

When designing a construction such as those shown in FIGS. 10 and 11, there are several design considerations. Because the source of light that impinges upon the mirror and creates glare is the head lamps of automobiles to the rear of the vehicle, and such light sources are at a great distance away from the mirror relative to the size of the lens, the rays from an automotive head lamp light source are substantially parallel. With a good lens, most of the rays impinging on the lens from a source are projected to a relatively small, intense spot at the focal point 604. For a sensing position other than at the focal point, as a first approximation, the optical gain is the ratio of the area of the lens through which light enters to that of the cross section of the focused cone in the plane where the light is sensed. In FIG. 11, with a spherical or aspherical lens 609, this would be the square of the ratio at the diameter of lens 609 to the length of line 610. This is approximately 10 as depicted. If sensor 605 was placed at the focal point 604 as it would be if it were a pixel in an imaging array, nearly all of the light passing through the lens from light source 601 would strike sensor 605, making the optical gain very high. However, light from a light source 601_a_ would totally miss the sensor and the field of view would be extremely small. In FIG. 11, sensor 605 is placed at a highly de-focussed point, which is common to the cones of light from light sources having positions for which optical gain should be maintained. Note that the plane can optionally be chosen beyond the focal point or other methods of diffusion may be used alone or in combination to widen and characterize the field of view. For a substantially greater off-axis angle, the sensor will be outside of the projected cone of light and no optical gain will be provided. Note that to provide relatively high optical gain over a substantial field of view, the collecting area should be quite large compared to the sensor. The area of the aperture should exceed the area of the sensor first by approximately the ratio of the optical gain, and this ratio should be multiplied by another large factor to provide a field of view having a solid angle that is much larger than that which would be imaged onto the sensor were it to be placed in the focal plane of the lens.

While this particular mirror construction has been described above as including a spherical or an aspherical lens 609, a Fresnel lens may replace the plano-convex lens depicted. Additionally, since for large fields of views the light rays must be redirected through even larger angles, totally internally reflecting (TIR) lenses or reflectors may be used and provide additional advantages. If, for example, a partially transmissive reflecting layer 607 with 20 percent transmission is chosen and an optical gain of 10 is used, the optical gain more than recovers the loss incurred in passing through partially transmissive reflector 607. Furthermore, no unsightly or expensive-to-produce aperture window needs to be provided for the sensor and control benefits of viewing through the layer are also realized.

In configurations where the viewing angle needs to be large in one direction but relatively small in another, a cylindrical lens may be used. For example, to sense lights from vehicles in adjacent lanes, the viewing angle must be relatively large in the horizontal direction and the viewing field may be relatively narrow in the vertical direction. In this case, lens 609 may be replaced by a cylindrical lens with a horizontal axis. A stripe of light rather than a circle is projected, and since light gathering takes place in one rather than two directions, the benefit of the squaring effect for the relative areas of the lens aperture in the area of the projected light pattern in the plane of the sensor is lost. Optical gains of 5, for example, are still feasible, however. Composite lenses containing a patchwork of different elements including, for example, sections of aspheric lenses with different center positions and/or focal lengths, or even combinations of different kinds of elements such as aspheric and cylindrical lenses may be used to retain reasonable optical gain and characterize the field of view. A row of lens sections with stepped focal center points can serve well to widen the field of view in selected directions while maintaining a good overall optical gain. Some amount of diffusion is preferable in all the designs to prevent severe irregularity in the sensed light level due to severe localized irregularities in the projected light pattern that are often present. The extremely small area sensor will not average these irregularities to any useful degree. Some lens designs may optionally be cemented to the back of the mirror element.

In each of the constructions described above with respect to FIGS. 10 and 11, any of the mirror constructions described above with respect to FIGS. 7A-7G may be employed for use as the electrochromic mirror (depicted as layers 607 and 608 in FIG. 11).

Figure 12:
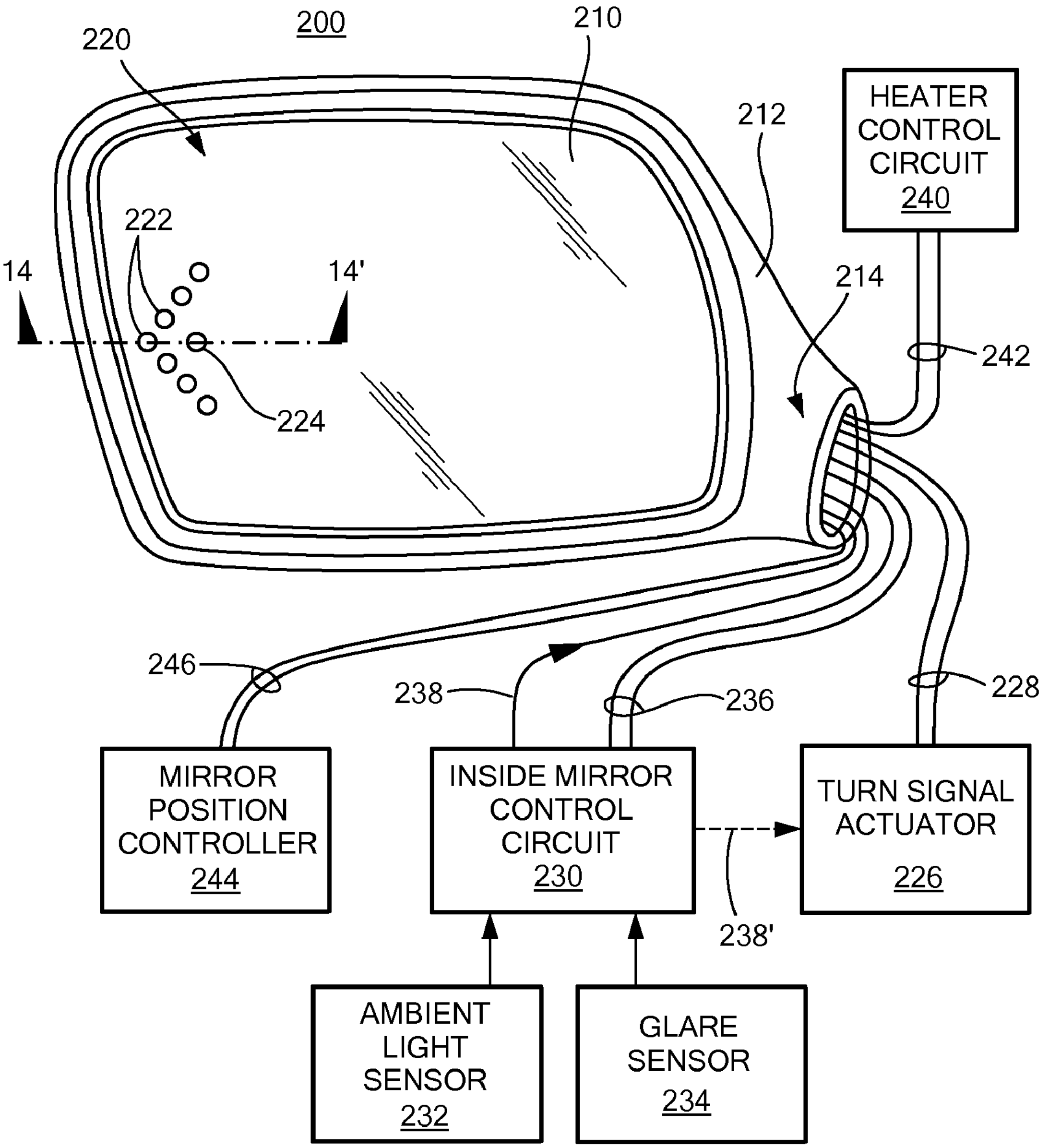
FIG. 12 is a perspective view of an outside automatic rearview mirror including a signal light and an electrical circuit diagram in block form of an outside rearview mirror assembly constructed in accordance with the present invention.

FIG. 12 shows an outside rearview mirror assembly 200 constructed in accordance with another embodiment of the present invention. Outside rearview mirror assembly 200 includes a mirror 210, which is preferably an electrochromic mirror, an external mirror housing 212 having a mounting portion 214 for mounting mirror assembly 200 to the exterior of a vehicle, and a signal light 220 mounted behind mirror 210. To enable the light from signal light 220 to project through electrochromic mirror 210, a plurality of signal light areas 222 are formed in the electrode/reflector of mirror 210 that include window regions containing electrically conductive material that is at least partially transmissive similar to the information display and glare sensor window areas described above with respect to the other embodiments of the present invention. Electrochromic mirror 210 may further include a sensor area 224 disposed within the reflective coating on electrochromic mirror 210 and similarly include window regions containing electrically conductive material that is at least partially transmissive so as to allow some of the incident light to reach a sensor mounted behind sensor area 224. Alternatively, sensor 224 could be used to sense glare in night driving conditions and control the dimming of the exterior mirror independently or verify that the mirrors are being sufficiently dimmed by the control circuit in the interior mirror. In such a case, a more sensitive photo sensor may be required, such as a CdS sensor.

Figure 15:
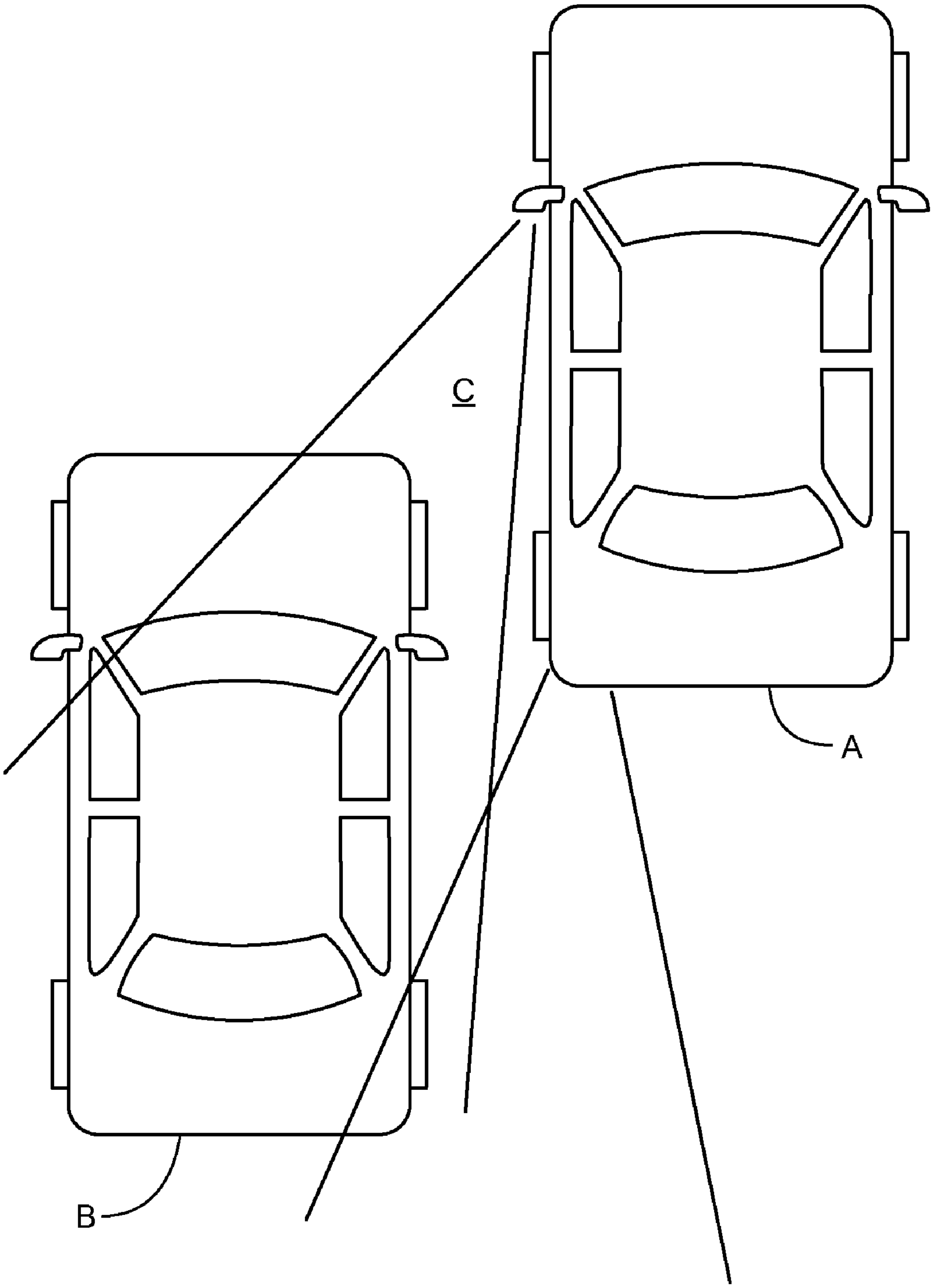
FIG. 15 is a pictorial representation of two vehicles, one of which includes the signal mirror of the present invention.

Signal light 220 is preferably provided to serve as a turn signal light and is thus selectively actuated in response to a control signal generated by a turn signal actuator 226. The control signal is therefore applied to signal light 220 as an intermittent voltage so as to energize signal light 220 when a driver has actuated the turn signal lever. As shown in FIG. 15, when vehicle B is in the blind spot of vehicle A where the driver of vehicle A cannot see vehicle B, the driver of vehicle B cannot see the turn signal on the rear of vehicle A. Thus, if the driver of vehicle A activates the turn signal and attempts to change lanes while vehicle B is in a blind spot, the driver of vehicle B may not receive any advance notice of the impending lane change, and hence, may not be able to avoid an accident. By providing a turn signal light in an outside rearview mirror assembly 200 of vehicle A, the driver of an approaching vehicle B will be able to see that the driver of vehicle A is about to change lanes and may thus take appropriate action more quickly so as to avoid an accident. As illustrated in FIG. 15 and described in more detail below, the signal light is preferably mounted within mirror assembly at an angle to the mirror surface to project the light from the signal light outward into the adjacent lanes in the blind spot areas proximate the vehicle.

Referring again to FIG. 12, electrochromic mirror 220 may be controlled in a conventional manner by a mirror control circuit 230 provided in the inside rearview mirror assembly. Inside mirror control circuit 230 receives signals from an ambient light sensor 232, which is typically mounted in a forward facing position on the interior rearview mirror housing. Control circuit 230 also receives a signal from a glare sensor 234 mounted in a rearward facing position of the interior rearview mirror assembly. Inside mirror control circuit 230 applies a control voltage on a pair of lines 236 in a conventional manner, such that a variable voltage is applied essentially across the entire surface of electrochromic mirror 210. Thus, by varying the voltage applied to lines 236, control circuit 230 may vary the transmittance of the electrochromic medium in mirror 210 in response to the light levels sensed by ambient sensor 232 and glare sensor 234. As will be explained further below, an optional third control line 238 may be connected between the inside mirror control circuit 230 and a variable attenuator 260 provided in outside mirror assembly 200, so as to selectively attenuate the energizing signal applied on lines 228 from turn signal actuator 226 to the signal light 220 in response to the control signal sent on line 238. In this manner, inside mirror control circuit 230 may selectively and remotely control the intensity of signal light 220 based upon information obtained from sensors 232 and 234 and thereby eliminate the need for a sensor to be mounted in each mirror assembly as well as the associated sensor area 224.

Mirror assembly 200 may further include an electric heater (not shown) provided behind mirror 210 that is selectively actuated by a heater control circuit 240 via lines 242. Such heaters are known in the art to be effective for deicing and defogging such external rearview mirrors. Mirror assembly 200 may optionally include a mirror position servomotor (not shown) that is driven by a mirror position controller 244 via lines 246. Such mirror position servomotors and controls are also known in the art. As will be appreciated by those skilled in the art, mirror assembly 200 may include additional features and elements as are now known in the art or may become known in the future without departing from the spirit and scope of the present invention.

Figure 13:
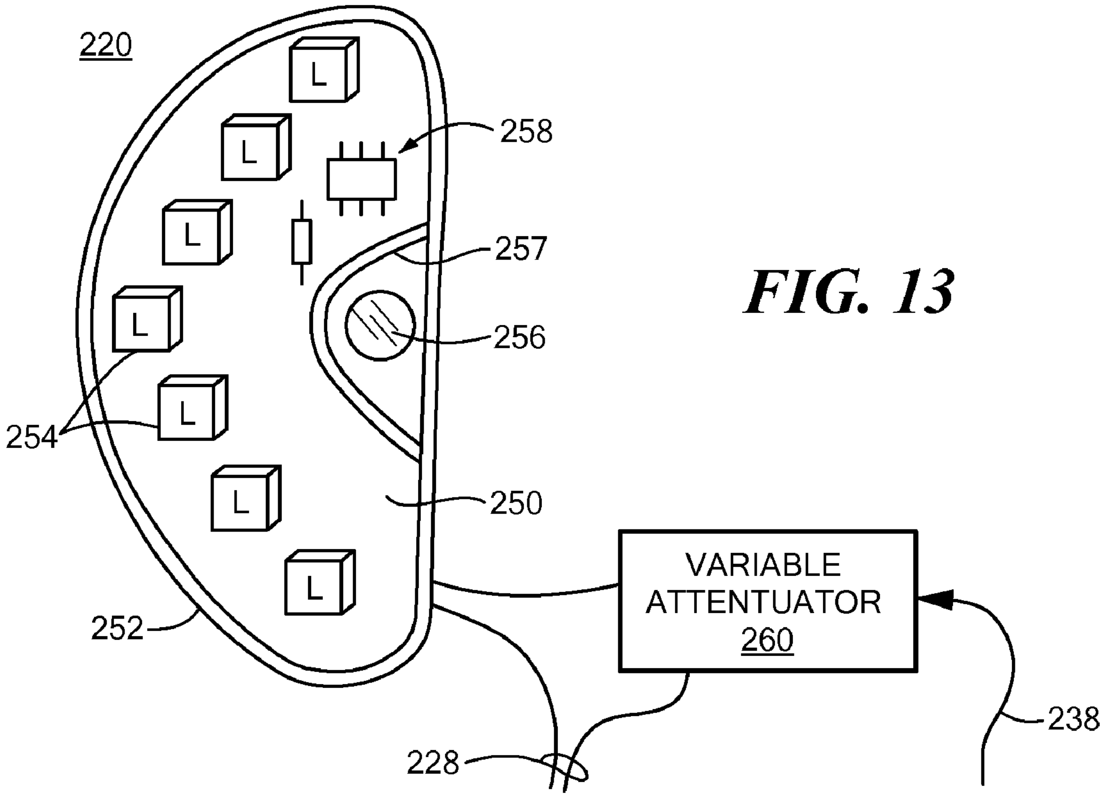
FIG. 13 is a front elevational view of a signal light subassembly that may be used in the outside mirror assembly of the present invention.

An exemplary signal light subassembly 220 is shown in FIG. 13. Such a signal light 220 is disclosed in U.S. Pat. Nos. 5,361,190 and 5,788,357, which disclose the signal light in combination with dichroic exterior rearview mirrors that are not electrochromic. The disclosures of the signal light assembly in U.S. Pat. Nos. 5,361,190 and 5,788,357 is incorporated herein by reference. As explained below, however, the same signal light subassembly may be used in connection with an electrochromic mirror as may modified versions of the signal light subassembly shown in FIG. 13.

As shown in FIG. 13, signal light 220 includes a printed circuit board 250 that, in turn, is mounted within a housing 252 having a peripheral edge that serves as a shroud (see FIGS. 6A and 6B) to block any stray light from exiting the signal light assembly. Signal light 220 preferably includes a plurality of LEDs 254 that are mounted to circuit board 250. LEDs 254 may be mounted in any pattern, but are preferably mounted in a pattern likely to suggest to other vehicle operators that the vehicle having such signal mirrors is about to turn. LEDs 254 may be LEDs that emit red or amber light or any other color light as may prove desirable. LEDs 254 are also preferably mounted to circuit board 250 at an angle away from the direction of the driver. By angling LEDs relative to mirror 210, the light projected from LEDs 254 may be projected outward away from the driver towards the area C in which the driver of another vehicle would be more likely to notice the signal light, as shown in FIG. 15. Hence, the potential glare from the signal light as viewed by the driver may be effectively reduced.

Signal light 220 may optionally include a day/night sensor 256 also mounted to circuit board 250. If sensor 256 is mounted on circuit board 250, a shroud 257 is also preferably mounted to shield sensor 256 from the light generated by LEDs 254. Also, if sensor 256 is provided in signal light 220, a day/night sensing circuit 258 may also be mounted on circuit board 250 so as to vary the intensity of LEDs 254 in response to the detection of the presence or absence of daylight by sensor 256. Thus, if sensor 256 detects daylight, circuit 258 increases the intensity of the light emitted from LEDs 254 to their highest level and decreases the intensity of the emitted light when sensor 256 detects that it is nighttime. The above-noted signal light disclosed in U.S. Pat. Nos. 5,361,190 and 5,788,357 includes such a day/night sensor 256 and associated control circuit 258, and therefore, further description of the operation of the signal light in this regard will not be provided.

As an alternative to providing a day/night sensor 256 in each of the vehicle's exterior rearview mirrors, a variable attenuator 260 or other similar circuit may be provided to vary the driving voltage applied from the turn signal actuator 226 on line 228 in response to a control signal delivered from inside mirror control circuit 230 on a dedicated line 238. In this manner, inside mirror control circuit 230 may utilize the information provided from ambient light sensor 232 as well as the information from glare sensor 234 to control the intensity of the light emitted from LEDs 254 and signal light 220. Since the ambient light and glare sensors 232 and 234 are already provided in an internal electrochromic rearview mirror, providing for such remote control by the inside mirror control circuit 230 eliminates the need for providing additional expensive sensors 256 in the signal light 220 of each exterior mirror assembly. As an alternative to running a separate wire 258 to each of the outside rearview mirrors, variable attenuator 260 may be provided in the dashboard proximate the turn signal actuator or otherwise built into the turn signal actuator, such that a single control line 238' may be wired from inside mirror control circuit 230 to the turn signal actuator as shown in FIG. 12.

The intensity of the light emitted from the LEDs may thus be varied as a function of the light level sensed by ambient sensor 232 or glare sensor 234, or as a function of the light levels sensed by both sensors 232 and 234. Preferably, LEDs 254 are controlled to be at their greatest intensity when ambient sensor 232 detects daylight and at a lesser intensity when sensor 232 detects no daylight. Because the transmittance of the electrochromic medium is decreased when excessive glare is detected using glare detector 234, the intensity of LEDs 254 is preferably correspondingly increased so as to maintain a relatively constant intensity at nighttime.

Electrochromic mirror 210 may be constructed in accordance with any of the alternative arrangements disclosed in FIGS. 7A-7F above, where light source 170 represents one of LEDs 254 of signal light subassembly 220. Accordingly, each possible combination of the various constructions shown in FIGS. 7A-7F with signal light subassembly 220 are not illustrated or described in further detail. As but one example, however, FIG. 14 shows the manner in which a signal light subassembly 220 could be mounted behind a preferred construction that is otherwise identical to that shown in FIG. 7C. As apparent from a comparison of FIG. 7C and FIG. 14, each of signal light areas 222 corresponds to window 146 of FIG. 7C. As discussed above, for an outside rearview mirror the reflectance of reflector/electrode 120 is preferably at least 35 percent and the transmittance is preferably at least 20 percent so as to meet the minimum reflectance requirements and yet allow sufficient transmittance so that the light emitted from signal light 220 may be readily noticed by the driver of an approaching vehicle.

Figure 16:
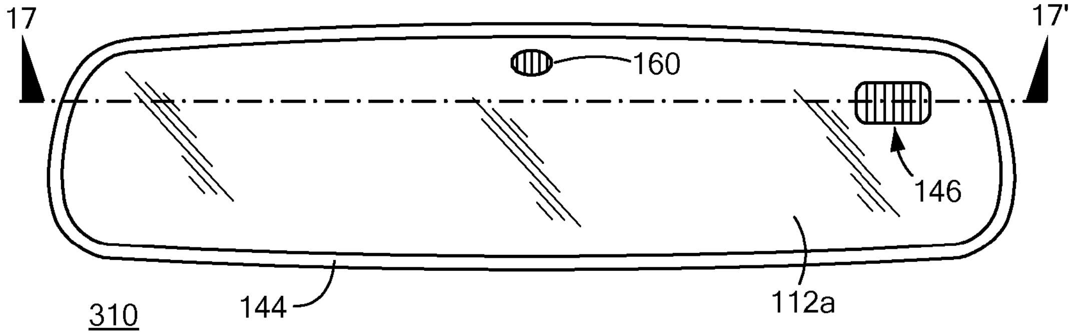
FIG. 16 is a front elevational view of an automatic rearview mirror embodying the information display area of another embodiment of the present invention.

FIG. 16 shows a front elevational view schematically illustrating an inside mirror assembly 310 according to an alternative embodiment of the present invention. Inside mirror assembly 310 may incorporate light-sensing electronic circuitry of the type illustrated and described in the above-referenced Canadian Patent No. 1,300,945, U.S. Pat. No. 5,204,778, or U.S. Pat. No. 5,451,822, and other circuits capable of sensing glare and ambient light and supplying a drive voltage to the electrochromic element.

Rearview mirrors embodying the present invention preferably include a bezel 344, which conceals and protects the spring clips (not shown) and the peripheral edge portions of the sealing member and both the front and rear glass elements (described in detail below). Wide varieties of bezel designs are well known in the art, such as, for example, the bezel disclosed in above-referenced U.S. Pat. No. 5,448,397. There is also a wide variety of known housings for attaching the mirror assembly 310 to the inside front windshield of an automobile; a preferred housing is disclosed in above-referenced U.S. Pat. No. 5,337,948.

The electrical circuit preferably incorporates an ambient light sensor (not shown) and a glare light sensor 360, the glare light sensor being capable of sensing glare light and being typically positioned behind the glass elements and looking through a section of the mirror with the reflective material partially removed in accordance with this particular embodiment of the present invention. Alternatively, the glare light sensor can be positioned outside the reflective surfaces, e.g., in the bezel 344. Additionally, an area or areas of the third surface reflective electrode, such as 346, may be partially removed in accordance with the present invention to permit a display, such as a compass, clock, or other indicia, to show through to the driver of the vehicle. The present invention is also applicable to a mirror which uses only one video chip light sensor to measure both glare and ambient light and which is further capable of determining the direction of glare. An automatic mirror on the inside of a vehicle, constructed according to this invention, can also control one or both outside mirrors as slaves in an automatic mirror system.

Figure 17:
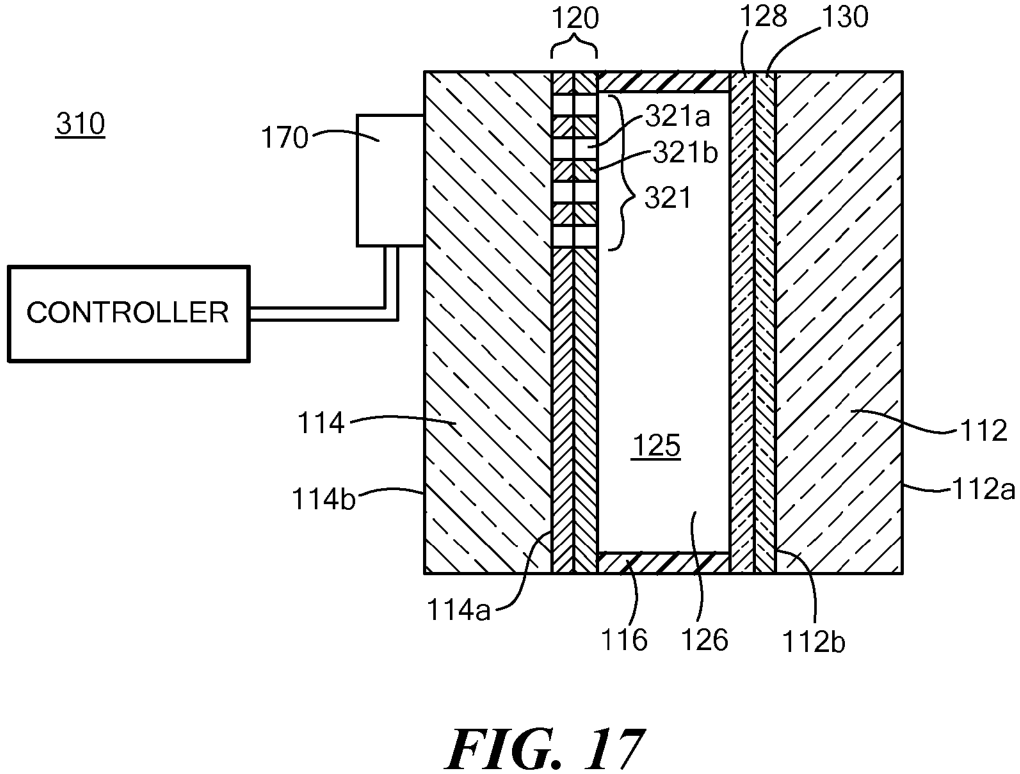
FIG. 17 is an enlarged cross-sectional view, with portions broken away for clarity of illustration, of the automatic rearview mirror illustrated in FIG. 16.

FIG. 17 shows a cross-sectional view of mirror assembly 310 along the line 17-17'. Like the above-described embodiments, mirror 310 has a front transparent element 112 having a front surface 112_a_ and a rear surface 112_b_, and a rear element 114 having a front surface 114_a_ and a rear surface 114_b_. Since some of the layers of the mirror are very thin, the scale has been distorted for pictorial clarity. A layer of a transparent electrically conductive material 128 is deposited on the second surface 112_b_ to act as an electrode. Transparent conductive material 128 may be any of the materials identified above for the other embodiments. If desired, an optional layer or layers of a color suppression material 130 may be deposited between transparent conductive material 128 and front glass rear surface 112_b_ to suppress the reflection of any unwanted portion of the electromagnetic spectrum.

At least one layer of a material that acts as both a reflector and a conductive electrode 120 is disposed on third surface 114_a_ of mirror 310. Any of the materials/multi-layer films described above may similarly be used for reflector/electrode 120. U.S. Pat. No. 5,818,625 entitled "DIMMABLE REARVIEW MIRROR INCORPORATING A THIRD SURFACE METAL REFLECTOR" and filed on or about Apr. 2, 1997, describes another reflector/electrode 120 in detail. The entire disclosure of this patent is incorporated herein by reference.

Figure 18:
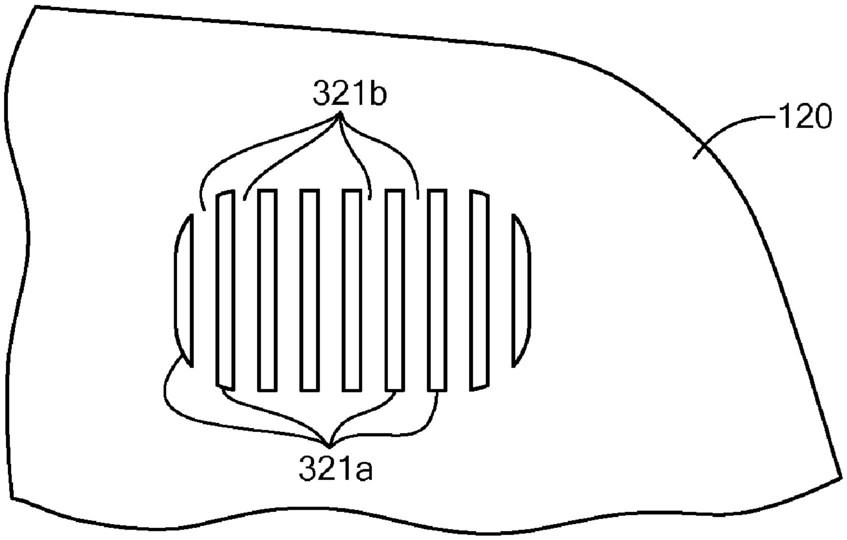
FIG. 18 is a front elevational view of the information display area, with portions broken away for clarity of illustration, of the automatic rearview mirror illustrated in FIG. 16.

In accordance with this embodiment of the present invention, a portion of conductive reflector/electrode 120 is removed to leave an information display area 321 comprised of a non-conducting area 321_a_ (to view a display) and a conducting area 321_b_ (to color and clear the electrochromic medium), as shown in FIG. 17. Although only shown in detail for the display area 321, the same design may be, and preferably is, used for the glare sensor area (160 in FIG. 16). FIG. 18 shows a front elevational view illustrating information display area 321. Again, since some of the layers of this area are very thin, the scales of the figures have been distorted for pictorial clarity. The portion of conductive reflector/electrode that is removed 321_a_ is substantially devoid of conductive material, and the portion not removed should be in electrical contact with the remaining area of reflector/electrode 120. That is to say, there are little or no isolated areas or islands of reflector/electrode 120 that are not electrically connected to the remaining portions of the reflector/electrode 120. Also, although the etched areas 321_a_ are shown as U-shaped (FIG. 17), they may have any shape that allows sufficient current flow through lines 321_b_ while allowing the driver to view and read the display 170 through etched areas 321_a_. The reflector/electrode 120 may be removed by varying techniques, such as, for example, by etching (laser, chemical, or otherwise), masking during deposition, mechanical scraping, sandblasting, or otherwise. Laser etching is the presently preferred method because of its accuracy, speed, and control.

The information display area 321 is aligned with a display device 170 such as a vacuum fluorescent display, cathode ray tube, liquid crystal, flat panel display and the like, with vacuum fluorescent display being presently preferred. The display 170, having associated control electronics, may exhibit any information helpful to a vehicle occupant, such as a compass, clock, or other indicia, such that the display will show through the removed portion 321_a_ to the vehicle occupant.

The area that is substantially devoid of conductive reflector/electrode 321_a_ and the area having conductive reflector/electrode present 321_b_ may be in any shape or form so long as there is sufficient area having conductive material to allow proper coloring and clearing (i.e., reversibly vary the transmittance) of the electrochromic medium, while at the same time having sufficient area substantially devoid of conductive material to allow proper viewing of the display device 170. As a general rule, information display area 321 should have approximately 70-80 percent of its area substantially devoid of conductive material 321_a_ and the conductive material 321_b_ filling the remaining 20-30 percent. The areas (321_a_ and 321_b_) may have a variety of patterns such as, for example, linear, circular, elliptical, etc. Also, the demarcation between the reflective regions and the regions devoid of reflective material may be less pronounced by varying the thickness of the reflective materials or by selecting a pattern that has a varying density of reflective material. It is presently preferred that areas 321_a_ and 321_b_ form alternating and contiguous lines (see FIG. 17). By way of example, and not to be construed in any way as limiting the scope of the present invention, the lines 321_b_ generally may be approximately 0.002 inch wide and spaced approximately 0.006 inch apart from one another by the lines substantially devoid of conductive material. It should be understood that although the figures show the lines to be vertical (as viewed by the driver), they may be horizontal or at some angle from vertical. Further, lines 321_a_ need not be straight, although straight vertical lines are presently preferred.

If all of the third surface reflector/electrode 120 is removed in the information display area 321 or in the area aligned with the glare light sensor 160, there will be significant coloration variations between those areas and the remaining portion of the mirror where the reflector/electrode 120 is not removed. This is because for every electrochromic material oxidized at one electrode there is a corresponding electrochromic material reduced at the other electrode. The oxidation or reduction (depending on the polarity of the electrodes) that occurs on the second surface directly across from the information display area 321 will occur uniformly across the area of the information display area. The corresponding electrochemistry on the third surface will not, however, be uniform. The generation of light-absorbing species will be concentrated at the edges of the information display area (which is devoid of reflector/electrode). Thus, in the information display area 321, the generation of the light-absorbing species at the second surface will be uniformly distributed, whereas the light-absorbing species at the third surface will not, thereby creating aesthetically unappealing color discrepancies to the vehicle occupants. By providing lines of reflector/electrode 120 areas throughout the information display area 321, in accordance with the present invention, the generation of light-absorbing species (at the second and third surfaces) in the information display area will be much closer to the uniformity seen in other areas of the mirror with completely balanced electrodes.

Although those skilled in the art will understand that many modifications may be made, the laser etching may be accomplished by using a 50 watt Nd:YAG laser, such as that made by XCEL Control Laser, located in Orlando, Fla. In addition, those skilled in the art will realize that the power settings, the laser aperture, the mode of the laser (continuous wave or pulsed wave), the speed with which the laser moves across the surface, and the wave form of the laser may be adjusted to suit a particular need. In commercially available lasers, there are various wave forms that the laser follows while it ablates the surface coatings. These wave forms include straight lines, sine waves at various frequencies and ramp waves at various frequencies, although many others may be used. In the presently preferred embodiments of the present invention, the areas devoid of reflective material 321_a_ are removed by using the laser in a pulsed wave mode with a frequency of about 3 kHz, having a narrow (e.g., around 0.005 inch) beam width where the laser is moved in a straight line wave form.

Figure 14A:
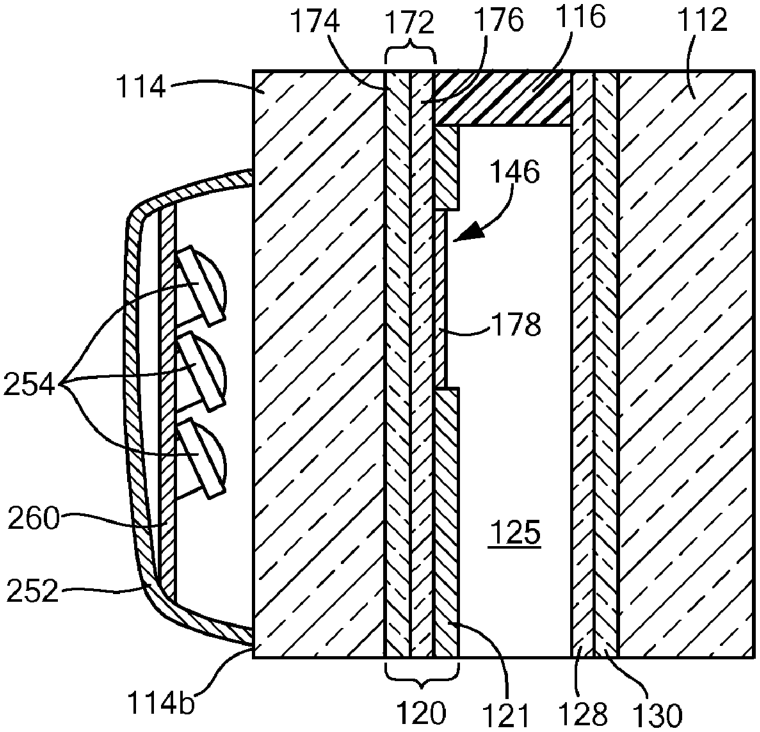
FIG. 14A is a partial cross-sectional view taken along line 14-14' of FIG. 12 illustrating one construction of the outside rearview mirror of the present invention.
Figure 14B:
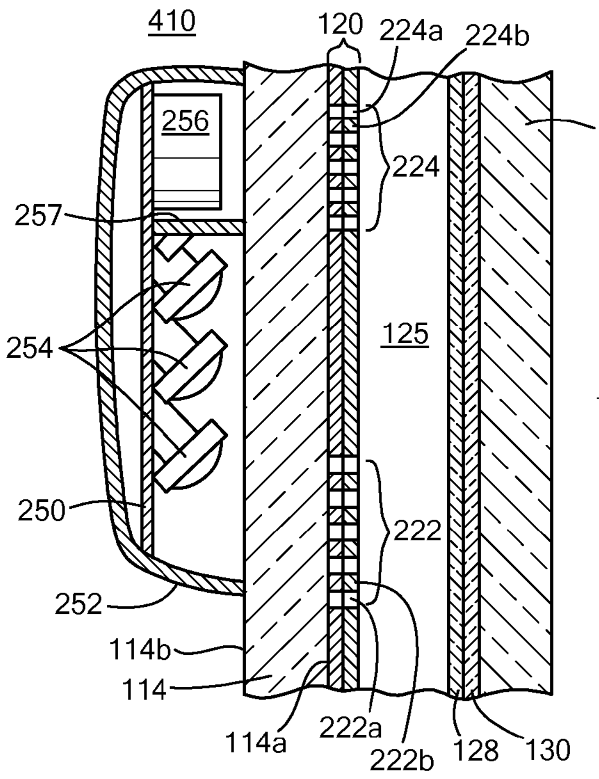
FIG. 14B is a partial cross-sectional view taken along line 14-14' of FIG. 12 illustrating a second alternative arrangement of the outside rearview mirror constructed in accordance with the second embodiment of the present invention.
Figure 14C:
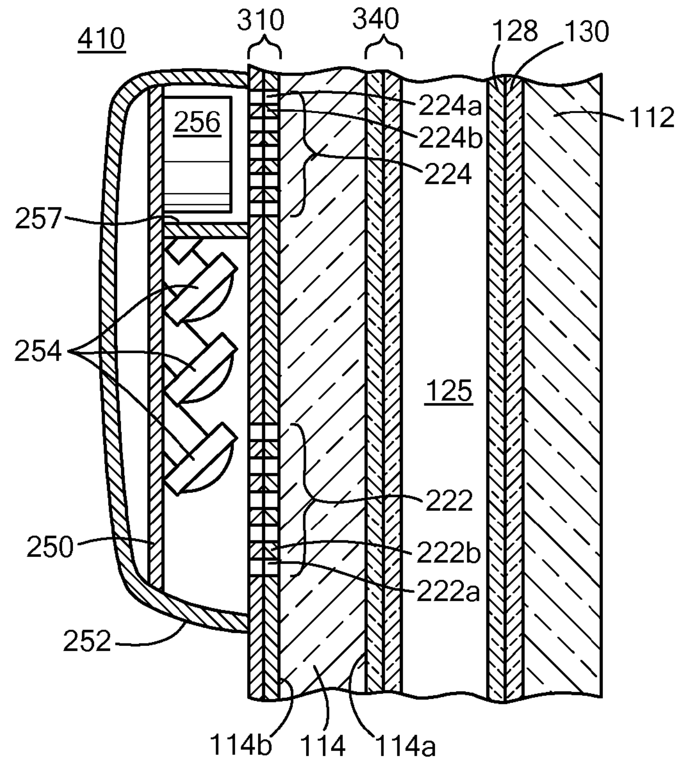
FIG. 14C is a partial cross-sectional view taken along lines 14-14' of FIG. 12 illustrating a third alternative arrangement of the outside rearview mirror constructed in accordance with the second embodiment of the present invention.

FIGS. 14B and 14C show two alternate arrangements for implementing the present invention. FIGS. 14B and 14C are partial cross-sectional views taken along lines 14-14' of FIG.

12. FIG. 14B shows an arrangement similar to that of the inside rearview mirror shown in FIG. 17 in which parallel lines of reflector/electrode material 222*b* are provided across the signal light area 222 by either etching out or masking lines 222*a* in regions that are devoid of the reflector/electrode material. Each of the signal light areas 222 is provided in a position on the rearview mirror corresponding and overlying one of LEDs 254 as apparent from a comparison of FIGS. 12 and 13. Electrochromic mirror 410 may be constructed in the same manner as described above for the inside rearview mirror 310 of the preceding embodiment. Specifically, mirror 410 includes a front transparent element 112 having a front surface and a rear surface, and a rear element 114 having a front surface 114*a* and a rear surface 114*b*. Mirror 410 also includes a layer 128 of a transparent conductive material deposited on the rear surface of front element 112 or on an optional color suppression material 130 that is deposited on the rear surface of front element 112. Additionally, mirror 410 includes at least one layer 120 disposed on a front surface 114*a* of rear element 314 that acts as both a reflector and a conductive electrode. An electrochromic medium is disposed in a chamber defined between layers 128 and 120. All of the component elements of mirror 410 may be made using the same materials and applied using the same techniques as described above with respect to the preceding embodiments. Preferably, however, the reflector/electrode material of layer 120 is made using nickel, chrome, rhodium, stainless steel, silver, silver alloys, platinum, palladium, gold, or combinations thereof.

The reflectance of the mirror in the signal light areas 222 or sensor area 224 may also be controlled by varying the percentage of those areas that are devoid of reflective material or by varying the thickness of the reflector/electrode coating. Further, the reflector/electrode material used to form lines 222*b* in signal light area may be different from the reflector/electrode material used for the remainder of the mirror. For example, a reflector/electrode material having a higher reflectance may be used in the signal light area such that the reflectivity in the signal light area is the same as that of the remainder of the mirror despite the regions therein that are devoid of reflector material. Preferably, the region of the signal light area that is devoid of reflective material constitutes between 30 and 50 percent of the signal light area and the area occupied by the reflective material is between 50 and 70 percent of the signal light area. To achieve these percentages, the lines of reflector/electrode material are preferably about 0.010 inch wide and the spaces between the lines are about 0.006 inch wide.

The arrangement shown in FIG. 14C differs from that shown in FIG. 14B in that the reflective material is formed on the fourth surface (i.e., the rear surface 114*b* of rear element 114). With such an arrangement, the electrode 340 on the third surface is preferably made of a transparent material similar to that of the electrode 128 formed on the rear surface of front element 112. Like the arrangement shown in FIG. 14B, the structure shown in FIG. 14C includes a signal light area 222 having alternating regions of reflective material 222*b* and regions devoid of such reflective material 222*a*. In this manner, LEDs 254 may be more covertly hidden from view by the driver and yet light from LEDs 254 may project through all the layers of electrochromic mirror 410 so as to be visible by drivers of other vehicles. Similarly, if a day/night sensor 256 is provided, a sensor area 224 may be provided in the same manner with alternating regions of reflective material 224*b* and regions that are void of reflective material 224*a*.

A benefit of utilizing the above-described structure in connection with a signal light is that the use of a dichroic coating may be avoided. Dichroic coatings are generally nonconductive and therefore cannot be used in an electrochromic mirror having a third surface reflector. Also, the only current dichroic coatings that are economically feasible are those that transmit red and infrared light and reflect other colors of light. Thus, to construct a practical signal light, only LEDs that emit red light may be utilized. Accordingly, there is little flexibility in this regard when a dichroic coating is utilized. To the contrary, with the structure of the present invention, any color signal light may be used.

The concept of providing a window region having alternating areas devoid of reflective material may similarly be applied to a non-electrochromic signal mirror. And although other materials may be used, chromium on the first or second surface of such a non-electrochromic mirror is the presently preferred reflective material.

Figure 14D:
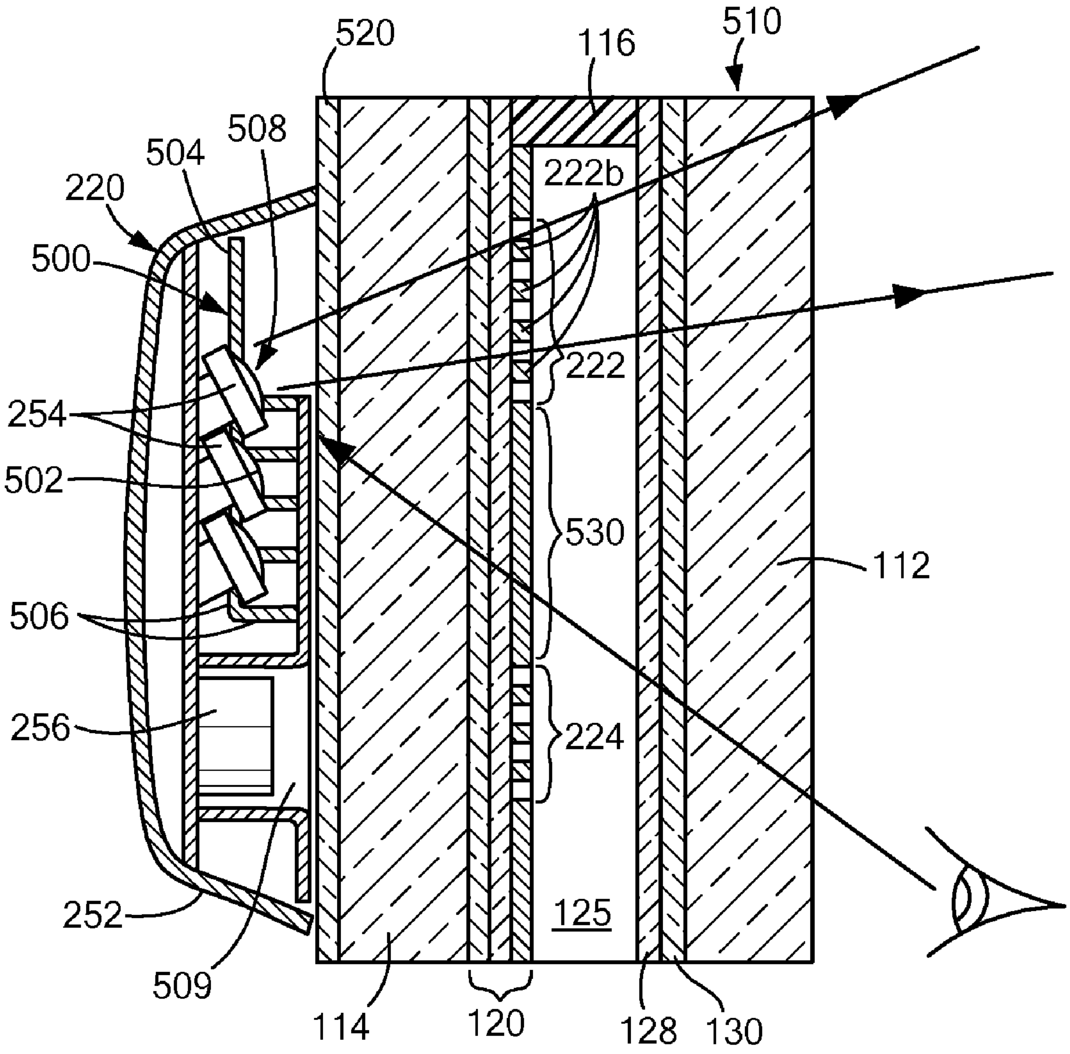
FIG. 14D is a partial cross-sectional view taken along lines 14-14' of FIG. 12 illustrating a fourth alternative arrangement of the outside rearview mirror constructed in accordance with another embodiment of the present invention.
Figure 19:
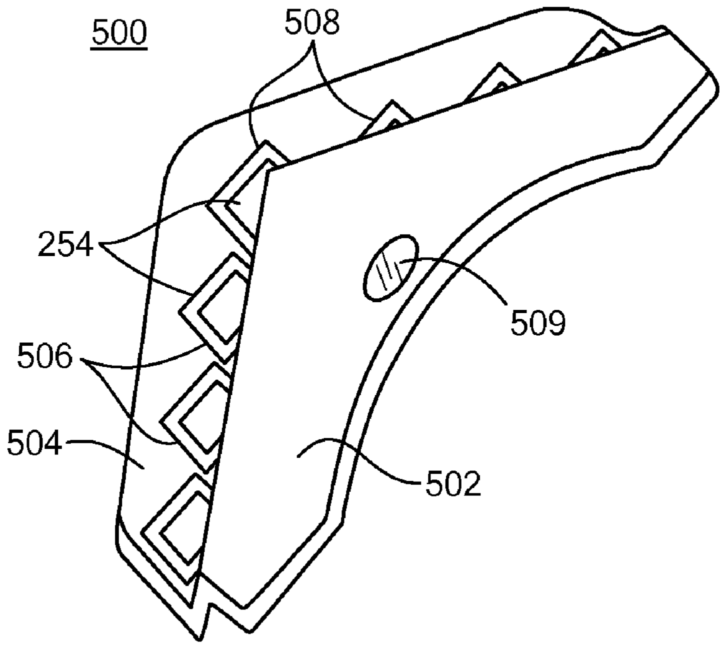
FIG. 19 is a perspective view of a signal light assembly for use with another embodiment of the present invention.

FIGS. 14D and 19 show yet another embodiment of the present invention as it pertains to signal mirrors. According to this embodiment, the signal mirror includes an additional structure for rendering the signal light more covert with respect to the field of view of the driver. While each of the embodiments relating to the signal mirrors discussed above covertly hides the signal light behind the mirror when they are not energized and generally hides the signal light when activated, there remains the possibility with such embodiments that the driver may be distracted during the periods in which the signal light is activated. Specifically, while the LEDs of the signal light are angled outward away from the driver's eyes, the driver may still be able to see the LEDs as points of light through portions of the mirror assembly. Accordingly, this embodiment provides means for reducing the transmission of light from the signal light through the mirror in the direction of the driver. As explained below, this additional means may take on several alternative or additive forms.

Referring to FIG. 14D, a construction is shown whereby a baffle assembly 500 is positioned between signal light assembly 220 and the rear surface of mirror assembly 510. The particular baffle assembly 500 shown in FIG. 14D includes a forward, upper plate 502 and a rearward, lower plate 504 fixed in spaced and parallel relation by a plurality of legs 506. As illustrated in FIGS. 14D and 19, lower plate 504 is laterally displaced relative to forward plate 502 in a more outward position away from the driver. Lower plate 504 includes a plurality of apertures 508 corresponding in size and position to each of LEDs 254. Upper plate 502 is disposed relative to aperture 508 and slightly over LEDs 254 so as to block the driver's view of LEDs 254. Upper plate 502 includes an aperture 509 through which light may pass so as to reach sensor 256. The spaces between upper plate 502 and lower plate 504 as well as apertures 508 in lower plate 504 provide a sufficient opening for light projected from the angled LEDs 254 to be transmitted through mirror 510 and into region C shown in FIG. 15. Baffle assembly 500, as shown, is preferably made of a black plastic or the like.

The functionality of baffle assembly 500 may be supplemented or alternatively performed by various other mechanisms designated generally in FIG. 14D by reference numeral 520. Specifically, element 520 may be any one or a combination of a light control film, a layer of black or dark paint, or a heater element. A light control film, such as that available from the 3M Company under the trade designation LCF-P, may be used, which is a thin plastic film enclosing a plurality of closely spaced, black colored microlouvers. Such a light control film is disclosed for use in a conventional signal mirror in U.S. Pat. Nos. 5,361,190 and 5,788,357, the disclosures of which are hereby incorporated by reference. As disclosed in those patents, such a light control film may have a thickness of 0.030 inches, with the microlouvers spaced approximately 0.005 inches apart. The microlouvers are typically black and are positioned at various angular positions to provide a suitable viewing angle. Such a light control film permits light from LEDs 254 to be transmitted at the appropriate viewing angle to reach region C (FIG. 15). The light control film also serves to block the light projected from LEDs 254 from travelling outside the appropriate viewing angle in the line of sight of the driver. Thus, unlike the baffle assembly 500 depicted in FIGS. 14D and 19, such a light control film may be placed completely over and in front of each of LEDs 254. Further, such a light control film could also be made using other forms of optical elements, such as holograms and the like.

If element 520 is a coating of an opaque paint, such a coating would not extend far enough in front of the LEDs to block light from LEDs 254 to be transmitted through mirror 510 into blind spot area C (FIG. 15). Alternatively, such a coating of paint could extend completely in front of LEDs 254, provided it was configured to have some form of louver or equivalent structure formed in its surface in the areas of the intended transmission path of LEDs 254. For example, the thickness of such a paint coating could be controlled to create effective louvers using screen-printing, molding, stamping, or laser ablation. Further, if reflector/electrode 120 is configured in the manner described above with respect to FIGS. 14B and 14C, element 520 could be a coating of black paint that has similar bars or stripes in the areas overlying LEDs 254 while having spatial relations relative to the bars 222*b* of reflector/electrode 120, so as to provide a transmission path at the appropriate angle for vehicles to view the lights when in the vehicle's blindspots, while blocking the light from the field of view of the driver. Further, as shown in FIG. 14D, the bars 222*b* of reflector/electrode 120 may be configured to have varying widths that decrease with increasing distance from the driver, so as to reduce peripheral transmittance through area 222 in the direction of the driver, or may have a less pronounced edge definition, as discussed above.

If element 520 is provided using a mirror heating element, the heating element could be provided to extend across the entire fourth surface of the mirror and have apertures formed in appropriate locations to allow light emitted from LEDs 254 to be transmitted at the appropriate angle.

Another mechanism for shielding the driver from light emitted from LEDs 254 is to increase the thickness of the reflector/electrode 120 in a region 530 corresponding to that of upper plate 502 thereby reducing the transmittance through that portion of reflector/electrode 120. Currently, such reflector/electrodes have a transmittance of approximately 1-2 percent. To sufficiently shield the driver from light transmitted from LEDs 254, reflector/electrode 120 preferably has a thickness in region 530 that reduces the transmittance therethrough to less than 0.5 percent, and more preferably to less than 0.1 percent.

Element 520 may additionally or alternately include various optical films, such as a prismatic or Fresnel film or a collimating optical element as described in U.S. Pat. No. 5,788,357 so as to collimate and direct the light emitted from LEDs 254 at the appropriate angle without also transmitting light in the direction of the driver.

As yet another possible solution, sidewalls 252 of light assembly 220 may be extended so as to space LEDs 254 further from the rear surface of mirror assembly 510, such that sidewalls 252 effectively block any light from LEDs 254 from being transmitted in the direction of the driver of the vehicle.

Although the structure shown in FIG. 14D shows mirror assembly 510 as including the reflector/electrode 120 as illustrated in the embodiment shown in FIG. 14B above, mirror assembly 510 could take on any of the other forms discussed above with respect to the embodiment described with respect to FIG. 14A or FIGS. 7A-7G.

Although the present invention has been described as providing a signal light that is used as a turn signal, it will be appreciated by those skilled in the art that the signal light could function as any other form of indicator or signal light. For example, the signal light could indicate that a door is ajar so as to warn drivers of approaching vehicles that a vehicle occupant may be about to open a door into oncoming traffic, or the light behind the mirror may be an indicator light to indicate that the mirror heaters have been turned on, that another vehicle is in a blind spot, that the pressure is low, that a turn signal is on, or that freezing/hazardous conditions exist.

While the signal light of the present invention has been described above as preferably being made of a plurality of LEDs, the signal light may nevertheless be made of one or more incandescent lamps, or any other light source, and an appropriately colored filter without departing from the spirit or scope of the present invention.

Figure 20:
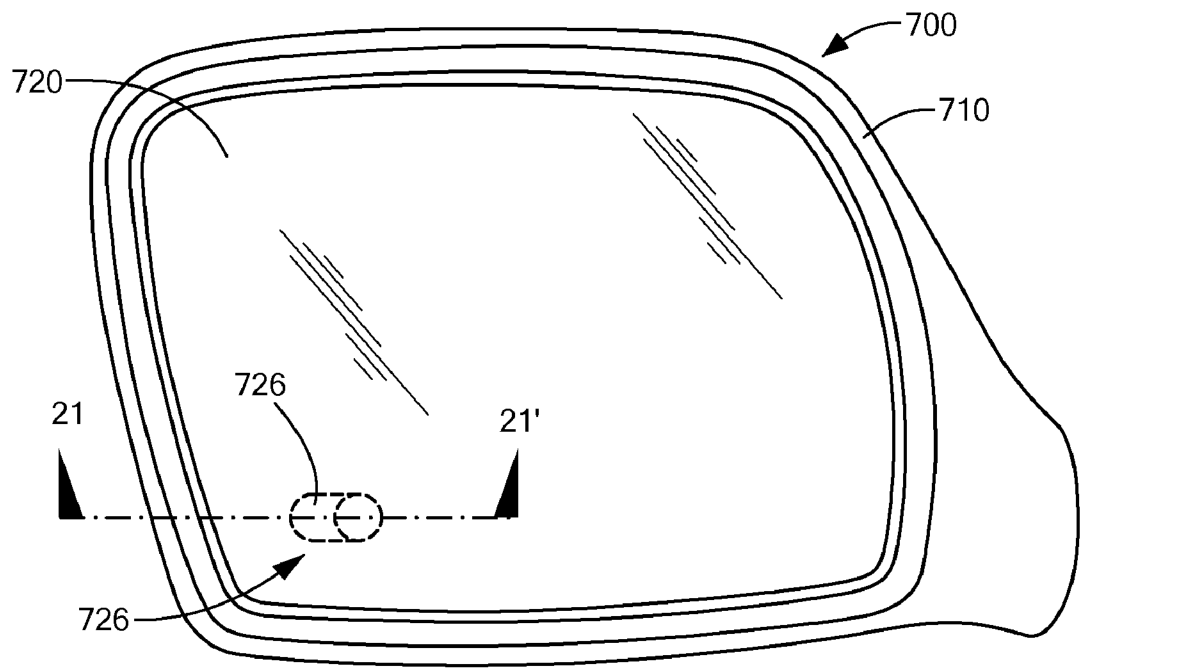
FIG. 20 is a front elevational view of an outside rearview mirror assembly constructed in accordance with another embodiment of the present invention.
Figure 21:
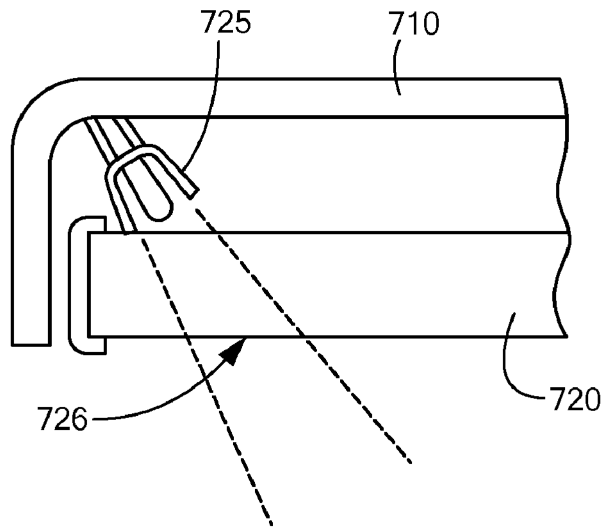
FIG. 21 is a partial cross-sectional view of the rearview mirror assembly shown in FIG. 20 taken along line 21-21'.
Figure 22:
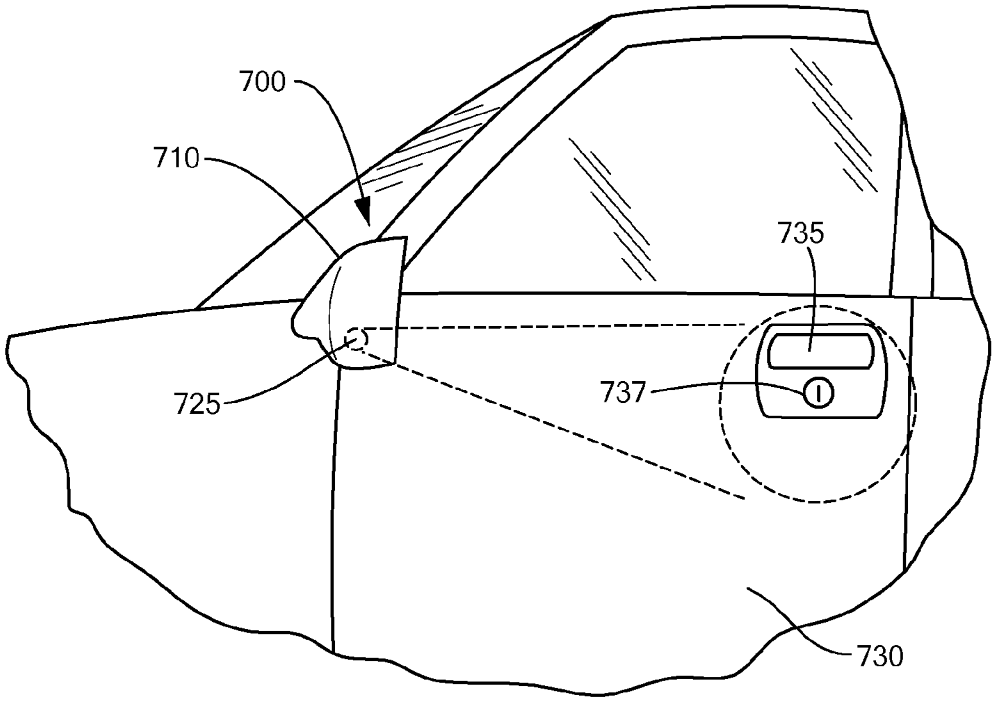
FIG. 22 is a perspective view of an exterior portion of an exemplary vehicle embodying the outside rearview mirror of the present invention as illustrated in FIGS. 20 and 21.

Yet another embodiment of the present invention is shown in FIGS. 20-22. In this embodiment, an exterior rearview mirror assembly 700 is provided having a housing 710 adapted for attachment to the exterior of a vehicle. Such mirrors are often mounted to the vehicle door 730 or to the A-pillar of the vehicle. Within housing 710 is a mirror structure 720 and a light source 725 mounted behind mirror structure 720. Mirror 720 may be constructed in accordance with any of the above-noted embodiments, such that light emitted from light source 725 may be projected through mirror 720. Mirror 720 may thus have a reflector having a masked window portion in front of light source 725 or may have a region 726 that is at least partially transmissive provided in front of light source 725. As yet another alternative, the region 726 in front of light source 725 may have a construction similar to that shown in FIG. 14 or the entire reflector in mirror 720 may be partially transmissive. As shown in FIGS. 21 and 22, light source 725 is preferably mounted such that it projects light onto a region of the vehicle door 730 on which the vehicle door handle 735 and lock mechanism 737 are provided. Lock mechanism 737 may be a keyhole or touch pad as commonly used to enable the vehicle doors to be locked or unlocked.

Light source 725 may be any type of light source, and is preferably a white light source. A preferred light source is disclosed in commonly-assigned U.S. Provisional Patent Application No. 60/124,493, entitled "SEMICONDUCTOR RADIATION EMITTER PACKAGE," filed on Mar. 15, 1999, by John K. Roberts, the entire disclosure of which is incorporated herein by reference.

Light source 725 may be activated so as to project light in response to the same actions to which the interior vehicle lights are turned on and off when providing illuminated entry into the vehicle. Thus, for example, light source 725 may illuminate a portion of door 730 when a person depresses the lock or unlock key on a key fob associated with the vehicle for remote keyless entry (RKE), when a person attempts to open the door, or when a person inserts a key into the lock mechanism 737. Alternatively, a motion sensor may be provided to activate light source 725. Preferably, light source 725 is disabled so as to be incapable of projecting light when the vehicle's ignition has been turned on.

By providing such a light source 725 within exterior rearview mirror housing 710, a light source may be mounted on the vehicle for illuminating the area on the exterior of the vehicle where a vehicle occupant must contact to enter the vehicle. Such a feature is advantageous when the vehicle is parked in particularly dark locations.

While light source 725 has been described as being mounted to project light at door handle 735, it will be appreciated that light source 725 could be mounted so as to project light also onto the ground region or other areas of the exterior of the vehicle as well as to the door handle. This could be accomplished by providing appropriate optics between light source 725 and mirror structure 720. Additional light sources could also be mounted so as to project light onto these areas.

The transflective (i.e., partially transmissive, partially reflective) rearview mirror described above allows the display of information to the driver without removing a portion of the reflective coating. This results in a more aesthetically pleasing appearance and allows the mirror to appear as a contiguous reflector when the display is off. An example of a display particularly suited to this application is a compass display.

Many mirrors are sold each year which have the added feature of displaying the heading of a vehicle using an alpha-numeric Vacuum Fluorescent Display (VFD) capable of displaying eight compass directions (N, S, E, W, NW, SW, NE, SE). These types of displays are used in many other applications in motor vehicles such as radios and clocks. These displays have a glass cover over the phosphor digit segments. When used with a transflective mirror, the majority of the light from the VFD is not transmitted through the mirror but reflected back to the display. A portion of this reflected light is then reflected off both the top and bottom surfaces of the cover glass of the VFD and back through the mirror. These multi-bounce reflections result is ghost or double images in the display which are highly undesired. As discussed above, a solution to this problem is to provide an anti-reflection coating on the cover glass of the VFD, however, such an anti-reflection coating adds to the cost of the display. Other disadvantages of VFD displays is that they are expensive and fragile.

An LED alpha-numeric display is a viable alternative to a vacuum fluorescent display for use in a transflective mirror. As discussed above, LED displays do not have a specular cover glass and thus do not suffer from ghost reflection problems. Additionally, the area surrounding the LEDs can be colored black to further aid in suppressing spurious reflections. LEDs also have the advantage of having extremely high reliability and long life. Segmented alpha-numeric LED displays are commercially available but are complicated to manufacture and it is difficult to maintain segment to segment brightness and color consistency. Finally, it is also difficult to prevent light from one segment from bleeding into another segment. LEDs are also only available in saturated highly monochromatic colors, with the exception of some phosphor-LED combinations, which are currently very expensive. Many automotive manufacturers have display color schemes which are more broad spectrum and difficult, if not impossible to match with LED technologies. Most cars manufactured in the United States have a blue display color scheme, which could only be matched with blue LEDs which are currently very expensive.

An alternative to a segmented LED or VFD display is described below that overcomes the above problems associated with LEDs and VFDs. While the following description is related to a compass display, the concepts could readily be extended to a variety of information displays, such as a temperature display and various warning lights. The compass display is used as an example in the preferred embodiment because it best illustrates the features and advantages of the invention. Also, the following description will concentrate on the use of LEDs as the preferred light source. However, many other light sources are also applicable, such as incandescent bulbs or new emerging technologies such as light emitting polymers and organic LEDs. The graphical, rather than alpha-numerical, nature of this display clearly distinguishes it from other alpha-numerical displays in a vehicle (such as the clock, etc.). Therefore, it will not look undesirable if this display does not match the color scheme of the VFD displays throughout the vehicle, allowing the use of more efficient and cost effective displays. In fact, the contrasting colors of the display should contribute to the aesthetics of the vehicle interior.

Figure 23A:
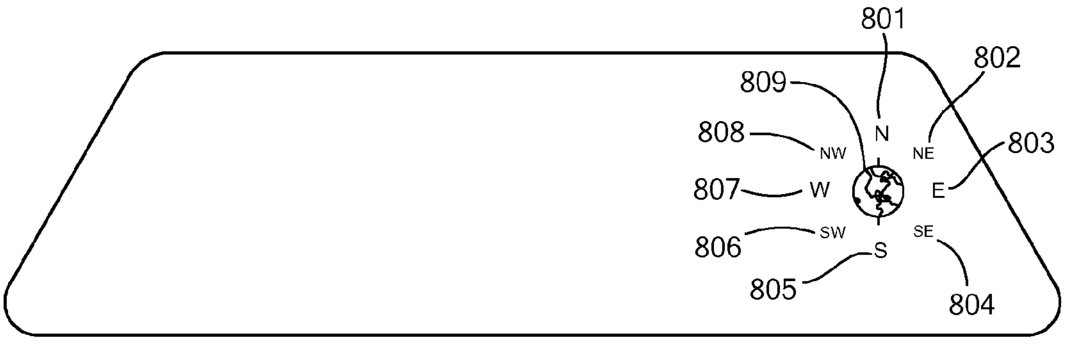
FIG. 23A is a front perspective view of a mask bearing indicia in accordance with another aspect of the present invention.
Figure 23B:
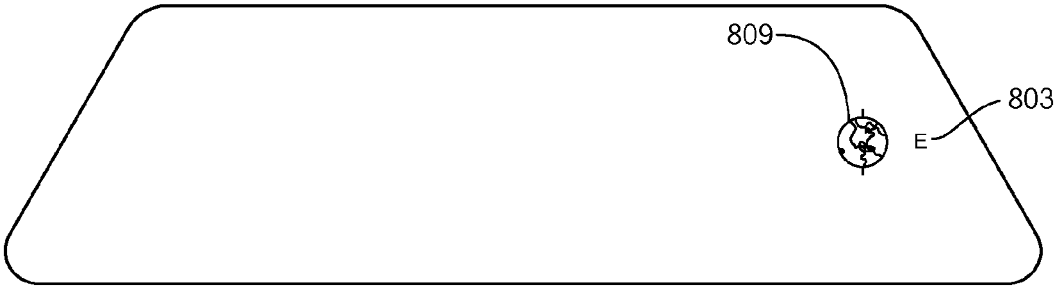
FIG. 23B is a front perspective view of a rearview mirror constructed in accordance with another aspect of the present invention.

The display in the preferred embodiment consists of multiple LEDs, a graphical applique masking layer, and a transflective mirror. A front view of the masking layer is shown in FIGS. 23A and 23B. The graphical applique shows eight points of a compass (801-808). The applique in FIG. 23A includes all eight directions, however, only one of the eight directions, as shown in FIG. 1*b*, will be lit depending on the direction of travel. The region of the mirror containing the other directions will be reflective and not indicate any content. A center graphic (809) may be an emblem, such as the globe in FIGS. 23A and 23B, can be added for cosmetic appeal. The globe can be illuminated by an LED of a color contrasting the color of the direction indicators.

Various methods of controlling the segments are contemplated. In the simplest form, only one of the LEDs behind the eight compass direction indicators is illuminated at a given time, depending on the direction of travel. In another scheme, all eight indicators are lit dimly and the indicator corresponding to the current direction of travel is lit more brightly than the other eight. In yet another scheme, bicolor LEDs are used and the LED indicator corresponding to the current direction of travel is set to a different color than the other eight. A final alternative would be to have only the indicator corresponding to the current direction of travel lit, but gradually fade from one indicator to another as the car changes directions.

Figure 24:
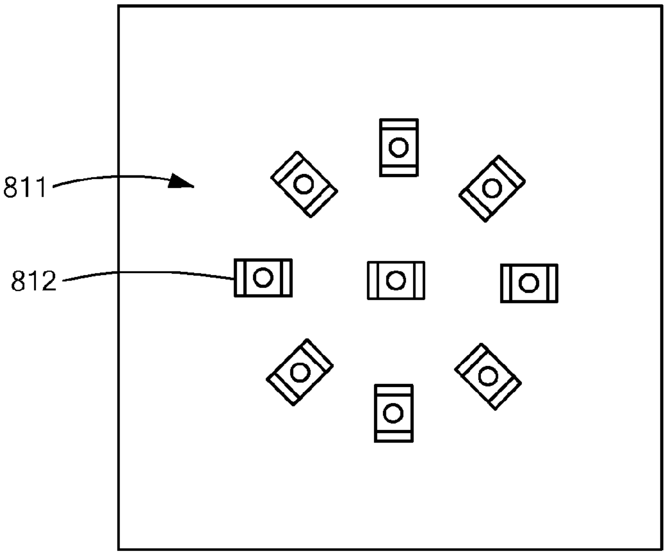
FIG. 24 is a front perspective view of a circuit board containing a plurality of light sources arranged in a configuration useful as a display in accordance with one aspect of the present invention.
Figure 25:
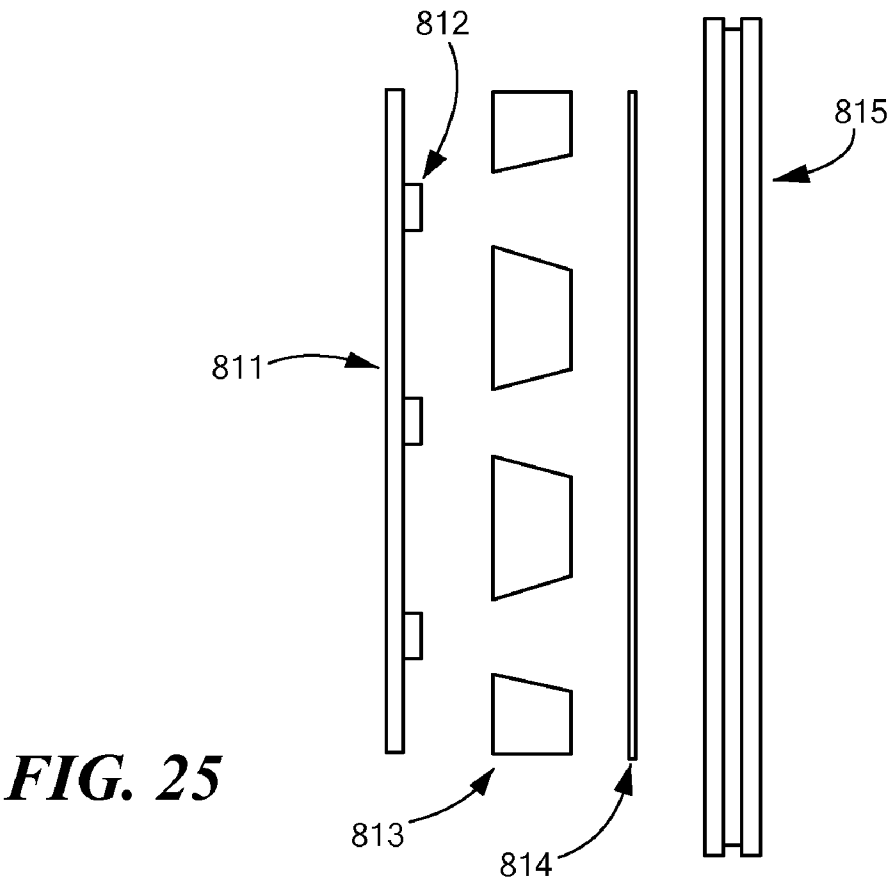
FIG. 25 is a cross-sectional view of a display and mirror constructed in accordance with one aspect of the present invention.

The construction of the display is described with reference to FIGS. 24 and 25. FIG. 24 shows the arrangement of LEDs on a circuit board and FIG. 25 shows an exploded view of the display assembly. The LEDs (812) are arranged on a circuit board (811) in a pattern corresponding to the locations of the indicators and center graphic. LEDs (812) may be of the type trade named "Pixar" by Hewlett Packard. Due to the loss of light in the transflective coating, bright LEDs are needed. AlInGaP based LEDs are suitable for this application and are available in greed, red, amber, and various similar colors. Blue and green colors can be achieved by using InGaN LEDs. Although InGaN LEDs are currently expensive, there are many fewer LEDs needed than would be used in a segmented display. As an alternative to using packaged LEDs such as the "Pixar" LED, they can be bonded to the circuit board directly using a technique commonly known in the industry as Chip-On-Board.

The circuit board (811) is positioned behind the mirror using spacer (813). The spacer (813) serves multiple purposes. First, the spacer positions the circuit board a distance from the mirror, ¼ inch for example, such that the light from the LED fully covers the indicator. Second, the spacer prevents cross talk between indicators by preventing light from one cavity from entering another cavity. To achieve this, the spacer should be made from a white, highly reflective material. At the least, the spacer must be opaque. Finally, the spacer serves to help reflect light exiting the LED at high angles back towards the indicator. This improves the efficiency of the system. The spacer may even be constructed with a parabolic bowl surrounding the LED to most effectively direct light forward. A lambertian scattering surface on the spacer will also help diffuse the light and improve the uniformity of the indicator illumination. The empty region between the circuit board (811) and the mirror (815) formed by the openings in the spacer (813) may be filled with an epoxy or silicone containing a diffusant. This will help further diffuse the light and help the indicators appear more uniform.

An applique (814) is provided in a masking layer made of a thin material which has a black matte mask covering all areas but the graphical indicators. The regions for the graphic are a clear or somewhat white and diffuse. The applique may be formed by silk-screening the black mask pattern onto a film of diffuse plastic. Preferably, the side of the applique facing the LEDs is also screened with a white ink. This will allow light which does not pass through the letters or graphical region to reflect back onto the LED and spacer where it may then partially reflect back forward. Alternatively, the applique can be formed by directly silk screening the black mask onto the back surface of mirror (815). The manner by which such an applique may be constructed is disclosed in U.S. Pat. No. 6,170,956, entitled "REARVIEW MIRROR DISPLAY," filed on May 13, 1999, by Wayne J. Rumsey et al, the entire disclosure of which is herein incorporated by reference and further described below.

Figure 26:
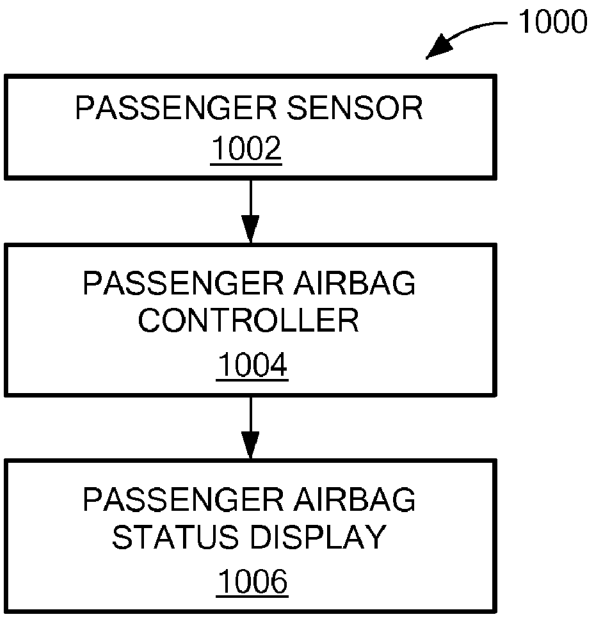
FIG. 26 is a schematic diagram of a vehicle sensor and display system in accordance with an embodiment of the present invention.

FIG. 26 is a schematic diagram illustrating a vehicle sensor and display system 1000 in accordance with an embodiment of the present invention. The system 1000 includes a passenger sensor 1002, a passenger air bag controller 1004, and a passenger air bag status display 1006. Alternatively, the display system could include a manual air bag shutoff switch in place of, or in addition to, the passenger sensor 1002 and the air bag controller 1004.

The passenger sensor 1002 is used to determine whether a passenger is located at a particular position in a vehicle. For example, the passenger sensor 1002 may be used to determine whether a passenger is seated in the right front passenger seat of a car or the like. The passenger sensor 1002 may be used to determine the approximate size of a passenger in order to allow deactivation of the passenger's air bag if the passenger is less than a particular size. The sensor 1002 may also be used to determine whether an infant or child seat is present and to deactivate the air bag if such an infant or child seat is detected. Examples of suitable passenger sensors 1002 include conventional infrared sensors, pressure sensors, and the like.

As shown in FIG. 26, the passenger sensor 1002 is connected to the passenger air bag controller 1004. Based on the signal provided by the passenger sensor 1002, the controller 1004 switches the passenger air bag on when a suitable size person is positioned in the passenger seat, and switches the air bag off when there is no passenger in the seat. Alternatively, the air bag status display 1006 may be connected directly to the passenger sensor 1002. Furthermore, the air bag display 1006 may be connected to a manual air bag shutoff switch (not shown). The passenger air bag controller 1004 is connected to the passenger air bag status display 1006, as schematically shown in FIG. 26.

In accordance with the present invention, the passenger air bag status display 1006 is located on a rearview mirror assembly. The display 1006 may include any suitable indicia which alerts occupants of the vehicle that the passenger air bag is either active or inactive. For example, the display 1006 may illuminate the words "PASSENGER AIR BAG OFF" when the passenger air bag has been deactivated by the controller 1004 or by a manual switch. Alternatively, the display 1006 may include any other symbols and/or alphanumeric characters, which adequately convey information concerning the status of the passenger air bag to at least one occupant of the vehicle.

In accordance with the preferred embodiment of the present invention, the display 1006 is located on the interior rearview mirror assembly of a vehicle. Vehicle drivers generally look at the interior rearview mirror very frequently. This frequent use makes the interior rearview mirror an optimal location for the display of critical safety information, such as air bag status. By displaying safety information on the interior rearview mirror assembly, the driver or other occupants of the vehicle may be alerted to critical information, which could otherwise go unnoticed.

Examples of suitable displays include LED, vacuum-fluorescent, and LCD displays. The display may comprise a filter with words such as "AIR BAG," an air bag symbol displayed on a surface which would become visible, more apparent, or change color when the display is illuminated or backlighted, or an indicator light or series of lights in a location relative to a symbol or text indicative of an air bag, which would announce the activation or deactivation of the air bag system by a change of status or color of the light(s). These indicators and displays could be located on the assembly supporting and encasing the mirror, in a module supported by but not integral with the mirror assembly, or in the mirror surface, as more fully described below.

Figure 27:
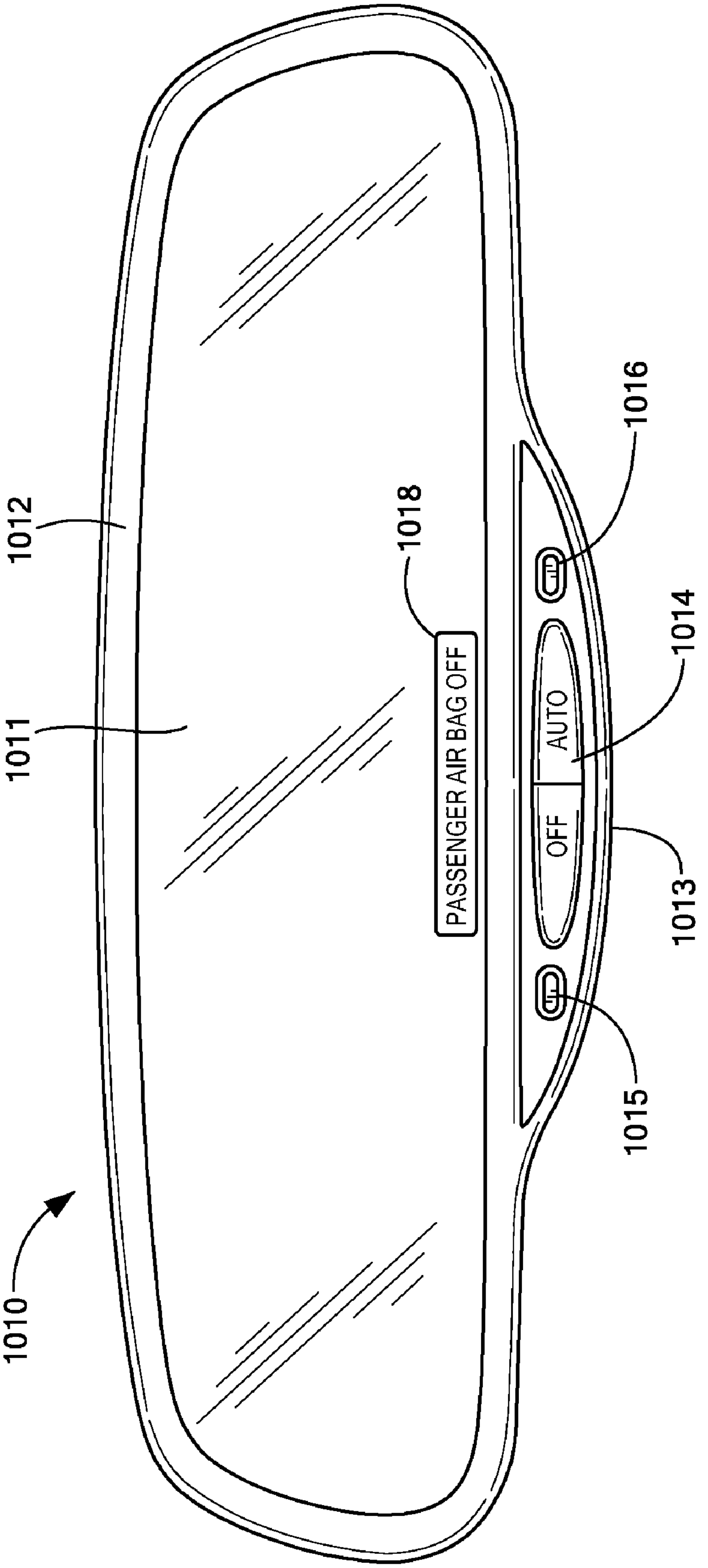
FIG. 27 is a front elevational view of a rearview mirror including a passenger air bag status display in accordance with an embodiment of the present invention.

FIG. 27 is a front elevational view of a rearview mirror 1010 in accordance with an embodiment of the present invention. The rearview mirror 1010 includes a mirror surface 1011 surrounded by a bezel 1012. In the embodiment shown in FIG. 27, the rearview mirror 1010 is an automatic interior electrochromic mirror. However, other types of rearview mirrors including exterior mirrors and prismatic interior mirrors may be provided in accordance with the present invention.

As shown in FIG. 27, a chin 1013 is located at the bottom of the bezel 1012. A switch 1014 may be provided inside the chin 1013 in order to turn the automatic electrochromic rearview mirror 1010 on or off. A conventional light sensor 1015 may be located in the chin 1013 or at any other suitable location. In addition, an indicator 1016 located in the chin 1013 is used to indicate whether the electrochromic rearview mirror 1010 is on or off. Typically, the indicator 1016 includes a light, which is illuminated when the electrochromic rearview mirror 1010 is on.

In the embodiment of FIG. 27, a passenger air bag status display 1018 is located in the mirror surface 1011. The display 1018 includes the words "PASSENGER AIR BAG OFF." However, any other suitable symbolic or alphanumeric indicia which adequately convey the status of the passenger air bag may be used.

In the case of the mirror surface display 1018, any suitable display can be located in or behind the mirror for viewing through the mirror assembly. The display 18 may comprise a substantially transparent section in the mirror. Part or the entire reflective surface may be removed from a selected area. An indicator light source is positioned behind the selected area. Removal of any other opaque elements in the aforementioned area are also desirable so that the indicator or display can be viewed through the mirror. The removal of the reflective surface could create an indicator graphic pattern where desired. For example, the words "PASSENGER AIR BAG OFF" could be etched away from the reflective surface partially or completely to allow transmission of light from a light source through the graphic pattern to thereby indicate the status of the air bag system.

Figure 28:
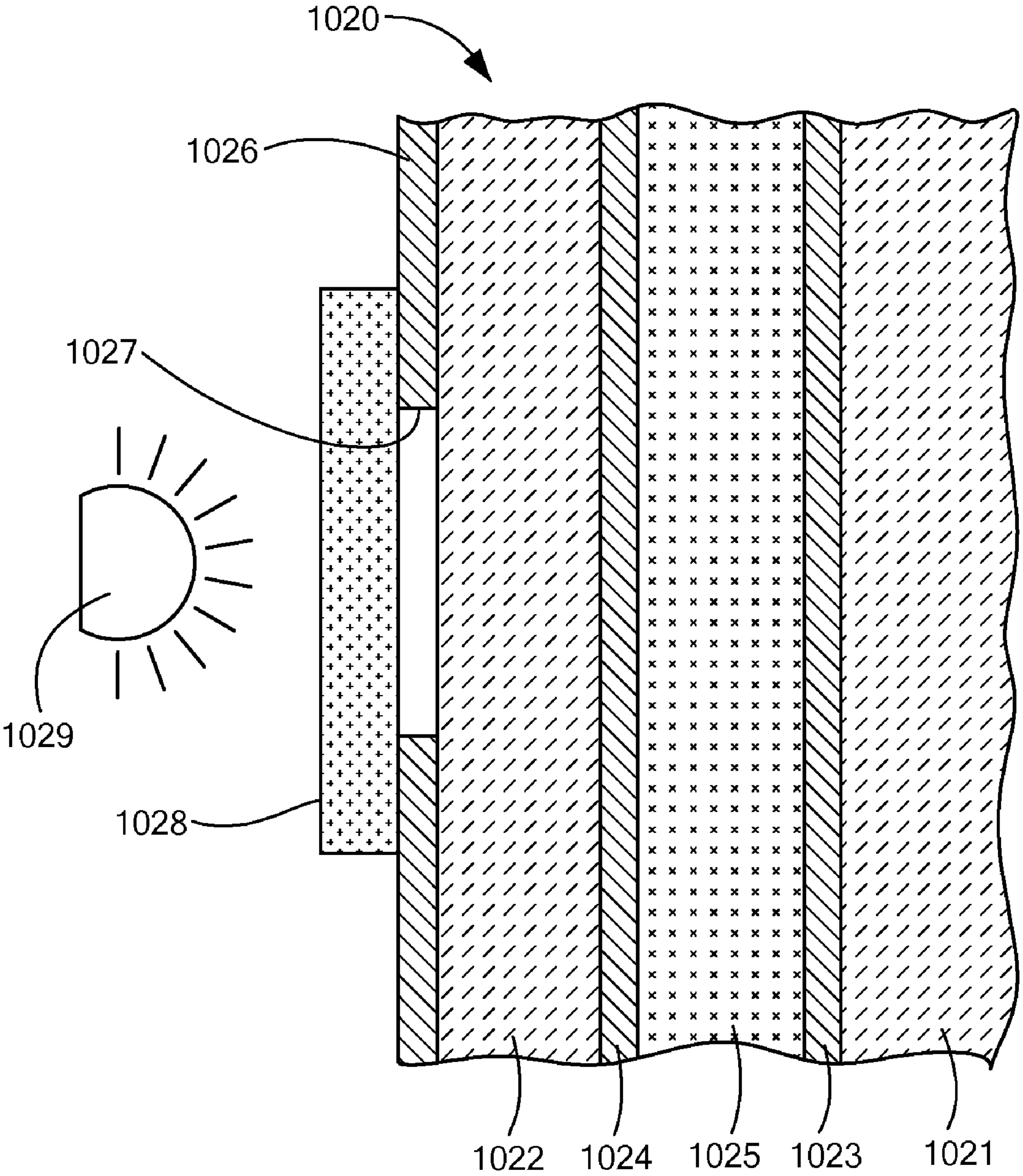
FIG. 28 is a partially schematic, side-sectional view illustrating a rearview mirror display in accordance with an embodiment of the present invention.

FIG. 28 is a partially schematic side sectional view showing one type of rearview mirror display assembly 1020 that may be used in the rearview mirror 1010 of FIG. 27. The rearview mirror display assembly 1020 includes a first glass sheet 1021 which forms a viewing surface facing the occupant of a vehicle. The viewing surface of the first glass sheet 1021 may be smooth or may be provided with a matte texture. A second glass sheet 1022 is spaced from the first glass sheet 1021. A substantially transparent, electrically conductive layer 1023 covers the interior side of the first glass sheet 1021, while another substantially transparent, electrically conductive layer 1024 covers the interior of the second glass sheet 1022. An electrochromic composition 1025 fills the gap between the glass sheets 1021 and 1022. A reflective layer 1026 made of any suitable material, such as silver, is provided on the surface of the second glass sheet 1022. The display assembly 1020 is thus provided as a part of an electrochromic rearview mirror. The various components of the electrochromic rearview mirror may be arranged and constructed as disclosed in the previously cited U.S. patents incorporated herein by reference.

As shown in FIG. 28, a portion of the reflective layer 1026 is removed from the glass sheet 1022 in order to provide an opening 1027. An indicia panel 1028 covers the opening 1027. A light source 1029 is arranged such that upon illumination, light travels through the indicia panel 1028, opening 1027, and the remaining layers 1021-1025 of the electrochromic mirror assembly toward the occupant of the vehicle. The indicia panel 1028 may be unmarked or may comprise any desired indicia, such as alphanumeric symbols or the like. The indicia panel 1028 may optionally comprise a color filter. The light source 1029 may comprise any suitable type of illuminator, such as an LED, LCD, vacuum-fluorescent element, incandescent light, or the like.

The display 1018 may thus be part of the silver coating that is etched/removed to form the individual letters or components of the graphics through which the light would pass to illuminate the lettering or graphics. The display 1018 may further comprise lettering or graphics printed or otherwise applied to a cleared area in the silver where the graphics or lettering would be of a design to show contrast when illuminated. The graphics or display can be separate from the mirror element mounted behind the element, such as a conventional LCD display, a vacuum-fluorescent display, a static mask through which light will pass to display graphics or lettering, or other display types.

A color filter may optionally be included between the display light source and the viewer, such as a color filter printed or bonded to the mirror surface, or a filter installed on the light source, or at any point therebetween. The light source could also be of a bandwidth narrower than full-spectrum visible light for the purpose of displaying a distinctive color through the display graphics to indicate the status of the air bag system.

In versions requiring removal of some of the silver surface, a portion rather than all of the silver can be removed in an area and still allow the display to be seen. One method is to remove a pattern, such as a grid. This allows conduction across a substantial amount of the surface facilitating coloring and clearing of the electrochromic substance in that area proportional to the rest of the element. Another method is to allow breaks in letters and graphics to avoid closed islands in the surface.

In the embodiment of FIG. 27, the surface of the display 18 is flush with the surface of the mirror 1010. Alternatively, the surface of the display 18 may be non-planar. For example, the surface of the display 18 may comprise a convex arc extending from the surface of the mirror 1010.

In accordance with a preferred embodiment of the present invention, a non-planar display is provided on a rearview mirror assembly. As used herein, the term "non-planar display" means a display having a contoured exterior viewing surface instead of a flat exterior surface. Preferred non-planar contoured display surfaces include curved or faceted convex configurations.

Figure 29:
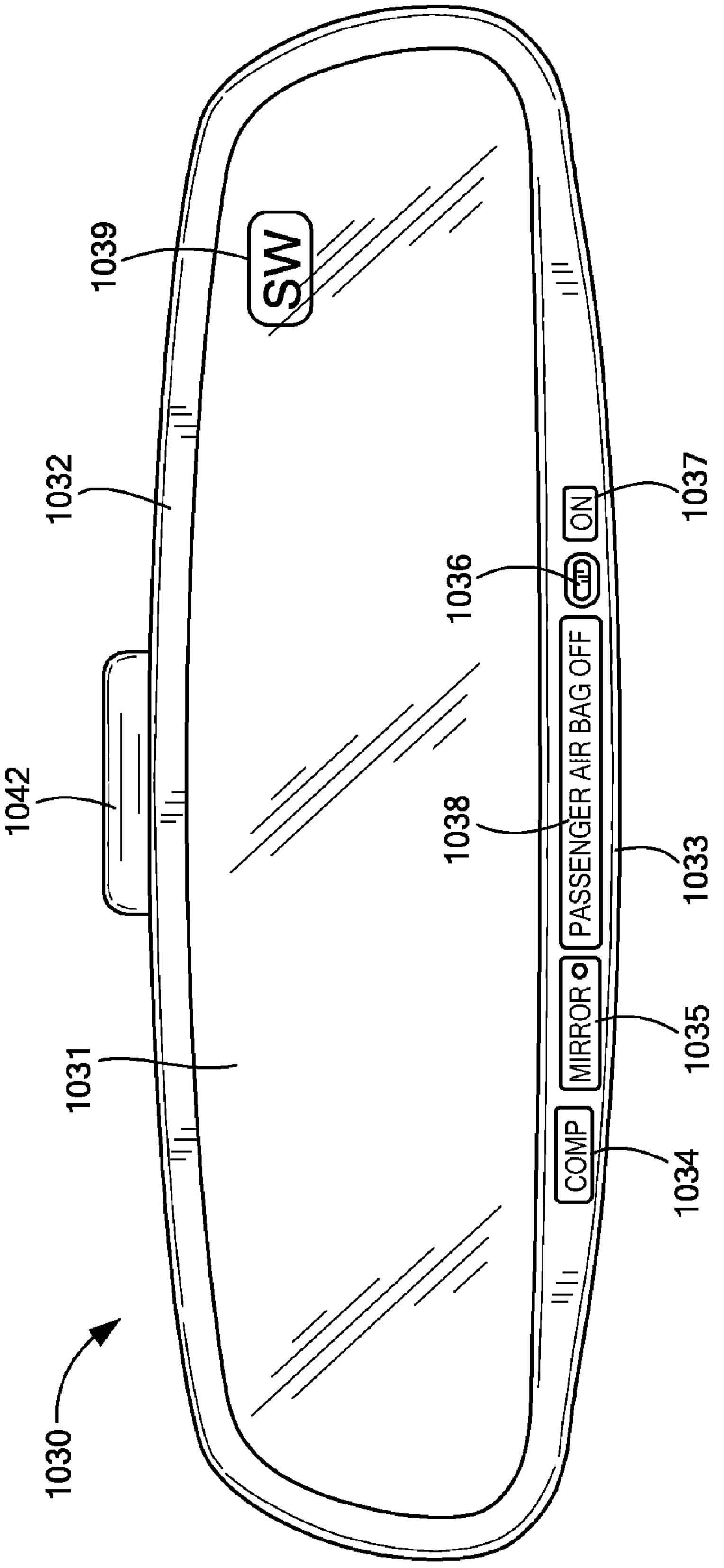
FIG. 29 is a front elevational view of a rearview mirror including a non-planar display in accordance with another embodiment of the present invention.
Figure 30:
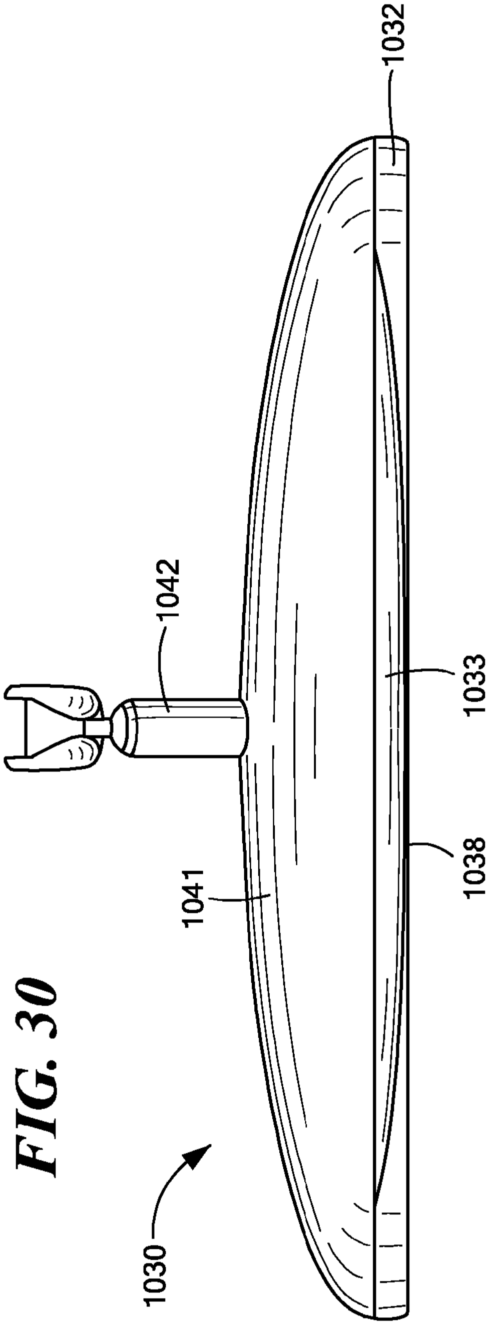
FIG. 30 is a bottom view of the rearview mirror of FIG. 29.
Figure 31:
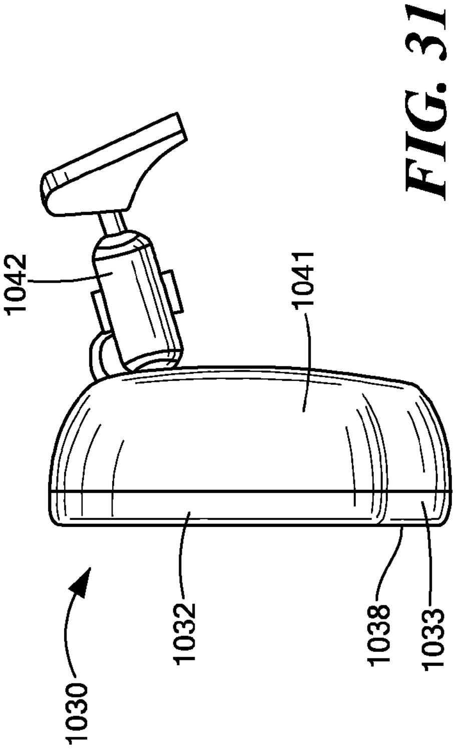
FIG. 31 is a side view of the rearview mirror of FIG. 29.

FIGS. 29-31 illustrate a rearview mirror 1030 having a non-planar display in accordance with a preferred embodiment of the present invention. The rearview mirror 1030 is an automatic electrochromic mirror including a mirror surface 1031 and a bezel 1032. Although an electrochromic mirror is shown in FIGS. 29-31, other types of mirrors, such as prismatic rearview mirrors, are within the scope of the present invention. A contoured chin 1033 having a curved front face is located at the bottom of the bezel 1032. The contoured chin 1033 houses a compass switch 1034, a mirror switch 1035, a light sensor 1036, and an on/off indicator 1037. In this embodiment, a non-planar display 1038 is located in the chin 1033. As shown most clearly in FIG. 30, the surface of the non-planar display 1038 is convex and conforms to the contoured surface of the chin 1038.

The use of a convex non-planar display 1038 provides substantially improved viewability of the information provided by the display. The curved exterior surface of the display 1038 essentially prevents unwanted glare from surrounding light sources and provides improved viewability to occupants of the vehicle. For example, both the driver and front passenger(s) of the vehicle can readily see the information provided by the display 1038 without obstruction. In a preferred embodiment, the non-planar surface of the display 1038 has a matte texture in order to further reduce unwanted glare.

A display, such as a vacuum-fluorescent, LCD, LED, or the like, may be mounted in the bezel or, preferably, behind a filter in the bezel. A static display may simply be illuminated or the illumination color changed to display information. This display offers several possible configurations. A preferred display comprises an opening in the bezel and a mask or label with graphics and/or lettering printed onto the surface to allow light to pass through the lettering or graphics portion of the label. Lettering or graphics molded or embossed into the bezel through which light could pass to illuminate the lettering or graphics may be used. A translucent bezel or portion of the bezel on which the graphics could be painted or printed to allow light to pass through only select parts may also be used. Furthermore, printed or molded graphics or lettering with a corresponding translucent or open section through which light could pass to indicate status may be used. In addition, a status display of graphics and/or lettering with a corresponding light which illuminates or changes color may be used.

In the embodiment shown in FIGS. 29-31, the rearview mirror 1030 includes a compass reading 1039, which indicates the direction in which the vehicle is oriented. The compass switch 1034 may be used to turn the compass reading 1039 on and off. As shown most clearly in FIGS. 30 and 31, the rearview mirror 1030 includes a housing 1041 and a conventional mounting bracket 1042. However, other mounting methods can be used.

Figure 32:
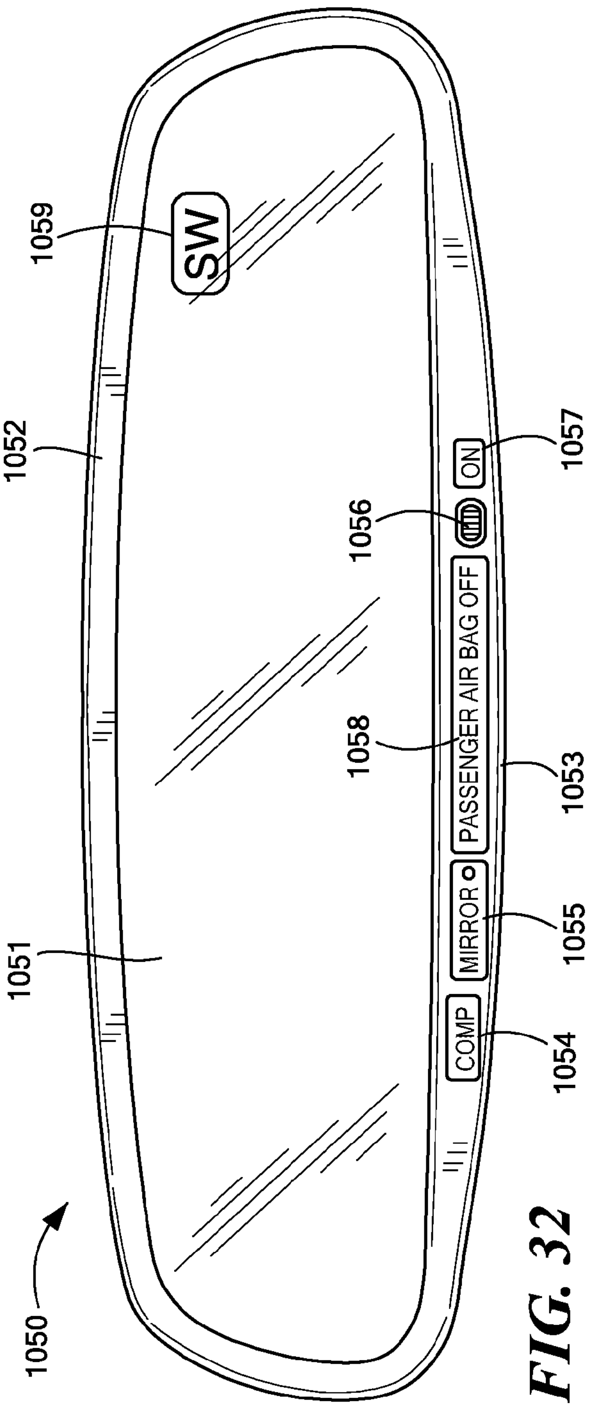
FIG. 32 is a front elevational view of a rearview mirror including a non-planar display in accordance with a further embodiment of the present invention.
Figure 33:
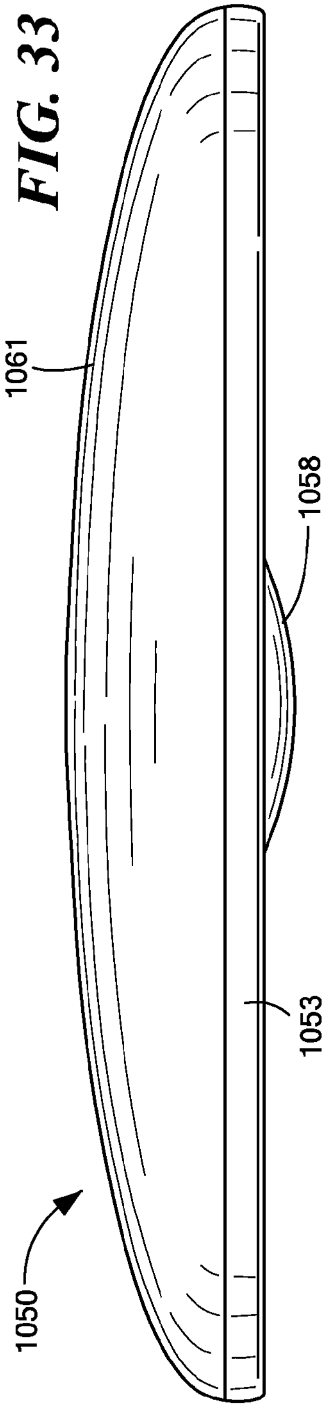
FIG. 33 is a bottom view of the rearview mirror of FIG. 32.

FIGS. 32 and 33 illustrate a rearview mirror 1050 in accordance with another embodiment of the present invention. The electrochromic rearview mirror 1050 includes a mirror surface 1051 and a surrounding bezel 1052. A chin 1053 having a generally planar front face extends from the bottom of the bezel 1052. The chin 1053 houses a compass switch 1054, a mirror switch 1055, a light sensor 1056, and an on/off indicator 1057. A convex non-planar display 1058 extends from the surface of the chin 1053. A compass display window 1059 is provided in the mirror surface 1051. The rearview mirror 1050 also includes a housing 1061. The convex surface of the non-planar display 1058 shown in FIGS. 32 and 33 substantially improves visibility of the displayed message.

Figure 34:
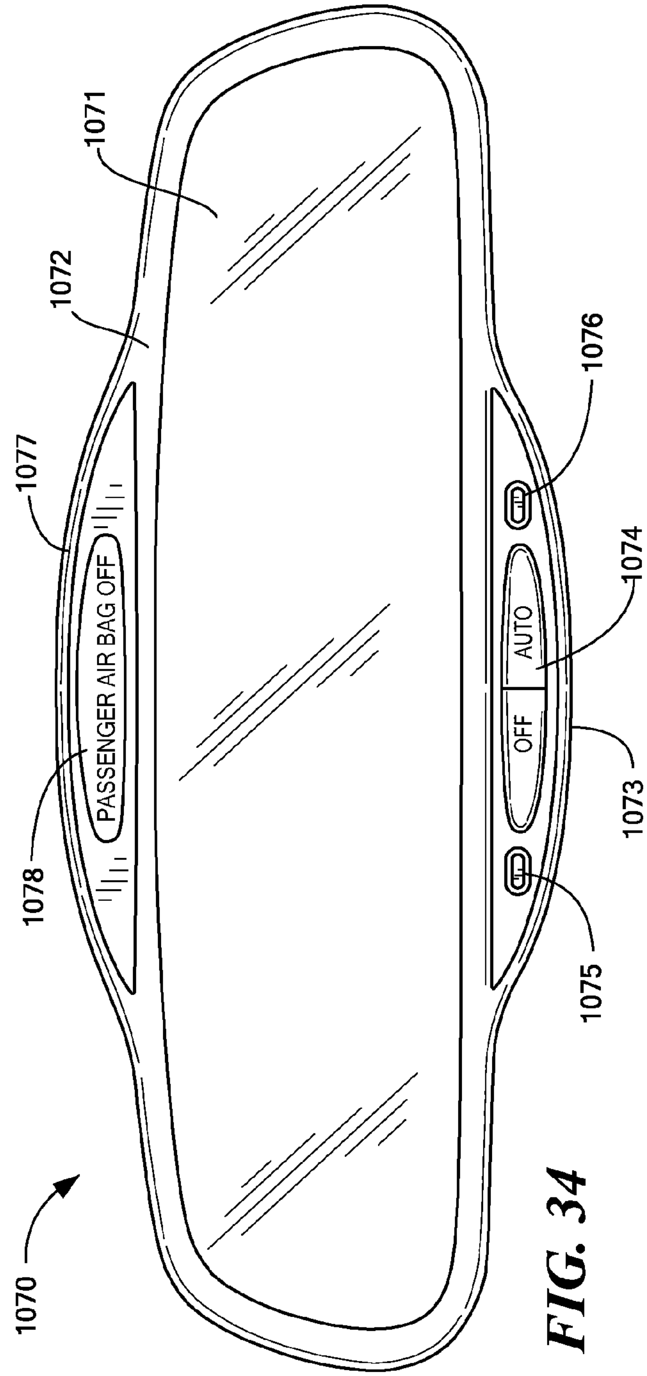
FIG. 34 is a front elevational view of a rearview mirror including a non-planar display in accordance with another embodiment of the present invention.
Figure 35:
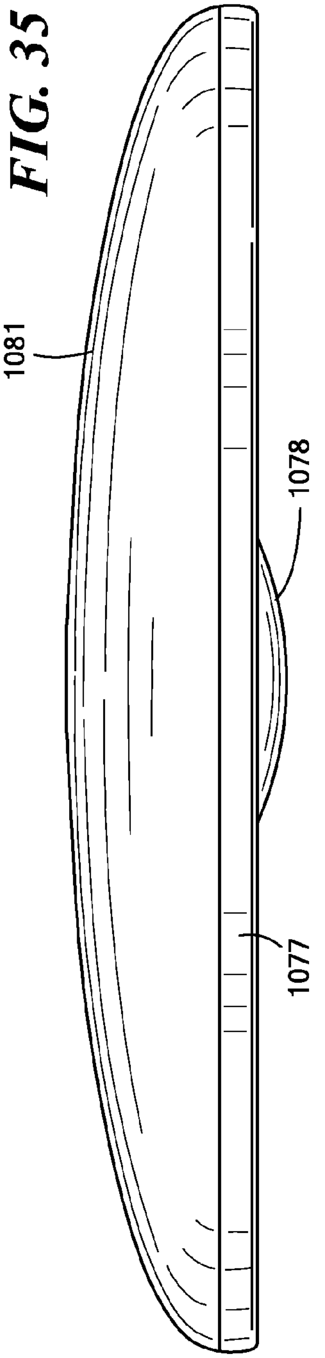
FIG. 35 is a top view of the rearview mirror of FIG. 34.

FIGS. 34 and 35 illustrate a rearview mirror 1070 in accordance with a further embodiment of the present invention. The electrochromic rearview mirror 1070 includes a mirror surface 1071 surrounded by a bezel 1072. A chin 1073 located at the bottom of the bezel 1072 includes a mirror switch 1074, a light sensor 1075, and an on/off mirror indicator 1076. A crown 1077 having a substantially planar front surface is located at the top of the bezel 1072. A convex non-planar display 1078 is located in the crown 1077. The rearview mirror 1070 also includes a housing 1081.

Figure 36:
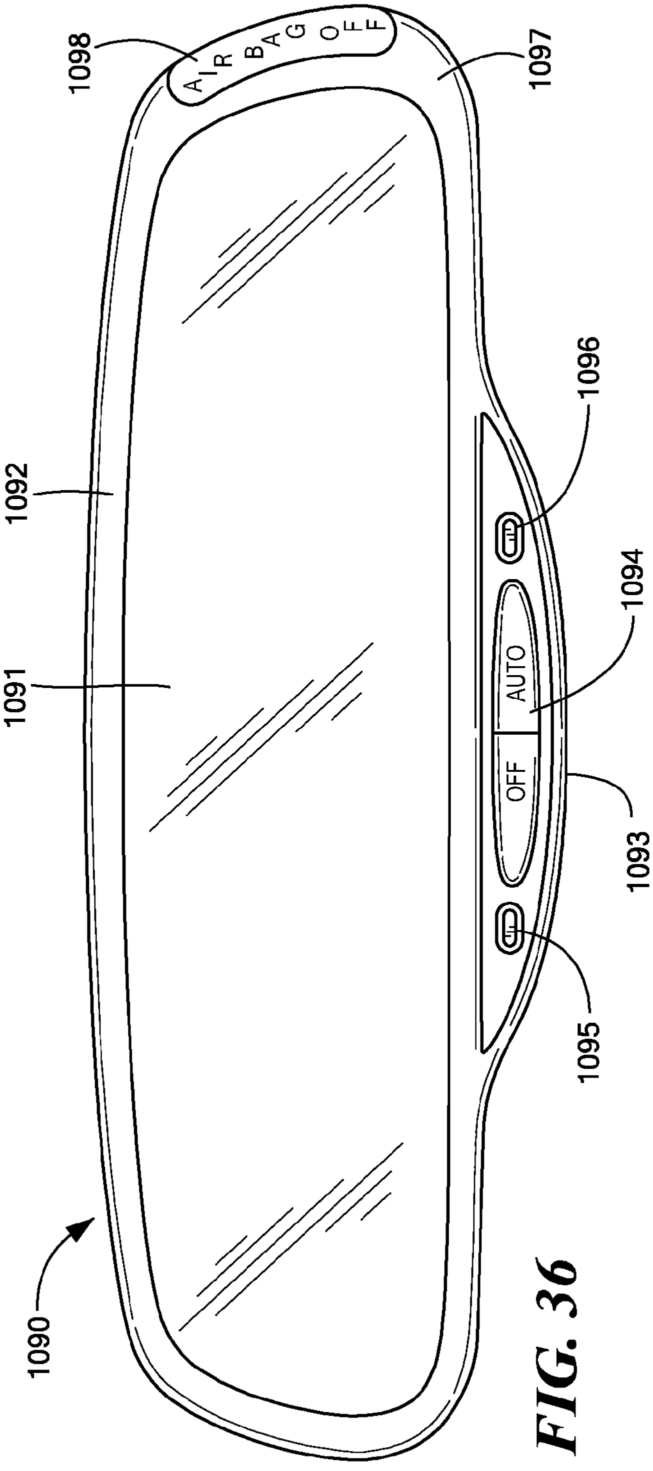
FIG. 36 is a front elevational view of a rearview mirror including a non-planar display in accordance with a further embodiment of the present invention.
Figure 37:
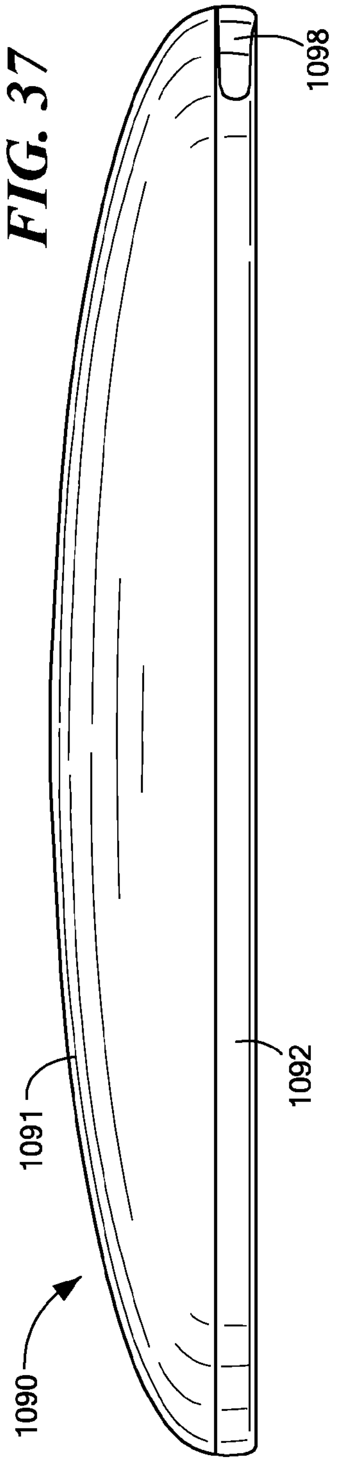
FIG. 37 is a top view of the rearview mirror of FIG. 36.

FIGS. 36 and 37 illustrate another rearview mirror 1090 in accordance with a further embodiment of the present invention. The rearview mirror 1090 includes a mirror surface 1091 surrounded by a bezel 1092. A chin 1093 located at the bottom of the bezel 1092 houses a mirror switch 1094, a light sensor 1095, and an on/off mirror indicator 1096. The right side of the bezel 1092 includes an extension 1097 having a non-planar display 1098 therein. The rearview mirror 1090 comprises a housing 1099. In this embodiment, the non-planar display 1098 is oriented such that a passenger seated in the front right seat of a vehicle can easily see whether the passenger air bag is on or off.

Figure 38:
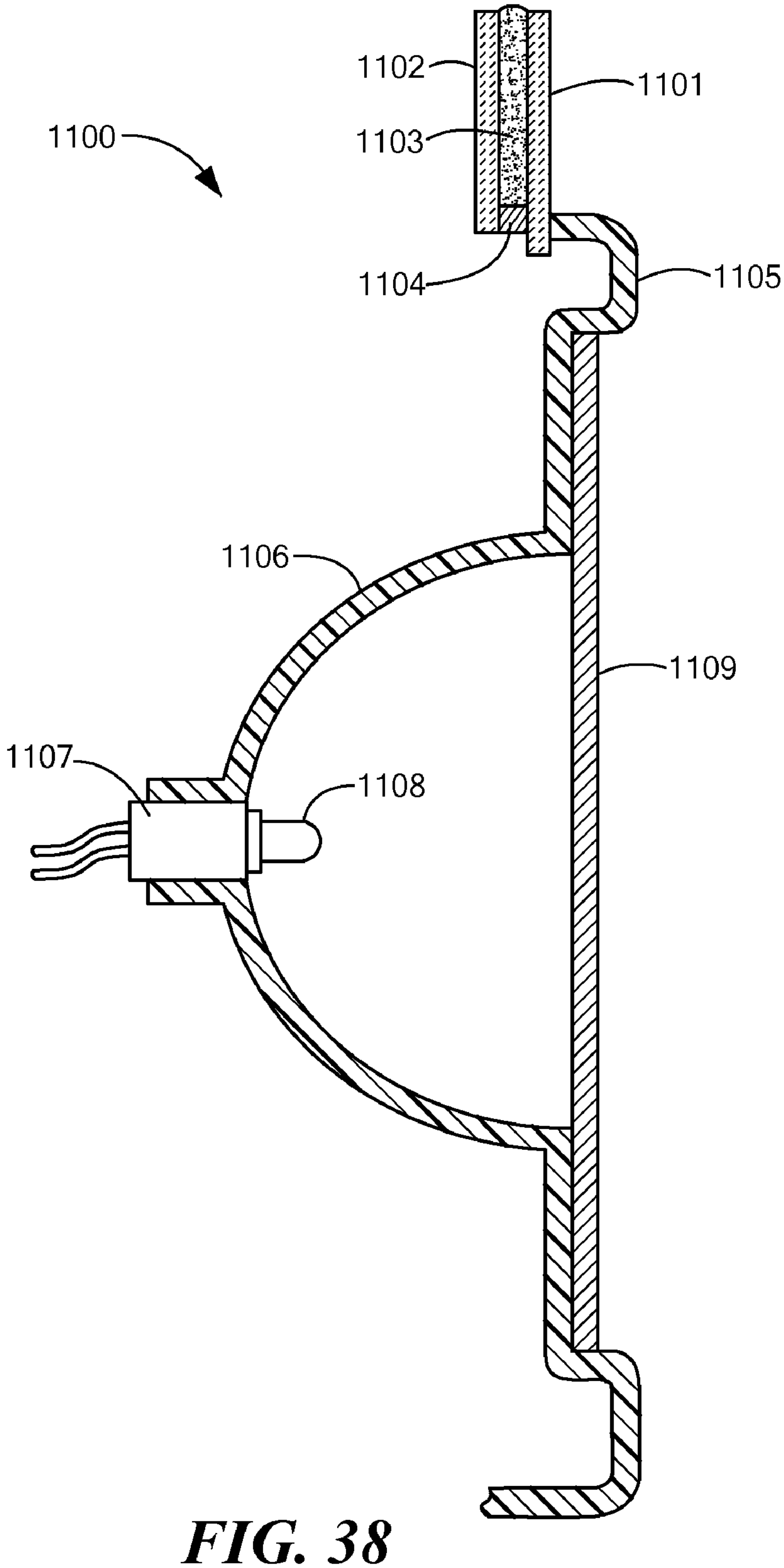
FIG. 38 is a partially schematic, side-sectional view illustrating a rearview mirror display in accordance with an embodiment of the present invention.

FIG. 38 is a partially schematic side sectional view illustrating a rearview mirror non-planar display assembly 1100 in accordance with an embodiment of the present invention. The non-planar display assembly 1100 includes an electrochromic mirror assembly comprising a first glass sheet 1101, a second glass sheet 1102 spaced from the first glass sheet 1101, and an electrochromic material 1103 filling the gap between the glass sheets 1101 and 1102. A seal 1104 extends between the glass sheets 1101 and 1102 in order to retain the electrochromic material 1103 therebetween. Although not shown in FIG. 38, the electrochromic mirror assembly may include substantially transparent electrically conductive films on the interior surfaces of the glass sheets 1101 and 1102, and may comprise a reflective mirror surface positioned at any suitable location, such as the exterior surface of the second glass sheet 1102. Suitable types of electrochromic rearview mirror assemblies are disclosed in the previously cited U.S. patents which are incorporated herein by reference.

As shown in FIG. 38, a bezel 1105 contacts the exterior viewing surface of the first glass sheet 1101 of the electrochromic mirror assembly. A lamp holder 1106 having a reflective interior surface is formed in the bezel 1105. A light source assembly 1107 is secured in the lamp holder 1106. In the embodiment shown in FIG. 38, an LED 1108 is provided as part of the light source assembly 1107. Alternatively, any other suitable light source, such as an electroluminescent source, incandescent light, or the like, may be used. An indicia panel 1109 covers the lamp holder 1106. The indicia panel 1109 forms the exterior viewing surface of the display. In accordance with the preferred embodiment of the present invention, the indicia panel 1109 comprises a convex exterior viewing surface defined by at least one radius of curvature, as more fully described below.

The indicia panel 1109 shown in FIG. 38 may be unmarked or may comprise any desired graphics, alphanumeric symbols, or the like. The indicia panel 1109 may optionally include a color filter.

Preferred non-planar displays of the present invention comprise a convex exterior viewing surface defined by at least one radius of curvature. The radius of curvature may be constant or may vary along the exterior surface of the display. For example, in the embodiments shown in FIGS. 29-35, the non-planar displays have an exterior curved surface of substantially constant radius defined by an arc swept around a substantially vertical axis. Such arcs are most readily seen in FIG. 33, element 1058 and in FIG. 35, element 1078. The radius of the arc typically ranges from about 1 cm to about 60 cm, and more preferably from about 1.5 cm to about 15 cm. This geometry results in a display that is readily viewed by all occupants of the vehicle while reducing unwanted glare.

In the embodiments of FIGS. 36 and 37, the non-planar display has a varying radius of curvature, which substantially conforms to the curved bezel surface of the mirror. The non-planar display reduces glare and is readily viewable to at least the right front passenger of the vehicle.

Conventional planar displays have a high degree of first surface reflection, which decreases the contrast between the graphics of the display which are intended to be viewed and the reflected light from the surface. This degrades the ability for a passenger to view the displayed information, since the front seat passenger is usually seated in a position which can create a viewing angle up to 30 degrees or more off of perpendicular to the mirror front surface. A non-planar display, as well as surface treatment such as a matte finish to decrease the reflection of the surface, increases the contrast of the display, especially when viewed at an angle. The curvature or the display also serves to orient the display or a portion of the display toward the passenger and, therefore, improve the visibility of the display. A low-glare surface and a convex surface have the added benefit of reducing glare on the display surface for the driver and other occupants of the vehicle. Additionally, since the display surface is typically at the same angle as the mirror surface, glare from the headlamps of a following vehicle can also render a glossy, planar display unreadable.

Although the non-planar displays described in the specific embodiments herein are used to convey information concerning the status of a passenger air bag, other types of symbolic or alphanumeric information may be displayed on rearview mirror assemblies in accordance with the present invention. For example, the status of other air bags or supplemental restraint systems in the vehicle may be displayed. Furthermore, information such as door ajar, fasten seat belts, fuel mileage, time, temperature, heading, altitude, and the like may be displayed.

Figure 39:
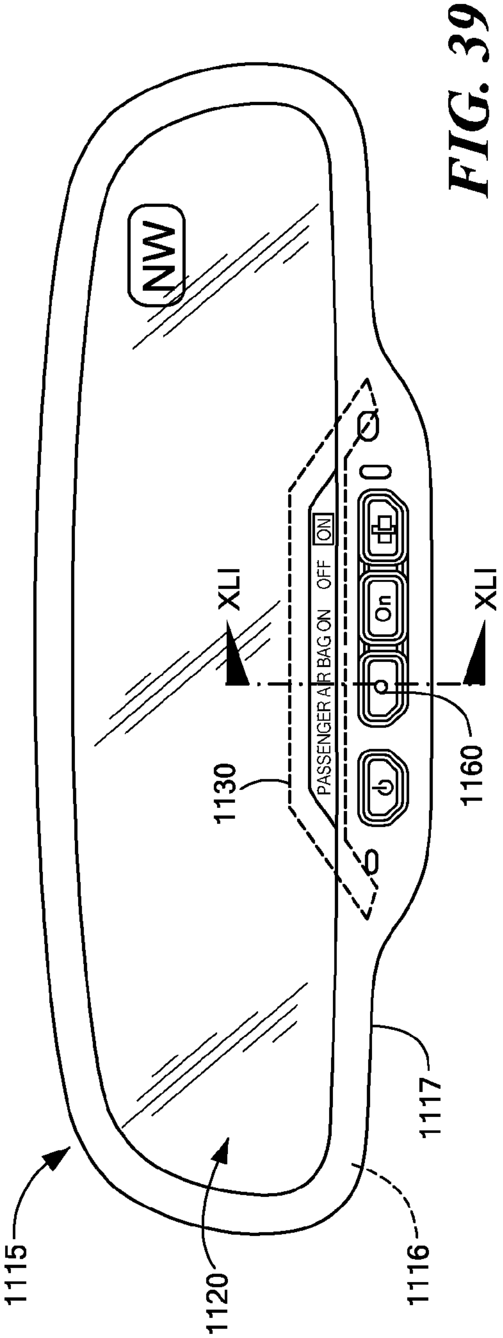
FIGS. 39 and 40 are front and bottom views of another embodiment of the present invention, including a particularly shaped indicia panel.

A mirror assembly 1115 (also referred to herein as "mirror 1115" herein) (FIGS. 39 and 40) includes a housing 1116 and a bezel 1117 defining a cavity 1118, and further includes an electrochromic mirror subassembly 1120 1120 (FIG. 50) supported in the cavity 1118 along with a printed circuit board 1119. The printed circuit board 1119 has a circuit thereon that is configured to operate the electrochromic mirror subassembly 1120 for controlled darkening to reduce glare in the mirror 1115. An indicia panel 1130 (sometimes called an "applique") is attached to a rear of the mirror subassembly 1120 or bezel 1117 to provide a low cost, highly attractive lighted display on the mirror 1115. The indicia panel 1130 is constructed to be exceptionally attractive and effective, as described below. The indicia panel 1130 is constructed with locator-engaging details that facilitate its alignment on the mirror subassembly 1120, and further that provide alignment of the mirror subassembly 1120 on the bezel 1117 and in the housing 1116, as also disclosed below.

The illustrated electrochromic mirror subassembly 1120 is commonly referred to as a fourth surface reflector, but it is contemplated that the present invention will work well with third surface reflectors and with other mirror constructions.

Figure 41:
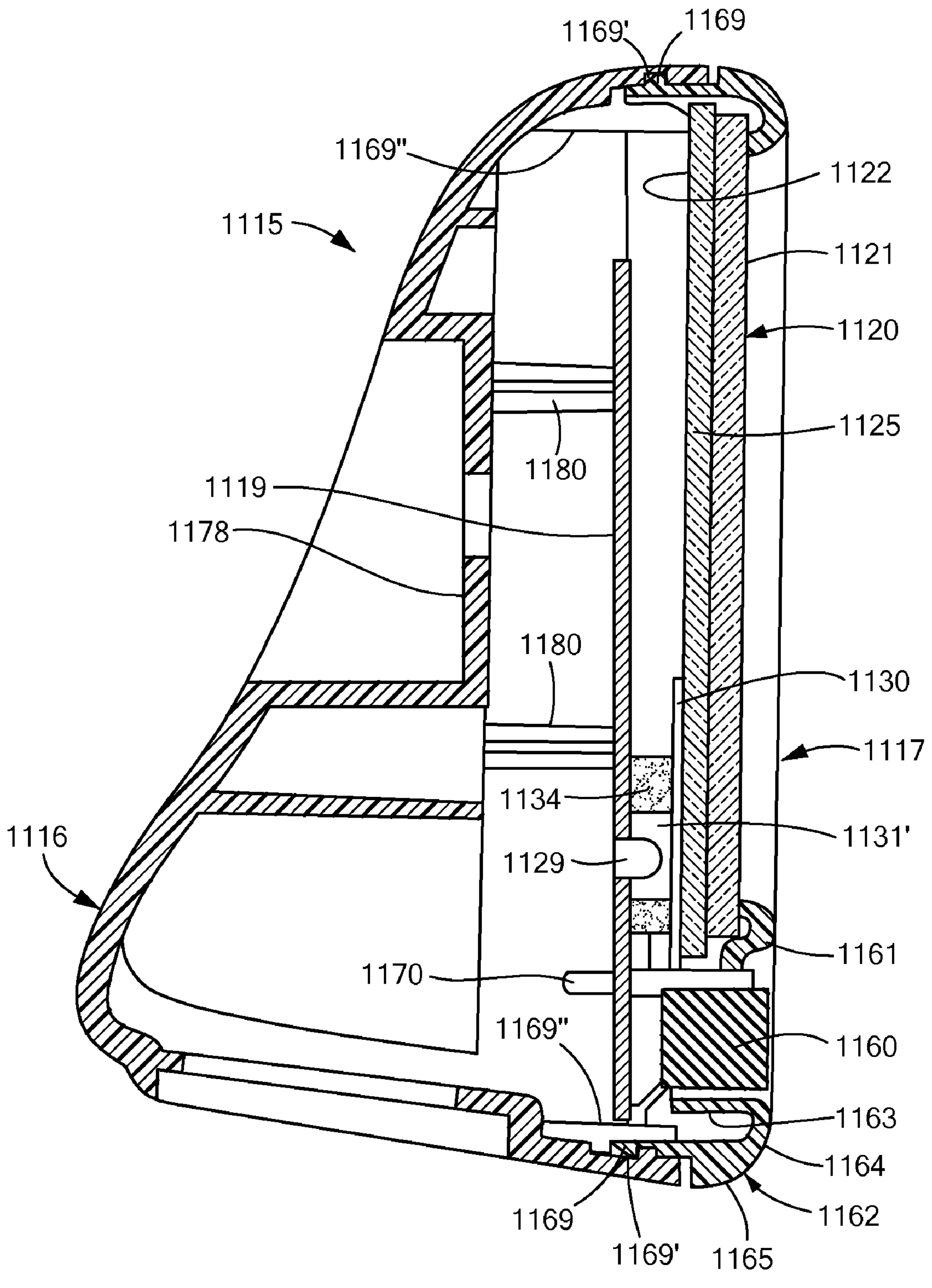
FIG. 41 is a cross section taken along the line XVI-XVI in FIG. 39.
Figure 42:
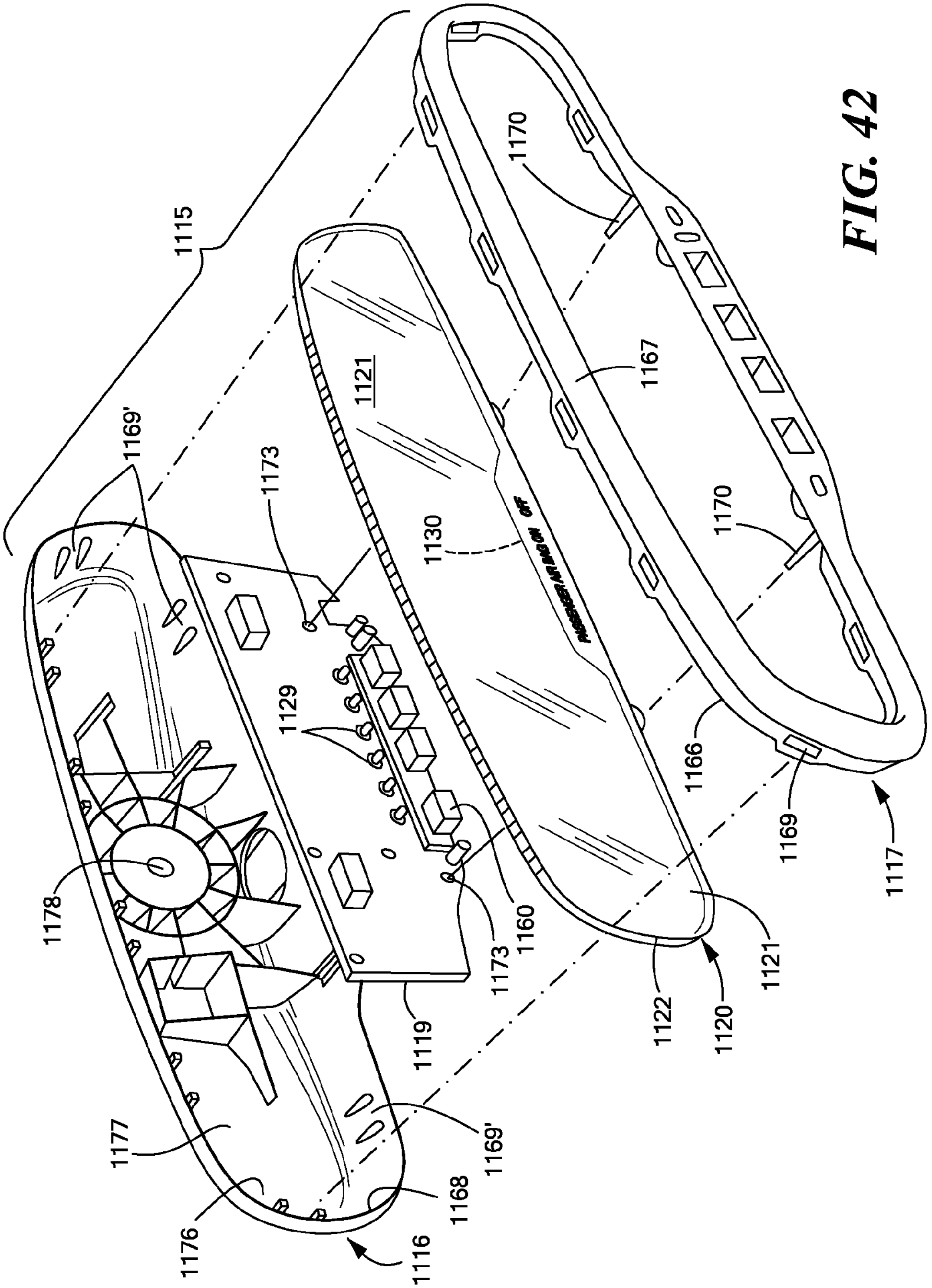
FIGS. 42 and 43 are front and rear exploded perspective views of the mirror shown in FIG. 39.
Figure 43:
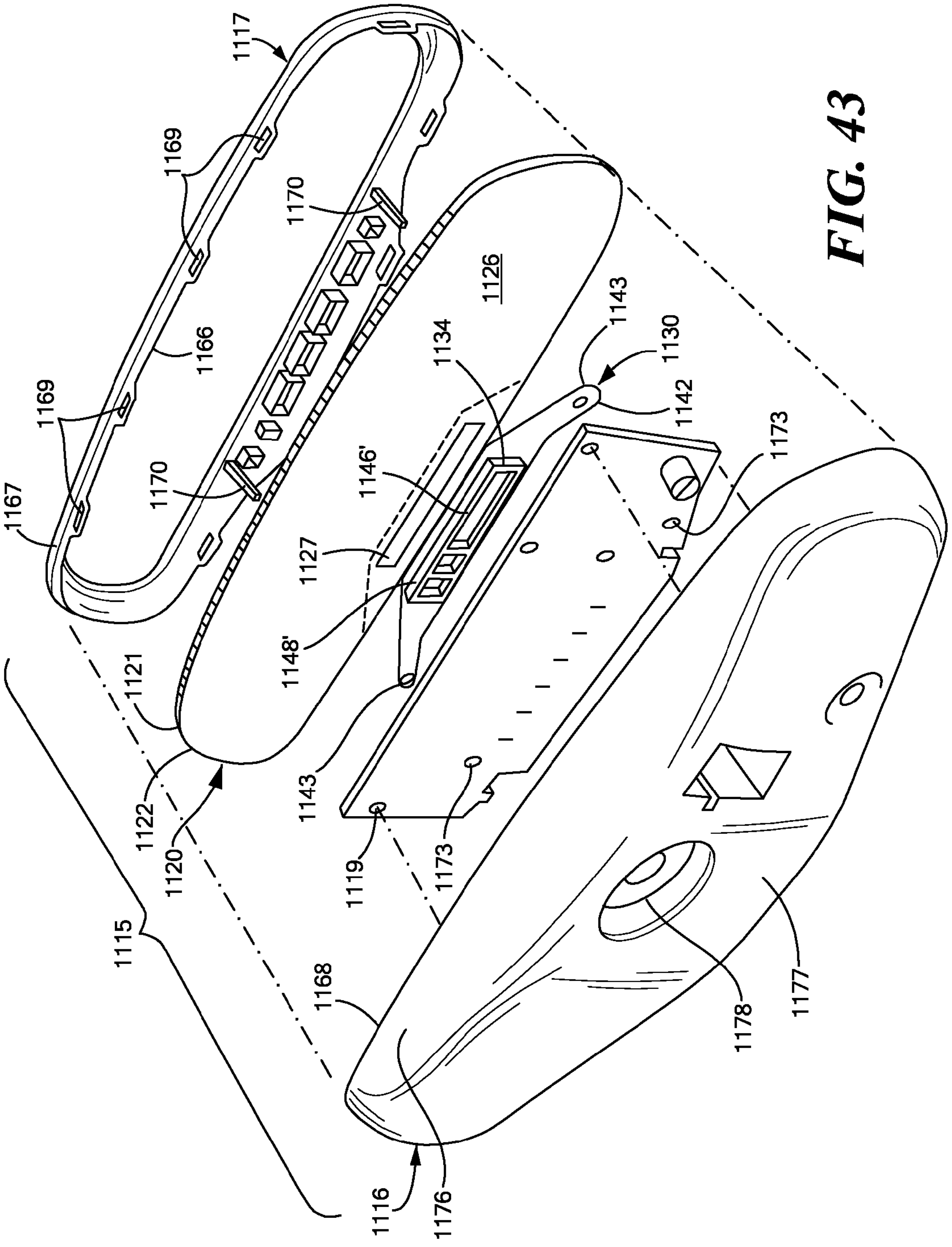
Figure 44:
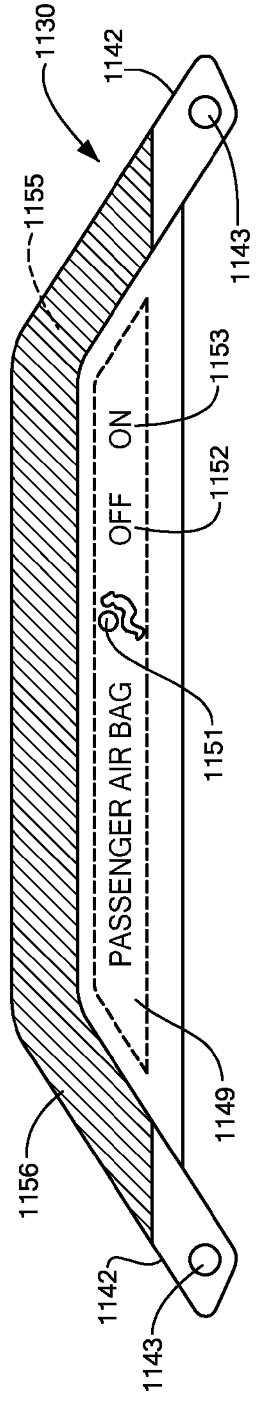
FIG. 44 is a front view of the indicia panel shown in FIG. 39.
Figure 45:
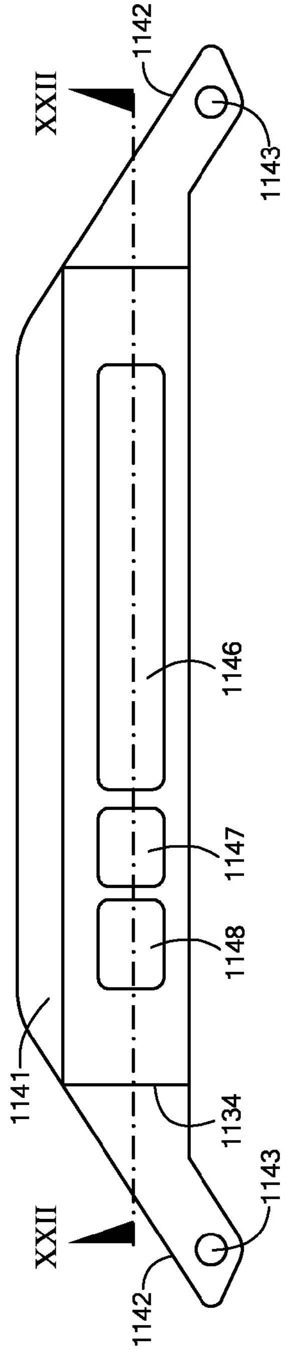
FIGS. 45 and 46 are rear and side views of the indicia panel shown in FIG. 44.
Figure 46:
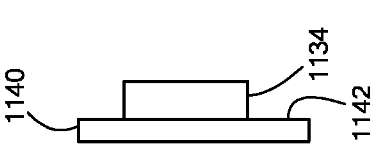
Figure 47:
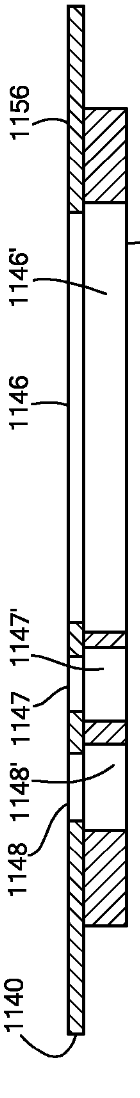
FIG. 47 is a cross section taken along the line XXII-XXII in FIG. 45.
Figure 48:
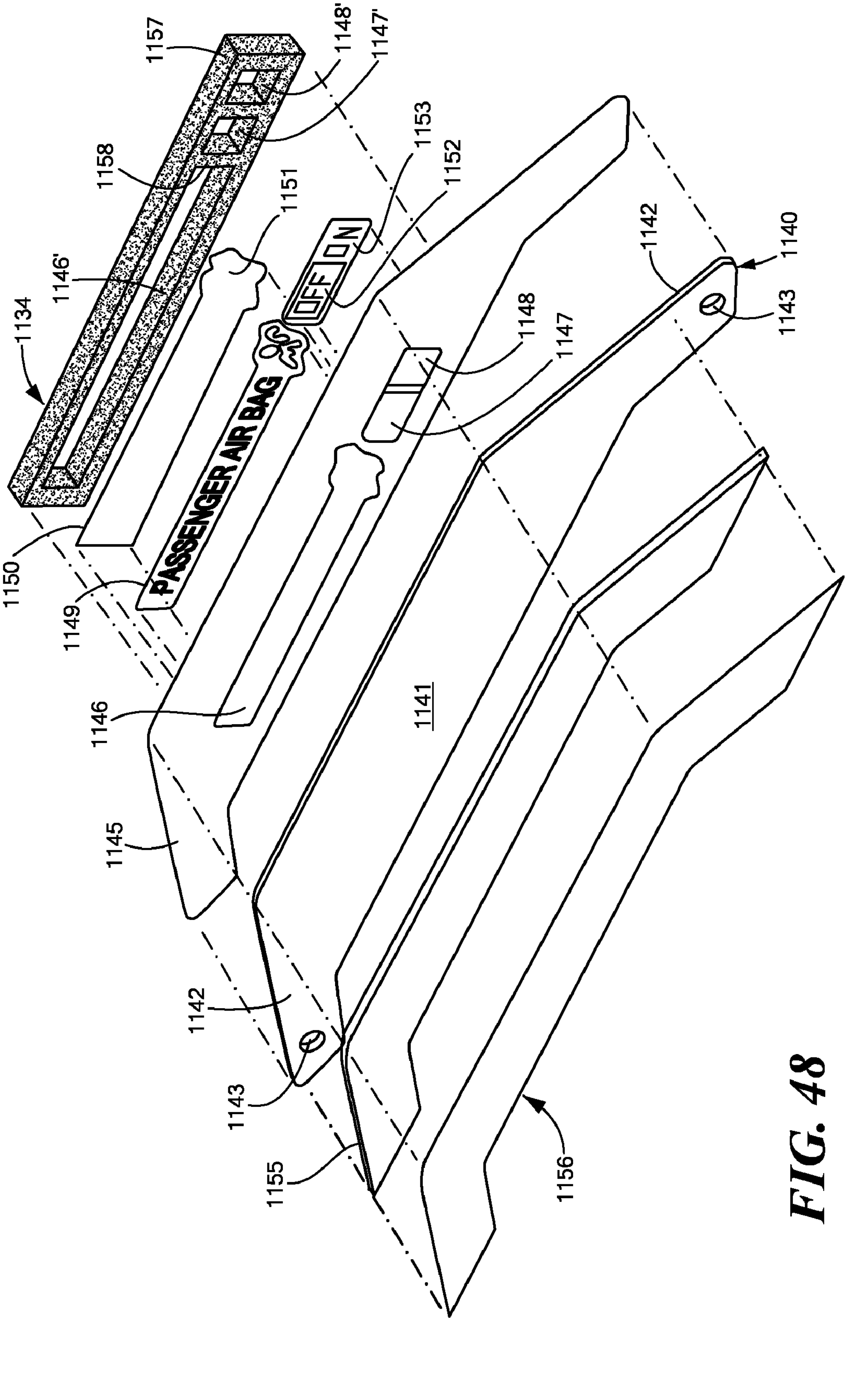
FIG. 48 is an exploded perspective view of the indicia panel shown in FIG. 44.

Accordingly, it is contemplated that a scope of the present invention includes all such mirror constructions and the present description should not be construed as unnecessarily limiting. The illustrated mirror subassembly 1120 (FIG. 50) includes front and rear transparent elements 1121 and 1122 (e.g., glass), electrically conductive layers 1123 and 1124 on inner surfaces of the transparent elements 1121 and 1122, respectively, a layer of electrochromic material 1125 located between the conductive layers 1123 and 1124, and a reflective layer 1126 on a rear surface of the rear transparent element 1122 (i.e., the "fourth" surface of the mirror subassembly 1120). A seal 1125' extends around an inside perimeter of the transparent elements 1121 and 1122 to retain the electrochromic material 1125, when the electrochromic material 1125 is a liquid-phase type, or gel-phase type, or a hybrid of same. (It is noted that a perimeter edge striping may be applied to transparent elements 1121 and 1122 for aesthetics, which results in a similar appearance.) A portion of the reflective layer 1126 is etched away or otherwise removed to define an elongated opening 1127 (FIG. 43). The indicia panel 1130 is adhered to the reflector layer 1126 in a location 1130' where it covers the opening 1127. Light sources 1129 are positioned behind the indicia panel 1130 to pass light through the indicia panel 1130 and through the opening 1127 of the electrochromic mirror subassembly 1120 to selectively illuminate detailed symbols and information on the indicia panel 1130 for viewing by a vehicle driver or passengers. A foam light seal 1134 on the indicia panel 1130 is located between the printed circuit board 1119 and the indicia panel 1130, and is shaped (see FIG. 41) to sealingly engage the printed circuit board 1119 and the indicia panel 1130 to prevent light leakage around the indicia panel 1130. Specifically, the foam light seal 1134 defines multiple windows 1146'-1148' (FIG. 48) engaging the indicia panel 1130 for containing light from each of the light sources 1129 (FIG. 42) as each window area is illuminated. The housing 1116 and the bezel 1117 snap together and are shaped to compress together the mirror subassembly 1120, the indicia panel 1130, the printed circuit board 1119, and the light seal 1134, thus compressing the light seal 1134 to assure good contact by the light seal 1134.

It is contemplated that the present invention includes many different indicia panels constructed with light-absorbing material to absorb undesired stray light and reflections, and also constructed with locator tabs and locator features. The illustrated indicia panel 1130 (FIG. 48) includes a body panel 1140 of light-passing translucent or transparent material, such as a mylar sheet, having a rectangular main section 1141 and down-angled tabs 1142 at each end. The body panel 1140 includes a front surface treated to minimize the degree to which it will show fingerprints, as known in the art. A locating feature or locator hole 1143 is formed in each tab 1142. The holes 1143 are configured to engage locator protrusions on a fixture (not specifically shown, but see FIG. 48) for providing very accurate alignment of the indicia panel 1130 on the mirror subassembly 1120 when the indicia panel 1130 is adhered to a rear surface of the mirror subassembly 1120. The locator holes 1143 are further configured to engage a pair of locator protrusions 1170 on the bezel 1117 to very accurately locate the mirror subassembly 1120 (including the indicia panel 1130) in the bezel 1117 and mirror housing 1116, as described below. When adhesive layer 1055 is eliminated, the locator holes engage the protrusions 1170 for alignment of the indicia panel 1130, while other structure on the housing 1116 and bezel 1117 align the mirror subassembly 1120.

A light-absorbing layer 1145 of ink, film, paint, or the like is applied to a back surface of the body panel 1140. The light-absorbing layer 1145 accurately forms relatively small and well-defined windows 1146-1148 on the body panel 1140. One or more layers of semitransparent or translucent material 1149-1153 are applied onto the body panel 1140 in the area of windows 1146-1148 to form the indicia of the present visual display. It is contemplated that the materials 1149-1153 have properties allowing them to be accurately applied to form detailed symbols, such as by known printing and symbol forming, film applying processes. For example, it is contemplated that the ink could be applied by a multi-coating printing process, or even by an ink-jet printer or copying/duplicating machine. The illustrated black material 1149 includes apertures that form clear lettering. The layer 1150 is applied behind the clear lettering and is translucent white, such that the words "PASSENGER AIR BAG" appear when the window 1146 is luminated. The material 1151 is also white and shows through as a symbol of a person with an air bag inflated in front of the person, but it is contemplated that the material 1151 could of course be colored (e.g., orange or red) to highlight and distinguish the symbol. The materials 1152 and 1153 form letters for the words "on" and "off," which are visible only when the individual window 1147 or window 1148 are luminated.

In the illustrated indicia panel 1130, an elongated layer 1155 (FIG. 48) of adhesive having a small vertical dimension is applied to a face of the body panel 1140 along an upper edge above the windows 1146-1148, with ends of the layer 1155 extending partially downwardly along an upper edge of the down-angled tabs 1142 to form a concavely shaped adhering area on three sides of the indicia forming the visible display. This concave arrangement helps avoid trapping air when adhering the indicia panel 1130 to the mirror subassembly 1120. It also helps reduce thermal expansion problems by providing an area in which the body panel 1140 can expand or flex. The adhesive layer 1155 is covered with a release paper 1156 to protect the adhesive during shipping and handling prior to assembly.

Seal 1134 (FIG. 48) includes a piece of compressible foam 1157 and further includes an adhesive-covered face 1158 that adheringly attaches to a back of the light-absorbing layer 1145 on the body panel 1140 of the indicia panel 1130. The compressible foam 1157 has windows 1146'-1148' cut into the foam that align with the windows 1146-1148 in the light-absorbing layer 1145.

The bezel 1117 (FIGS. 42 and 43) is generally oval shaped and configured to surround and mateably receivingly engage a perimeter of the mirror subassembly 1120. A lower horizontal section (FIG. 41) of the bezel 1117 includes upper and lower portions 1161 and 1162 that form a window for receiving finger-actuable switches or buttons 1160 on the mirror 1115. That portion of the bezel 1117 that engages the perimeter of the mirror subassembly 1120 includes a rearwardly extending inside section 1163 that engages a face of the front transparent element 1121, an aesthetically shaped front or transition area 1164, and a rearwardly extending outer side section 1165 that extends at least to a position adjacent an edge of the mirror subassembly 1120. That portion of the bezel 1117 that engages the housing 1116 includes a rearwardly extending leg or flange 1166 defining an outwardly facing cavity 1167. The housing 1116 includes a forwardly extending section 1168 that fits into the cavity 1167 and overlappingly engages the leg 1166. The bezel 1117 includes a hook-shaped connector 1169 (FIG. 42) that is constructed to frictionally snap attach into a recess 1169' in the housing 1116. Guide fingers 1169" extend from housing 1116 at locations adjacent the hook-shaped connectors 1169. The fingers 1169" are shaped to engage a back surface of the flange 1166 in a manner that forces the hook-shaped connector 1169 into secure engagement with the recess 1169'. It is contemplated that the hook-shaped connector 1169 and the recess 1169' can be reversed on the housing 1116 and the bezel 1117, or that they can be replaced with other connection means, such as screws, mechanical fasteners, adhesive, sonic welding, and the like.

The bezel 1117 (FIG. 43) includes a pair of rearwardly protruding locator protrusions 1170 spaced on either side of the indicia panel 1130. The protrusions 1170 are shaped to engage the holes 1143 on the tabs 1142 to accurately locate the indicia panel 1130 relative to the bezel 1117. This is very important because the indicia (i.e., the lettering and symbols) on the indicia panel 1130 must be very accurately aligned with the bezel 1117 to avoid the appearance of misalignment and poor quality. Since the indicia panel 1130 is accurately adhered to the mirror subassembly 1120, the protrusions 1170 cause the mirror subassembly 1120 (including the visible interior of the seal 1134) to also be accurately aligned with the bezel 1117.

Notably, it is specifically contemplated that adhesive layer 1155 can be eliminated. In such case, the protrusions 1170 accurately locate the indicia panel 1130, while ribs and other structure of the housing 1116 and bezel 1117 accurately locate the mirror subassembly 1120.

The printed circuit board 1119 (FIG. 43) includes locator apertures or holes 1173 that also engage the protrusions 1170 to accurately locate the printed circuit board 1119. The illustrated light sources 1129, which can be any suitable type of illuminator, such as LED, LCD, vacuum-fluorescent elements, incandescent lights, or the like, are mounted to the printed circuit board 1119. Nonetheless, it is contemplated that the light sources 1129 could be mounted behind the printed circuit board 1119 and shine through windows in the printed circuit board 1119. Switches 1160 are also mounted to the printed circuit board 1119 in a position where they align with lower windows in the bezel 1117, and where they are easy to operate by a seated driver.

Figure 40:
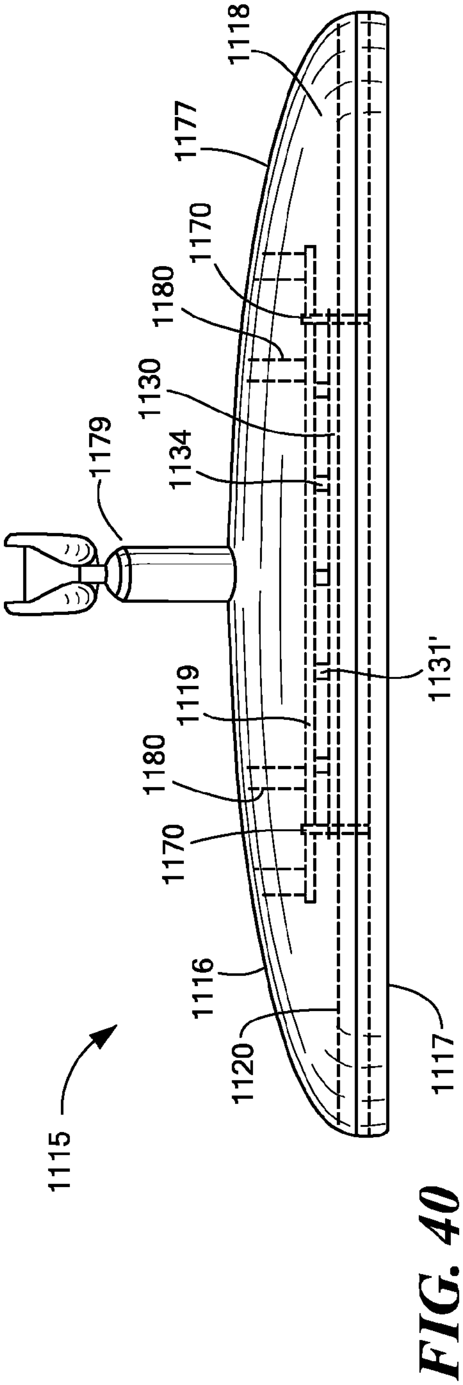

The housing 1116 (FIG. 42) includes sidewalls 1176 having the recesses 1169' and guide fingers 1169" that receive the hook-shaped connectors 1169, and further include a back wall 1177. The back wall 1177 includes mounting structure 1178 for operably adjustably engaging the vehicle ball mount 1179 (FIG. 40). Projections 1180 (FIG. 41) extend forwardly from the back wall 1177 into abutting engagement with the printed circuit board 1119. When assembled, the bezel 1117 snap attaches to the housing 1116 to compress together the mirror subassembly 1120, the indicia panel 1130, the printed circuit board 1119, and the light seal 1134 in a compressed sandwich-like arrangement, with the light seal 1134 lightly compressed.

Figure 49:
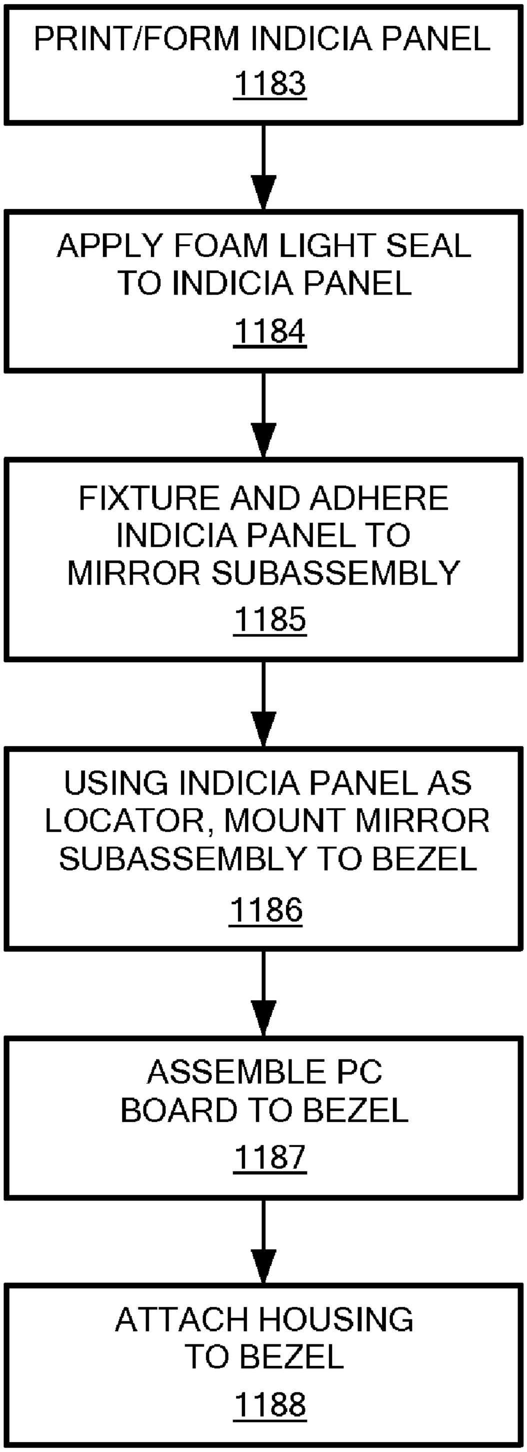
FIG. 49 is a flow chart showing a manufacturing method for assembling the mirror shown in FIG. 39.

As shown by FIG. 49, the method of assembly includes printing and forming the indicia panel 1130 in a step 1183, and then adhering the foam light seal 1134 to the indicia panel 1130 in a step 1184. In a step 1185, the mirror subassembly 1120 is fixtured by fixtured engagement of its locator holes 1143, and the indicia panel 1130 is accurately attached to the mirror subassembly 1120 (if adhesive is used) by removing the release paper 1156 and by adhering the adhesive 1155 to a rear surface of the rear transparent element 1122 as the indicia panel 1130 is accurately held. The indicia panel 1130 is then used to accurately locate the mirror subassembly 1120 to the bezel 1117 by registering the holes 1143 on the protrusions 1170 of the bezel 1117 in a step 1186. Alternatively, where adhesive layer 1155 is eliminated, protrusions 1170 engage holes 1143 to locate the indicia panel 1130, but the mirror subassembly 1120 is located by engagement with the bezel 1117 and housing 1116. The printed circuit board 1119 is also accurately located by registering its holes 1173 on the protrusions 1170 in a step 1187. The housing 1116 is snap attached to the bezel 1117 in step 1188. This causes the abutting projections 1180 on the housing 1116 to engage the printed circuit board 1119, compressing the foam light seal 1134 between the printed circuit board 1119 and the indicia panel 1130, and compressing the indicia panel 1130 with light pressure against the mirror subassembly 1120. This light pressure helps hold the indicia panel 1130 against the mirror subassembly 1120, yet permits dimensional variation during assembly. This arrangement also allows the expansion and contraction that occurs during thermal cycling of the mirror 1115 while in service.

Figure 50:
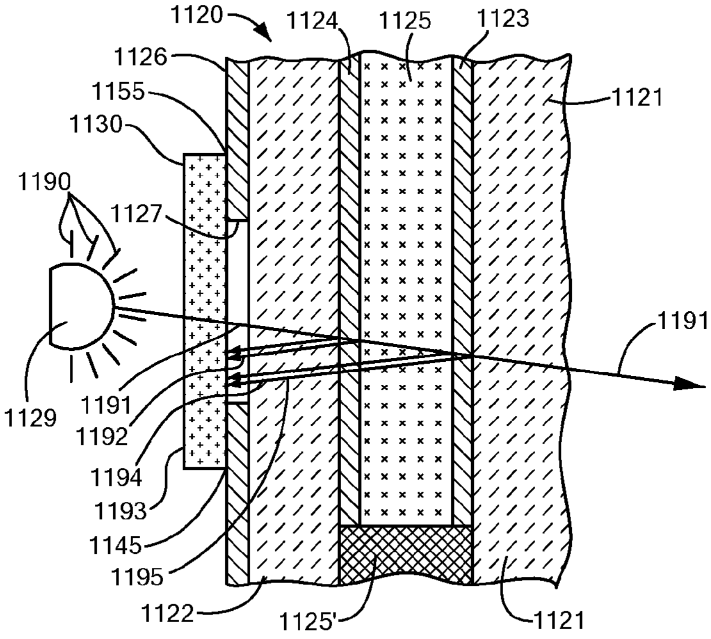
FIG. 50 is a schematic side cross section similar to FIG. 28, but showing undesirable secondary light reflections in the embodiment of FIG. 39.

One important benefit of using a light-absorbing indicia panel 1130 is shown in FIG. 50. The light source 1129 emits light 1190, a primary portion 1191 of which travels through the indicia panel 1130, through the opening 1127, and out through various components of the mirror subassembly 1120 to a viewing person. Secondary reflections 1192-1196 occur at a rear surface of the rear transparent element 1122, and at each interface between the layers 1122/1124, 1124/1125, 1125/1123, and 1123/1121. These secondary reflections 1192-1195 are absorbed by the light-absorbing layer 1145 on the indicia panel 1130. This arrangement greatly reduces unwanted stray light. The size of each window 1146-1148 and windows 1146'-1148' (see FIGS. 41-43 and 48), and also the size of the opening 1127 (FIG. 50), are chosen to optimize the clarity of the image projected by primary light portion 1191 without detracting from the reflected images of the mirror 1115. In a preferred form, the vertical dimension of the letters and symbols is about 25 percent to about 75 percent, or more preferably about 50 percent, of the vertical dimension of the opening 1127.

It is noted that mirror subassemblies 1120 having the same size opening 1127 can be used in mirrors 1115 having different options. For example, a different indicia panel 1130 can be used along with different printed circuits boards 1119, while still using the same bezel 1117, housing 1116, and mirror subassembly 1120. This greatly facilitates manufacturing high volumes of mirror subassemblies 1120 while still allowing for a maximum of options. Further, the same housing 1116 and mirror subassembly 1120 can be used, while using a different bezel 1117. This is an important advantage since the mirror subassembly 1120 is one of the more expensive components of the mirror 1115. It is important to have the mirror subassembly 1120 be at a higher volume to optimize automation of the manufacturing process and to minimize costs.

Figure 51:
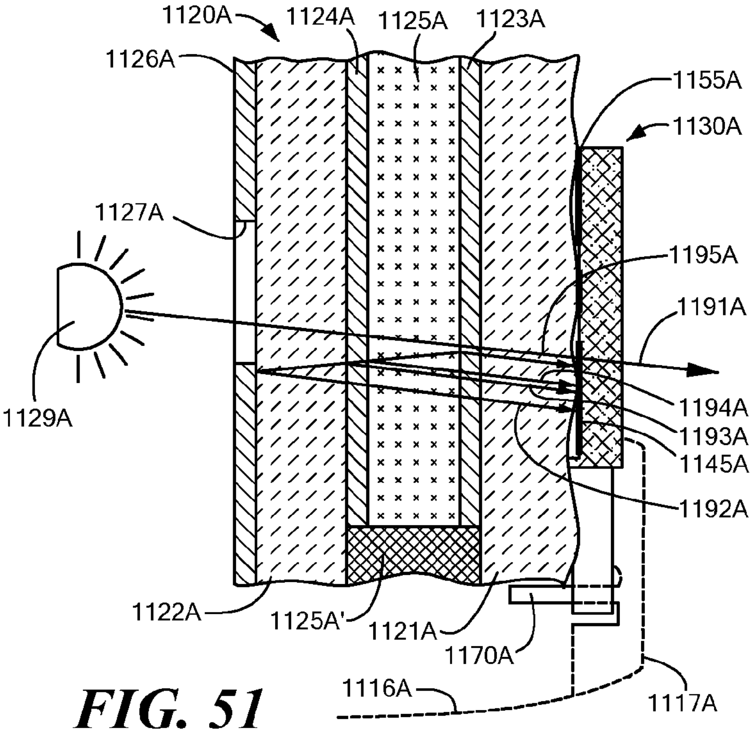
FIG. 51 is a schematic side cross section similar to FIG. 50, but showing an embodiment where the indicia panel is attached to a front of the mirror subassembly and under the front bezel.

It is specifically contemplated that aspects of the present invention can be utilized advantageously in different mirror constructions. One such mirror is illustrated in FIG. 51, and includes a front-mounted indicia panel 1130A adheringly attached to a front surface of the front transparent element 1121A. In mirror 1115A, components and features that are identical or similar to the features and components of mirror 1115 are identified by the same number, but with the addition of the letter A.

In mirror 1115A, the indicia panel 1130A is adhered to the front surface using adhesive 1155A, and the light-absorbing layer 1145A is located adjacent the adhesive 1155A. Notably, it is contemplated that the adhesive 1145A could be omitted where the indicia panel 1130A is adequately supported by portions of the bezel 1117A. It is also contemplated that the light-absorbing layer 1145A could be positioned on the other side of the indicia panel 1130A or even on any of the front or rear surfaces of the transparent elements 1121A and 1122A.

The indicia panel 1130A provides many of the advantages noted above, including fixturing advantages, good appearance, low cost, and a flexible part that can be used in mirrors having different options.

While the invention has been described in detail herein in accordance with certain preferred embodiments thereof, many modifications and changes therein may be effected by those skilled in the art without departing from the spirit of the invention. Accordingly, it is our intent to be limited only by the scope of the appending claims and not by way of the details and instrumentalities describing the embodiments shown herein.

What is claimed is:

1. A rearview mirror assembly for use in a vehicle, the assembly comprising:

a first substantially transparent substrate and a second substantially transparent substrate secured behind the first substrate, said second substrate including a layer of reflective material being proximate a surface of said second substrate that is closest to said first substantially transparent substrate, and a first layer of substantially transparent conductive material positioned between the layer of reflective material and the first substantially transparent substrate, wherein the assembly comprises a transmittance of at least about 5 percent in at least portions of the visible spectrum, and a C* value of less than about 20 measured in reflected ambient light.

2. A rearview mirror assembly according to claim 1 further comprising a second layer of substantially transparent conductive material positioned between said layer of reflective material and said second substrate.

3. A rearview mirror assembly according to claim 2, wherein the second layer of substantially transparent conductive material comprises zinc.

4. A rearview mirror assembly according to claim 1, wherein said first layer of substantially transparent conductive material comprises zinc.

5. A rear view mirror assembly according to claim 1, wherein said layer of reflective material is made of a silver alloy including a combination of silver and an element selected from a group consisting of gold, platinum, rhodium, and palladium.

6. A rearview mirror assembly according to claim 1, wherein the electrochromic mirror has a reflectance of at least 35 percent.

7. A method for operating a rearview mirror assembly, the method comprising:

transmitting light from a light source within the assembly through an optical system to a field of view outside the assembly, wherein the optical system includes a first substrate having first and second surfaces, the first surface corresponding to an outside portion of the assembly, and a second substrate having a third surface, the second substrate secured to the first substrate, the third surface facing the second surface; and partially transmitting light incident on the third surface in such a manner as to provide for transmittance, by the optical system, of the light from the light source, of at least 5 percent in at least portions of the visible spectrum, wherein the assembly comprises at least one of a b* value of less than about 15 and a C* value of less than about 20 measured in reflected ambient light.

8. A method according to claim 7, further comprising:

partially reflecting light incident on the third surface in such a manner as to provide for reflectance, by the optical system, of ambient light incident onto the assembly from the field of view outside the assembly, of at least 35 percent.

9. A method according to claim 7, wherein said assembly has a reflectance of at least about 65 percent.

10. A method according to claim 7, wherein the transmittance of light from the light source through the optical system is at least 10 percent.

11. A method according to claim 7, wherein the light source is a display.

12. A method for operating a rearview mirror assembly, the method comprising:

transmitting light from a light source within the assembly through an optical system to a field of view outside the assembly, wherein the optical system includes a first substrate having first and second surfaces, the first surface corresponding to an outside portion of the assembly, and a second substrate having a third surface, the second substrate secured to the first substrate, the third surface facing the second surface; and partially transmitting light incident on the third surface in such a manner as to provide for transmittance, by the optical system, of the light from the light source, of at least 5 percent in at least portions of the visible spectrum, wherein the assembly comprises a C* value of less than about 20 measured in reflected ambient light and wherein reflecting light incident on the third surface includes reflecting light with an electrode overlying the third surface, said electrode comprising:

a first layer of a first material having a relatively high refractive index;

a second layer of a second material having a relatively low refractive index, the second layer being disposed on the first layer; and a third layer of a third material having a relatively high refractive index, the third layer being disposed on the second layer.

13. A method according to claim 12, wherein the second material is a silver alloy including a combination of silver and an element selected from the group consisting of gold, platinum, rhodium, and palladium.

14. A method according to claim 12, wherein the second material is a silver alloy including about 94 percent silver and about 6 percent gold.

15. A method according to claim 12, wherein the electrode further comprises a forth layer of a transparent conductive material, the forth layer being deposited on the third layer.

* * * * *